(12) United States Patent
Zhamu et al.

(10) Patent No.: US 10,566,482 B2
(45) Date of Patent: Feb. 18, 2020

(54) INORGANIC COATING-PROTECTED UNITARY GRAPHENE MATERIAL FOR CONCENTRATED PHOTOVOLTAIC APPLICATIONS

(71) Applicant: Nanotek Instruments, Inc., Dayton, OH (US)

(72) Inventors: Aruna Zhamu, Centerville, OH (US); Mingchao Wang, Fairborn, OH (US); Wei Xiong, Kettering, OH (US); Bor Z. Jang, Centerville, OH (US); Yi-jun Lin, Taoyuan (TW)

(73) Assignee: Global Graphene Group, Inc., Dayton, OH (US)

( * ) Notice: Subject to any disclaimer, the term of this patent is extended or adjusted under 35 U.S.C. 154(b) by 1563 days.

(21) Appl. No.: 13/815,100

(22) Filed: Jan. 31, 2013

(65) Prior Publication Data
US 2014/0209168 A1    Jul. 31, 2014

(51) Int. Cl.
  *H01L 31/052* (2014.01)
(52) U.S. Cl.
  CPC ... *H01L 31/052* (2013.01); *Y10T 428/249967* (2015.04); *Y10T 428/25* (2015.01); *Y10T 428/30* (2015.01)
(58) Field of Classification Search
  CPC ............... Y02P 70/521; H01L 31/1884; H01L 31/0543; H01L 31/0547; H01L 31/052; H01L 31/0304; Y02E 60/13; Y02E 60/50; Y02E 60/122; B82Y 30/00; B82Y 40/00; H01M 4/625; Y10T 428/25; Y10T 428/30; Y10T 428/249967
  See application file for complete search history.

(56) References Cited

U.S. PATENT DOCUMENTS

| 2,798,878 | A | 7/1957 | Hummers |
| 3,179,634 | A | 4/1965 | Murray |
| 3,404,061 | A | 10/1968 | Shane et al. |
| 3,413,441 | A | 11/1968 | Kosaku et al. |

(Continued)

FOREIGN PATENT DOCUMENTS

| DE | 3918140 A1 | 2/1990 |
| DE | 202005001198 U1 | 6/2005 |

(Continued)

OTHER PUBLICATIONS

U.S. Appl. No. 13/385,813, filed Mar. 8, 2012, A. Zhamu, et al.

(Continued)

*Primary Examiner* — Mayla Gonzalez Ramos

(57) ABSTRACT

This invention provides an inorganic coating-protected unitary graphene material article for concentrated photovoltaic cell heat dissipation. The article comprises at least a layer of unitary graphene material having two primary surfaces and an electrically non-conducting layer of inorganic coating deposited on at least one of the primary surfaces, wherein the unitary graphene material is obtained from heat-treating a graphene oxide gel at a heat treatment temperature higher than 100° C. and contains chemically bonded graphene molecules or chemically merged graphene planes having an inter-graphene spacing no greater than 0.40 nm, preferably less than 0.337 nm, and most preferably less than 0.3346 nm.

26 Claims, 21 Drawing Sheets

(56) References Cited

U.S. PATENT DOCUMENTS

| | | | |
|---|---|---|---|
| 4,666,736 A | 5/1987 | Matsumura et al. | |
| 5,761,256 A * | 6/1998 | Inoue | G21K 1/06 378/82 |
| 5,831,374 A | 11/1998 | Morita et al. | |
| 6,482,520 B1 | 11/2002 | Tzeng | |
| 6,503,626 B1 | 1/2003 | Norley et al. | |
| 6,538,892 B2 | 3/2003 | Smalc et al. | |
| 6,771,502 B2 | 8/2004 | Getz et al. | |
| 6,982,874 B2 | 1/2006 | Smalc et al. | |
| 7,071,258 B1 | 7/2006 | Jang et al. | |
| 7,138,029 B2 | 11/2006 | Norley et al. | |
| 7,150,914 B2 | 12/2006 | Clovesko et al. | |
| 7,160,619 B2 | 1/2007 | Clovesko et al. | |
| 7,166,237 B2 | 1/2007 | Klett et al. | |
| 7,292,441 B2 | 11/2007 | Smalc et al. | |
| 7,306,847 B2 | 12/2007 | Capp et al. | |
| 7,385,819 B1 | 6/2008 | Shives et al. | |
| 7,566,410 B2 | 7/2009 | Song et al. | |
| 7,662,321 B2 | 2/2010 | Guo et al. | |
| 8,105,565 B2 | 1/2012 | Nishikawa et al. | |
| 8,173,095 B2 | 5/2012 | Heer et al. | |
| 8,226,801 B2 | 7/2012 | Zhamu et al. | |
| 8,574,720 B2 | 11/2013 | Carney et al. | |
| 8,778,538 B2 | 7/2014 | Kung et al. | |
| 9,156,700 B2 | 10/2015 | Zhamu et al. | |
| 9,193,132 B2 | 11/2015 | Zhamu et al. | |
| 9,208,920 B2 | 12/2015 | Zhamu et al. | |
| 9,233,850 B2 | 1/2016 | Jang et al. | |
| 9,359,208 B2 | 6/2016 | Zhamu et al. | |
| 9,360,905 B2 | 6/2016 | Zhamu et al. | |
| 9,363,932 B2 | 6/2016 | Wang et al. | |
| 9,533,889 B2 | 1/2017 | Zhamu et al. | |
| 9,561,955 B2 | 2/2017 | Zhamu et al. | |
| 9,833,913 B2 | 12/2017 | Jang et al. | |
| 9,835,390 B2 | 12/2017 | Zhamu et al. | |
| 9,899,120 B2 | 2/2018 | Zhamu et al. | |
| 2002/0076614 A1 | 6/2002 | Yoon et al. | |
| 2002/0166654 A1 | 11/2002 | Smalc | |
| 2002/0166658 A1 | 11/2002 | Norley et al. | |
| 2003/0047302 A1 | 3/2003 | Hebel et al. | |
| 2003/0116312 A1 | 6/2003 | Krassowski et al. | |
| 2004/0127621 A1 | 7/2004 | Drzal et al. | |
| 2005/0111189 A1 | 5/2005 | Smalc et al. | |
| 2005/0271574 A1 | 12/2005 | Jang et al. | |
| 2006/0035085 A1 | 2/2006 | Ozaki et al. | |
| 2006/0056157 A1 | 3/2006 | Ford et al. | |
| 2006/0086493 A1 | 4/2006 | Fujiwara et al. | |
| 2006/0126304 A1 | 6/2006 | Smalc et al. | |
| 2006/0216222 A1 | 9/2006 | Jang | |
| 2007/0053168 A1 | 3/2007 | Sayir et al. | |
| 2007/0158050 A1 | 7/2007 | Norley et al. | |
| 2008/0038565 A1 | 2/2008 | Komada et al. | |
| 2008/0048152 A1 | 2/2008 | Jang et al. | |
| 2008/0062651 A1 | 3/2008 | Reis et al. | |
| 2008/0202386 A1 | 8/2008 | Hougham et al. | |
| 2008/0206124 A1 | 8/2008 | Jang et al. | |
| 2008/0248275 A1 * | 10/2008 | Jang | B82Y 30/00 428/220 |
| 2009/0022649 A1 | 1/2009 | Zhamu et al. | |
| 2009/0028777 A1 | 1/2009 | Zhamu et al. | |
| 2009/0028778 A1 | 1/2009 | Zhamu et al. | |
| 2009/0061191 A1 * | 3/2009 | Zhamu | H01B 1/04 428/220 |
| 2009/0087493 A1 | 4/2009 | Dai et al. | |
| 2009/0155561 A1 * | 6/2009 | Choi | B82Y 30/00 428/220 |
| 2009/0155578 A1 * | 6/2009 | Zhamu | B82Y 30/00 428/336 |
| 2009/0173334 A1 | 7/2009 | Krs et al. | |
| 2009/0305135 A1 | 12/2009 | Shi et al. | |
| 2009/0325071 A1 | 12/2009 | Verbrugge et al. | |
| 2010/0000441 A1 | 1/2010 | Jang et al. | |
| 2010/0040796 A1 | 2/2010 | Chueh | |
| 2010/0044646 A1 | 2/2010 | Zhamu et al. | |
| 2010/0055025 A1 | 3/2010 | Jang et al. | |
| 2010/0055458 A1 | 3/2010 | Jang et al. | |
| 2010/0055464 A1 | 3/2010 | Sung | |
| 2010/0085713 A1 | 4/2010 | Balandin et al. | |
| 2010/0126660 A1 | 5/2010 | O'Hara | |
| 2010/0128439 A1 | 5/2010 | Tilak et al. | |
| 2010/0140792 A1 | 6/2010 | Haddon et al. | |
| 2010/0143798 A1 | 6/2010 | Zhamu et al. | |
| 2010/0144904 A1 | 6/2010 | Wang et al. | |
| 2010/0176337 A1 | 7/2010 | Zhamu et al. | |
| 2010/0196716 A1 | 8/2010 | Ohta et al. | |
| 2010/0222482 A1 | 9/2010 | Jang et al. | |
| 2010/0255984 A1 | 10/2010 | Sutter et al. | |
| 2010/0301279 A1 | 12/2010 | Nesper et al. | |
| 2011/0017585 A1 * | 1/2011 | Zhamu | B82Y 30/00 204/157.42 |
| 2011/0046027 A1 * | 2/2011 | Zhamu | C10M 103/02 508/113 |
| 2011/0059599 A1 | 3/2011 | Ward et al. | |
| 2011/0108978 A1 | 5/2011 | Kim et al. | |
| 2011/0159372 A1 | 6/2011 | Zhamu et al. | |
| 2011/0183025 A1 | 7/2011 | Funka | |
| 2011/0183180 A1 * | 7/2011 | Yu | H01G 11/36 429/128 |
| 2011/0186789 A1 | 8/2011 | Samulski et al. | |
| 2011/0189452 A1 | 8/2011 | Lettow et al. | |
| 2011/0226413 A1 | 9/2011 | Zhang et al. | |
| 2011/0227000 A1 | 9/2011 | Ruoff et al. | |
| 2011/0247795 A1 | 10/2011 | Horng | |
| 2011/0268647 A1 | 11/2011 | Ivanovici et al. | |
| 2011/0274610 A1 | 11/2011 | Paquette et al. | |
| 2011/0280787 A1 | 11/2011 | Chen et al. | |
| 2011/0318257 A1 | 12/2011 | Sokolov et al. | |
| 2012/0021224 A1 | 1/2012 | Everett et al. | |
| 2012/0034442 A1 | 2/2012 | Pauzauskie et al. | |
| 2012/0128570 A1 | 5/2012 | Krishnaiah et al. | |
| 2012/0164433 A1 | 6/2012 | Advincula | |
| 2012/0190139 A1 | 7/2012 | Na et al. | |
| 2012/0196074 A1 | 8/2012 | Ago et al. | |
| 2012/0202056 A1 | 8/2012 | Wolf et al. | |
| 2012/0205606 A1 | 8/2012 | Lee et al. | |
| 2012/0208008 A1 | 8/2012 | Tour et al. | |
| 2012/0211159 A1 | 8/2012 | Hougham et al. | |
| 2012/0234524 A1 | 9/2012 | Fan et al. | |
| 2012/0270960 A1 | 10/2012 | Felisari et al. | |
| 2012/0272868 A1 | 11/2012 | Berry et al. | |
| 2012/0308741 A1 | 12/2012 | Kim et al. | |
| 2012/0314365 A1 | 12/2012 | Matsumoto et al. | |
| 2013/0001068 A1 | 1/2013 | Zhamu et al. | |
| 2013/0005917 A1 | 1/2013 | Zhamu et al. | |
| 2013/0015409 A1 | 1/2013 | Fugetsu | |
| 2013/0059143 A1 | 3/2013 | Liang et al. | |
| 2013/0087446 A1 | 4/2013 | Zhamu et al. | |
| 2013/0092229 A1 * | 4/2013 | Xue | H01L 31/0543 136/256 |
| 2013/0130037 A1 | 5/2013 | Bol et al. | |
| 2013/0136684 A1 | 5/2013 | Wu et al. | |
| 2013/0162977 A1 | 6/2013 | Jung et al. | |
| 2013/0180912 A1 | 7/2013 | Li | |
| 2013/0181166 A1 | 7/2013 | Tetsuka | |
| 2013/0190449 A1 | 7/2013 | Kinloch et al. | |
| 2013/0200300 A1 | 8/2013 | Hoe et al. | |
| 2013/0213630 A1 | 8/2013 | John | |
| 2013/0230722 A1 | 9/2013 | Fujii et al. | |
| 2013/0236715 A1 | 9/2013 | Zhamu et al. | |
| 2013/0264041 A1 | 10/2013 | Zhamu et al. | |
| 2013/0272951 A1 | 10/2013 | Hiura et al. | |
| 2013/0329366 A1 | 12/2013 | Wang et al. | |
| 2014/0037531 A1 | 2/2014 | Liu et al. | |
| 2014/0050910 A1 | 2/2014 | Mukherjee et al. | |
| 2014/0079932 A1 | 3/2014 | Aksay et al. | |
| 2014/0120024 A1 | 5/2014 | Tour et al. | |
| 2014/0124176 A1 | 5/2014 | Zhamu et al. | |
| 2014/0127488 A1 | 5/2014 | Zhamu et al. | |
| 2014/0147648 A1 | 5/2014 | Zhamu et al. | |
| 2014/0154941 A1 | 6/2014 | Zhamu et al. | |
| 2014/0170057 A1 | 6/2014 | Huang et al. | |
| 2014/0190676 A1 | 7/2014 | Zhamu et al. | |
| 2014/0209168 A1 | 7/2014 | Zhamu et al. | |

(56) References Cited

U.S. PATENT DOCUMENTS

| | | |
|---|---|---|
| 2014/0224466 A1 | 8/2014 | Lin et al. |
| 2014/0228513 A1 | 8/2014 | Jeol et al. |
| 2014/0242275 A1 | 8/2014 | Zhamu et al. |
| 2015/0086881 A1 | 3/2015 | Zhamu et al. |
| 2015/0266739 A1 | 9/2015 | Zhamu et al. |
| 2015/0284253 A1 | 10/2015 | Zhamu et al. |

FOREIGN PATENT DOCUMENTS

| | | |
|---|---|---|
| JP | H10168502 A | 6/1998 |
| JP | 2008050228 A | 3/2008 |
| JP | 2011168449 A | 9/2011 |
| WO | 2012006657 A1 | 1/2012 |

OTHER PUBLICATIONS

U.S. Appl. No. 13/694,356, filed Nov. 26, 2012, A. Zhamu, et al.
U.S. Appl. No. 13/694,468, filed Dec. 5, 2012, A. Zhamu, et al.
U.S. Appl. No. 11/509,424, filed Aug. 25, 2006, B. Z. Jang, et al.
U.S. Appl. No. 10/858,814, filed Jun. 3, 2004, B. Z. Jang, et al.
U.S. Appl. No. 11/784,606, filed Apr. 9, 2007, B. Z. Jang, et al.
U.S. Appl. No. 13/694,791 Response Nonfinal Office Action dated Feb. 16, 2016, 19 pages.
U.S. Appl. No. 13/815,246 final Office Action dated Dec. 28, 2016, 9 pages.
U.S. Appl. No. 13/815,246 final Office Action dated Jun. 16, 2017, 6 pages.
U.S. Appl. No. 13/815,246 nonfinal Office Action dated Apr. 28, 2016, 12 pages.
U.S. Appl. No. 13/815,246 nonfinal Office Action dated Nov. 22, 2017, 6 pages.
U.S. Appl. No. 13/815,246 Response final Office Action dated Apr. 19, 2017, 12 pages.
U.S. Appl. No. 13/815,246 Response final Office Action dated Aug. 3, 2015, 2 pages.
U.S. Appl. No. 13/815,246 Response final Office Action dated Sep. 13, 2017, 12 pages.
U.S. Appl. No. 13/815,246 Response final Office Action dated Sep. 25, 2017, 16 pages.
U.S. Appl. No. 13/815,246 Response nonfinal Office Action dated Oct. 13, 2016, 12 pages.
U.S. Appl. No. 13/815,246 Response nonfinal Office Action dated Oct. 30, 2017, 4 pages.
Wang et al., "Transparent, Conductive Graphene Electrodes for Dye-Sensitized Solar Cells" Nano Letters (2008) vol. 8, pp. 323-327.
Worsley et al., "Synthesis of Graphene Aeorogel with High Electrical Conductivity" Journal of the American Chemical Society (2010) vol. 132, No. 40, pp. 14067-14069.
Xu et al., "Self-Assembled Graphene Hydrogel via a One-Step Hydrothermal Process" ACS Nano (2010) vol. 4, No. 7, pp. 4324-4330.
Yu et al., "Significant thermal conductivity enhancement in graphene oxide papers modified with alkaline earth" Appl. Phys. Lett. (2013) vol. 103, p. 141913.
Zhang et al., "Mechanically strong and highly conductive graphene aerogel and its use as electrodes for electrochemical power sources" J. Mater. Chem. (2011) vol. 21, pp. 6494-6497.
U.S. Appl. No. 13/507,167 Nonfinal Office Action dated Aug. 25, 2015, 14 pages.
U.S. Appl. No. 13/507,167 Response to Final Office Action dated Mar. 21, 2016, 30 pages.
U.S. Appl. No. 13/507,167 Response to Nonfinal Office Action dated Nov. 23, 2015, 34 pages.
U.S. Appl. No. 13/694,161 Advisory Action dated Dec. 9, 2016, 6 pages.
U.S. Appl. No. 13/694,161 fOA dated Jun. 17, 2016, 37 pages.
U.S. Appl. No. 13/694,161 nfOA dated Dec, 9, 2015, 33 pages.
U.S. Appl. No. 13/694,161 nfOA dated May 17, 2017, 28 pages.
U.S. Appl. No. 13/694,161 Response to fOA dated Nov. 2, 2016, 37 pages.
U.S. Appl. No. 13/694,161 Response to nfOA dated Aug. 15, 2017, 12 pages.
U.S. Appl. No. 13/694,161 Response to nfOA dated Mar. 18, 2016, 20 pages.
U.S. Appl. No. 13/694,162 Advisory Action dated Dec. 15, 2015, 3 pages.
U.S. Appl. No. 13/694,162 Final Office Action dated Aug. 26, 2015, 18 pages.
U.S. Appl. No. 13/694,162 Final Office Action dated Feb. 7, 2017, 13 pages.
U.S. Appl. No. 13/694,162 Nonfinal Office Action dated Feb. 11, 2015, 14 pages.
U.S. Appl. No. 13/694,162 Nonfinal Office Action dated Jun 29, 2016, 13 pages.
U.S. Appl. No. 13/694,162 Response to Final Office Action dated Jun. 26, 2017, 14 pages.
U.S. Appl. No. 13/694,162 Response to Final Office Action dated Nov. 24, 2015, 29 pages.
U.S. Appl. No. 13/694,162 Response to Nonfinal Office Action dated May 8, 2015, 23 pages.
U.S. Appl. No. 13/694,162 Response to Nonfinal Office Action dated Oct. 27, 2016, 15 pages.
U.S. Appl. No. 13/694,356 Final OA dated Apr. 30, 2015, 11 pages.
U.S. Appl. No. 13/694,356 Final OA dated Jan. 10, 2014, 11 pages.
U.S. Appl. No. 13/694,356 Final OA dated Jun. 13, 2016, 4 pages.
U.S. Appl. No. 13/694,356 Nonfinal OA dated Aug. 12, 2013, 9 pages.
U.S. Appl. No. 13/694,356 Nonfinal OA dated Jul. 26, 2016, 10 pages.
U.S. Appl. No. 13/694,356 Nonfinal OA dated Sep. 25, 2015, 13 pages.
U.S. Appl. No. 13/694,356 Nonfinal OA dated Sep. 30, 2014, 12 pages.
U.S. Appl. No. 13/694,356 Resp Adv Act dated May 5, 2014, 28 pages.
U.S. Appl. No. 13/694,356 Resp Final OA dated Apr. 7, 2014, 27 pages.
U.S. Appl. No. 13/694,356 Resp Final OA dated Jul. 30, 2015, 24 pages.
U.S. Appl. No. 13/694,356 Resp Final OA dated Jun. 14, 2016, 7 pages.
U.S. Appl. No. 13/694,356 Resp Nonfinal OA dated Dec. 22, 2014, 31 pages.
U.S. Appl. No. 13/694,356 Resp Nonfinal OA dated Feb. 5, 2016, 16 pages.
U.S. Appl. No. 13/694,356 Resp Nonfinal OA dated Oct. 18, 2013, 18 pages.
U.S. Appl. No. 13/694,356 Resp Nonfinal OA dated Sep. 12, 2016, 7 pages.
U.S. Appl. No. 13/694,356 Advisory Action dated Apr. 28, 2014, 4 pages.
U.S. Appl. No. 13/694,468 Resp nfOA dated May 13, 2015, 17 pages.
U.S. Appl. No. 13/694,468 fOA dated Jul. 13, 2015, 8 pages.
U.S. Appl. No. 13/694,468 nfOA dated Feb. 23, 2015, 13 pages.
U.S. Appl. No. 13/694,468 Resp fOA dated Jul. 29, 2015, 14 pages.
U.S. Appl. No. 13/694,722 Final Office Action dated Jun. 2, 2017, 14 pages.
U.S. Appl. No. 13/694,722 Final Office Action dated Nov. 17, 2015, 12 pages.
U.S. Appl. No. 13/694,722 Nonfinal Office Action dated Apr. 22, 2015, 9 pages.
U.S. Appl. No. 13/694,722 Nonfinal Office Action dated Oct. 7, 2016, 9 pages.
U.S. Appl. No. 13/694,722 Response to Final Office Action dated Feb. 17, 2016, 12 pages.
U.S. Appl. No. 13/694,722 Response to Final Office Action dated Sep. 22, 2017, 12 pages.
U.S. Appl. No. 13/694,722 Response to Nonfinal Office Action dated Feb. 1, 2017, 13 pages.

(56) References Cited

OTHER PUBLICATIONS

U.S. Appl. No. 13/694,722 Response to Nonfinal Office Action dated Jul. 27, 2015, 10 pages.
U.S. Appl. No. 13/694,791 Final Office Action dated Jun. 3, 2016, 17 pages.
U.S. Appl. No. 13/694,791 Nonfinal Office Action dated Nov. 9, 2015, 15 pages.
U.S. Appl. No. 13/694,791 Response Final Office Action dated Oct. 26, 2016, 21 pages.
Anderson et al., "The Use of Esters of N-Hydroxysuccinimide in Peptide Synthesis" J. Amer. Chem. Soc. (1964) vol. 86, No. 9, pp. 1839-1842.
Andrews et al., "Purification and structural annealing of multiwalled carbon nanotubes at graphitization temperatures" Carbon (2001) vol. 39, No. 11, pp. 1681-1687.
Angstron, "High Quality Graphene Oxide Product" Nov. 2010 (via Wayback Machine).
Bai et al., "On the Gelation of Graphene Oxide" Journal of Physical Chemistry (2011) vol. 115, pp. 5545-5551.
Balandin et al., "Superior Thermal Conductivity of Single-Layer Graphene" Nano Letters (2008) vol. 8, No. 3, pp. 902-907.
Batzill, "The Surface Science of Graphene: Metal Interfaces, CVD Synthesis, Nanoribbons, Chemical Modifications, and Defects" Surf. Sci. Rep. (2012) vol. 67, pp. 83-115.
Bucknall et al. "Relationship between Structure and Mechanical Properties in Rubber-Toughened Epoxy Resins" The British Polymer Journal (1978) vol. 10, pp. 53-59.
Compton et al., Graphene Oxide, Highly Reduced Graphene Oxide, and Graphene: Versatile Building Blocks for Carbon-Based Materials (2010) vol. 6, No. 6, pp. 711-723.
DE-202005001198 English Translation, 5 pages.
DE-3918140 English Translation, 5 pages.
Donald et al., "Internal structure of rubber particles and craze break-down in high-impact polystyrene" Journal of Materials Science (1982) vol. 17, pp. 2351-2358.
Dreyer et al., "The chemistry of graphene oxide" Chem. Soc. Rev. (2010) vol. 39, pp. 228-240.
Duereh et al., "Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Duereh et al., Supporting Information—Solvents—"Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Duereh et al., Supporting Information—Solvents Supplement—"Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Edwards et al., "Graphene Film Growth on Polycrystalline Metals" Accounts of Chem. Res. (2012).
Ghosh et al., "Dimensional crossover of thermal transport in few-layer graphene" Nature Materials (2010) vol. 9, pp. 555-558.
Gong et al., "Graphitization of Graphene Oxide with Ethanol during Thermal Reduction" J. Chem. Phys. C (2012) vol. 116, pp. 9969-9979.
Gyorki, "How to Select a Suitable Heat Sink" Design World (2009) pp. 1-5.
Hou et al., "Flexible Graphene-Graphene Composites of Superior Thermal and Electrical Transport Properties" ACS Appl. Mater. Interfaces (2014) vol. 6, pp. 15026-15032.
JP-2015-544155 Amendment to Response to Office action in Japanese.
JP-2015-544155 Argument to Response to Office action in Japanese.
JP-2015-544155 Office Action dated Sep. 13, 2017, 4 pages.
Jung, "Tunable Electrical Conductivity of Individual Graphene Oxide Sheets Reduced at "Low" Temperatures" American Chemical Society Nano Letters (2008) vol. 8, No. 12, pp. 4283-4287.
Kidambi et al., "The Parameter Space of Graphene Chemical Vapor Deposition on Polycrystalline Cu" The Journal of Physical Chemistry (2012) vol. 116, No. 42, pp. 22492-22501.
Li et al., "Evolution of Graphene Growth on Ni and Cu by Carbon Isotope Labeling" Nano Letters (2009) vol. 9, pp. 4268-4272.
Mahanta et al., "Thermal Conductivity of Graphene and Graphene Oxide Nanoplatelets" IEEE, from 13th IEEE ITHERM Conference, Conference Date of May 30, 2012 to Jun. 1, 2012, pp. 1-6.
Matsutani et al., "Low Temperature Curing of Polyimide Precursors by Variable Frequency Microwave" J. Photopolymer Science and Technology (2005) vol. 18, No. 2, pp. 327-332.
Mochida et al., "Catalysts in syntheses of carbon and carbon precursors" Journal of the Brazilian Chemical Society (2006) vol. 17, No. 6, pp. 1059-1037.
Muratoglu et al., "Toughening mechanism of rubber-modified polyamides" Polymer (1995) vol. 36, No. 5, pp. 921-930.
PCT/US13/71469 International Search Report dated Mar. 27, 2014, 3 pages.
Pei et al., "The reduction of graphene oxide" Carbon (2012) vol. 50, pp. 3210-3228.
Pop et al., "Thermal properties of graphene: Fundamentals and applications" MRS Bulletin (2012) vol. 37, pp. 1273-1281.
Reina et al., "Large Area, Few-Layer Graphene Films on Arbitrary Substrates by Chemical Vapor Deposition" Nano Letters (2009) vol. 9, pp. 30-35.
Seol et al., "Two-Dimensional Phonon Transport in Supported Graphene" Science (2010) vol. 328, No. 5975, pp. 213-216.
Tsen et al., "Tailoring Electrical Transport Across Grain Boundaries in Polycrystalline Graphene" Science (2012) vol. 336, pp. 1143-1146.
U.S. Appl. No. 13/385,813 Advisory Action dated Sep. 9, 2016, 8 pages.
U.S. Appl. No. 13/385,813 Final Office Action dated Apr. 22, 2016, 18 pages.
U.S. Appl. No. 13/385,813 Nonfinal Office Action dated Oct. 21, 2015, 14 pages.
U.S. Appl. No. 13/385,813 Response to Final Office dated Apr. 22, 2016, 31 pages.
U.S. Appl. No. 13/385,813 Response to Nonfinal Office Action, 37 pages.
U.S. Appl. No. 13/506,265 Final Office Action dated Nov. 28, 2014, 10 pages.
U.S. Appl. No. 13/506,265 Nonfinal Office Action dated Aug. 14, 2014, 9 pages.
U.S. Appl. No. 13/506,265 Nonfinal Office Action dated Aug. 25, 2015, 8 pages.
U.S. Appl. No. 13/506,265 Nonfinal Office Action dated Mar. 17, 2015, 10 pages.
U.S. Appl. No. 13/506,265 Response to Final Office Action filed Feb. 19, 2015, 23 pages.
U.S. Appl. No. 13/506,265 Response to Nonfinal Office Action dated Dec. 10, 2015, 7 pages.
U.S. Appl. No. US 13/506,265 Response to Nonfinal Office Action dated Jun. 22, 2015, 18 pages.
U.S. Appl. No. 13/506,265 Response to Nonfinal Office Action dated Oct. 14, 2014, 16 pages.
U.S. Appl. No. 13/507,167 Final Office Action dated Jan. 21, 2016, 30 pages.

* cited by examiner

20 μm (Scale bar = 5 μm per interval)

Poly-crystalline graphene film from catalytic CVD (top view)

Single-grain (single crystal) graphene film (top view)

Graphene poly-crystal with incomplete grain boundaries (top view) (essentially a graphene single crystal with defects)

INORGANIC COATING-PROTECTED UNITARY GRAPHENE MATERIAL FOR CONCENTRATED PHOTOVOLTAIC APPLICATIONS

The present invention claims the benefits of the following co-pending patent applications:
A. Zhamu, et al., "Graphene Oxide Gel Bonded Graphene Composite Films and Processes for Producing Same," U.S. patent application Ser. No. 13/385,813 (Mar. 8, 2012).
Aruna Zhamu, Mingchao Wang, Wei Xiong, and Bor Z. Jang, "Unitary Graphene Layer or Graphene Single Crystal," U.S. patent application Ser. No. 13/694,356 (Nov. 26, 2012).
Aruna Zhamu, Mingchao Wang, Wei Xiong, and Bor Z. Jang, "Unitary Graphene Matrix Composites Containing Carbon or Graphite Fillers," U.S. patent application Ser. No. 13/694,468 (Dec. 5, 2012).

FIELD OF THE INVENTION

The present invention relates generally to the field of graphitic materials for heat dissipation applications and, more particularly, to a heat transfer member containing a unitary graphene material or a graphene matrix composite (not graphene platelet-reinforced resin composite) coated with an electrically non-conducting layer for use in a concentrated solar energy or photovoltaic cell system. This coated unitary graphene material exhibits a combination of exceptionally high thermal conductivity, high electrical conductivity, and high mechanical strength.

BACKGROUND OF THE INVENTION

Concentrated photovoltaic (CPV) systems operate by focusing a large amount of sunlight onto a small area of photovoltaic cells to generate electricity. This concentration of solar radiation can increase the efficiency of electricity generation, which allows for reduced size and cost of the system, when compared to more conventional photovoltaic systems. A CPV cell primarily uses lenses (e.g. Fresnel lens) to focus the sunlight to a small area. Mainly due to the limited absorption capability for light spectrum, the photovoltaic cell cannot convert 100% of the light energy into electrical energy for output. A significant portion of the un-converted energy becomes heat accumulated in the cell, causing the temperature of the component to rise. This undesirably high temperature can lead to increased internal dark current and decreased conversion efficiency of the cell. In particular, the highly concentrated photovoltaic (HCPV) power generation system makes use of Group III-V semiconductors as the solar cell active materials having a higher energy gap than silicon.

For illustration purposes and as an example, FIG. 1(a) shows a cross section view of a solar cell device structure, which includes a ceramic substrate 11, a circuit layout layer 17 disposed on the ceramic substrate 11, and a layer of solar cell 23 formed on the circuit layout layer 17. The ceramic substrate is utilized as a carrier substrate for the solar cell. When in operation, the ceramic substrate may also function as a heat transfer and/or dissipation member for managing the heat generated. Thus, upon exposure to solar radiation, the solar cell (e.g. a CPV cell) absorbs and converts portion of the solar spectrum into electrical energy, which is transferred by the circuit layout layer 17 into an energy storage unit (e.g. a battery, not shown here). Since a significant amount of heat is generated by the solar cell and the circuit layout layer, the ceramic substrate must have a high thermal conductivity in order to effectively and efficiently transfer the heat either directly or through a heat sink to the ambient air. However, ceramic materials typically have a thermal conductivity lower than 100 W/mK, mostly lower than 50 W/mK.

Therefore, in order to alleviate and solve the heat dissipation problem, a metal-based heat sink 25 (e.g. containing heat dissipation fins 31 and a heat dissipation base plate 27) is placed below the ceramic substrate 11 to enhance its heat dissipation efficiency. The base has at least one primary surface (e.g. 29) to collect heat. Each fin has one or multiple heat-dissipating surfaces (e.g. 19). With a relatively low thermal conductivity, a heat sink must have a large number of thin fins to have sufficient amounts of heat-dissipating surfaces. However, such a design increases the complexity of manufacturing processes and the production cost. It is clear that the functions and performances of prior art solar cells are not satisfactory. In real practice, Cu and Al heat sinks are formed with fins or other structures to increase the surface area of the heat sink, often with air being forced across or through the fins to facilitate heat dissipation of heat to the air. However, there are several major drawbacks or limitations associated with the use of metallic heat sinks. One drawback relates to the relatively low thermal conductivity of a metal (<400 W/mK for Cu and 80-200 W/mK for Al alloy). In addition, the use of copper or aluminum heat sinks can present a problem because of the weight of the metal. For instance, pure copper weighs 8.96 grams per cubic centimeter (g/cm$^3$) and pure aluminum weighs 2.70 g/cm$^3$. If metallic heat sinks are employed, the sheer weight of the metal on the CPC support system can increase the chances of structural failure or other undesirable effects. More significantly, most metals have corrosion issues in an outdoor environment. Further, many metals do not exhibit a high surface thermal emissivity and thus do not effectively dissipate heat through the radiation mechanism.

Thus, there is a strong need for a non-metallic heat sink system effective for dissipating heat produced by a heat source such as a CPV cell. The heat sink system should exhibit a higher thermal conductivity and/or a higher thermal conductivity-to-weight ratio as compared to metallic heat sinks. These heat sinks must also be mass-producible, preferably using a cost-effective process. This processing ease requirement is essential to competing with metallic heat sinks, which can be readily produced in large quantities using scalable techniques such as extrusion, stamping, and die casting. This is more than just a cost issue. Processing ease can also enable the design and construction of more intricate and efficient heat sink geometries.

One group of materials potentially suitable for heat sink applications is the graphitic carbon or graphite. Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Bulk natural flake graphite is a 3-D graphitic material with each particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

A graphite single crystal (crystallite) per se is anisotropic with a property measured along a direction in the basal plane (crystallographic a- or b-axis direction) being dramatically different than if measured along the crystallographic c-axis direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK. (typically less than 5 W/mK). Consequently, a natural graphite particle composed of multiple grains of different orientations exhibits an average property between these two extremes.

It would be highly desirable in many applications to produce a bulk graphite particle (containing single or multiple grains) having sufficiently large dimensions and having all graphene planes being essentially parallel to one another along one desired direction. For instance, it is highly desirable to have one large-size graphite entity (e.g. a fully integrated or unitary layer of multiple graphene planes) having the c-axis directions of all the graphene planes being substantially parallel to one another and having a sufficiently large length and/or width for a particular application (e.g. >5 cm$^2$ for use as a heat-spreading sheet on a CPU of a smart phone or a 50 cm×50 cm substrate supporting 20 CPV cells). Thus far, it has not been possible to produce this type of large-size unitary graphene entity from existing natural or synthetic graphite particles.

The constituent graphene planes of a graphite crystallite can be exfoliated and extracted or isolated from a graphite crystallite to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nano graphene platelets" (NGPs). Graphene sheets/platelets or NGPs are a new class of carbon nano material (a 2-D nano carbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite particles with a strong acid and/or oxidizing agent to obtain a graphite intercalation compound (GIC) or graphite oxide (GO), as illustrated in FIG. 1(c) (process flow chart) and FIG. 1(d) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the c-axis direction. The GIC or GO is most often produced by immersing natural graphite powder (20 in FIGS. 1(c) and 100 in FIG. 1(d)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. This GIC is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid expansion by a factor of 30-300 to form "graphite worms" (24 or 104), which are each a collection of exfoliated, but largely un-separated graphite flakes that remain interconnected. A SEM image of graphite worms is presented in FIG. 2(a).

In Route 1A, these graphite worms (exfoliated graphite or "networks of interconnected/non-separated graphite flakes") can be re-compressed to obtain flexible graphite sheets or foils (26 or 106) that typically have a thickness in the range of 0.1 mm (100 µm)-0.5 mm (500 µm). Alternatively, one may choose to use a low-intensity air mill or shearing machine to simply break up the graphite worms for the purpose of producing the so-called "expanded graphite flakes" (108) which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 2(b)). Many flakes are inclined with respect to one another at a very large angle (e.g. misorientation of 20-40 degrees).

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is typically less than 20 nm.

Route 2 entails ultrasonicating the graphite oxide suspension for the purpose of separating/isolating individual graphene oxide sheets from graphite oxide particles. This is based on the notion that the inter-graphene plane separation has been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.001%-10% by weight, more typically 0.01%-5% by weight.

For the purpose of defining the claims of the instant application, NGPs include discrete sheets/platelets of single-layer and multi-layer graphene, graphene oxide, or reduced graphene oxide with an oxygen content of 0-10% by weight, more typically 0-5% by weight, and preferably 0-2% by weight. Pristine graphene has essentially 0% oxygen. Graphene oxide (including RGO) can have 0.001%-46% by weight of oxygen.

The GO molecules in graphene oxide gel, to be described in detail later, typically contains 20-50% by weight oxygen (more typically 30-47%) immediately after removal of the liquid from the GO gel, but prior to a subsequent heat treatment. The GO gel refers to a homogeneous solution of highly hydrophilic aromatic molecules (graphene oxide molecules bearing oxygen-containing groups, such as —OH, —COOH, and >O, on molecular planes or at the edges) dissolved (not just dispersed) in a liquid (e.g. acidic water). The GO gel per se does not contain visibly discernible or discrete graphene or GO particles in the form of solid sheets or platelets. These GO molecules and the dispersing liquid medium have comparable indices of refraction, making the resulting gel optically transparent or translucent, showing lightly brown color. In contrast, the simple mixture of original graphite particles or discrete NGP sheets/platelets with acids and/or water appears optically dark and opaque. These particles or NGP platelets are simply dispersed (not dissolved) in the fluid medium.

These GO molecules in a GO gel are highly reactive and may be considered as "living giant molecules". By contrast, the prior art solid sheets/platelets of graphene, GO, and RGO are essentially "dead" species. The GO gel can be formed into a shape with a proper shearing or compression stress (e.g. via casting or molding), dried (with liquid components partially or totally removed), and heat-treated under certain conditions to obtain a unitary graphene material, which is typically a single crystal, a poly-crystal with incomplete or poorly delineated grain boundaries, or a poly-crystal with very large grain sizes. The heat treatment serves to chemically link these active or live GO molecules to form a 2-D or 3-D network of chemically bonded graphene molecules of essentially infinite molecular weights, and to drastically reduce the oxygen content of GO down to below 10% by weight, more typically <5%, further more typically <2%, and most typically <<1%. Only a trace amount of oxygen (practically 0%) can survive if the heat treatment temperature is sufficiently high and heat treatment time sufficiently long. This new and unique material called "unitary graphene material" will be further described in detail later.

Although the GO gel per se does not contain visibly discernible/discrete graphene sheets/platelets or NGPs (including "dead" GO sheets/platelets), one can intentionally add discrete graphene sheets/platelets, expanded graphite flakes, and other type of solid filler in the GO gel to form a mixture gel. This mixture gel may be dried and subjected to the same heat treatment to convert the live GO molecules into a unitary graphene material, also enabling these active molecules to chemically bond to the filler particles. This graphene oxide gel-derived graphene material, reinforced with a filler phase (e.g. discrete NGPs, CNTs and carbon fibers), constitutes the presently invented unitary graphene matrix composite as a readily mass-processable material for heat sinks or other heat transfer members. It may be noted that GO may be used to deposit a layer on a surface of a flexible graphite foil 35 to produce GO gel-coated graphite foil 36, which can be dried to form GO-coated graphite foil 40. Similarly, GO may be coated to a pristine graphene paper/film 38 to produce GO gel-coated pristine graphene foil, which upon drying becomes GO-coated pristine graphitic foil 42.

It may be noted that flexible graphite foils (obtained by compressing or roll-pressing exfoliated graphite worms) for electronic device thermal management applications (e.g. as a heat sink material) have the following major deficiencies:

(1) As indicated earlier, flexible graphite (FG) foils exhibit a relatively low thermal conductivity, typically <500 W/mK and more typically <300 W/mK. By impregnating the exfoliated graphite with a resin, the resulting composite exhibits an even lower thermal conductivity (typically <<200 W/mK, more typically <100 W/mK).

(2) Flexible graphite foils, without a resin impregnated therein or coated thereon, are of low strength, low rigidity, and poor structural integrity. The high tendency for flexible graphite foils to get torn apart makes them difficult to handle in the process of making a heat sink, or integrating in a solar cell module or system. As a matter of fact, the flexible graphite sheets (typically 50-200 μm thick) are so "flexible" that they are not sufficiently rigid to make a fin component material for a heat sink or to make a solar cell module supporting structure.

(3) Another very subtle, largely ignored or overlooked, but critically important feature of FG foils is their high tendency to get flaky with graphite flakes easily coming off from FG sheet surfaces and emitting out to other parts of a microelectronic device or solar cells. These highly electrically conducting flakes (typically 1-200 μm in lateral dimensions and >100 nm in thickness) can cause internal shorting and failure of electronic devices.

(4) Both resin-free flexible graphite and resin-impregnated FG (with resin impregnating step occurring before or after roll-pressing) are not conducive to mass production of finned heat sink structures. It is virtually impossible to use mass production processes (such as extrusion, stamping, forging, and die casting that are commonly used for making aluminum heat sinks, or injection molding for making conductive filler-reinforced plastic-based heat sinks) to make FG-based heat sinks without some kind of subsequent bonding or assembling operations. One has to manually attach individual fin members to a core or base member. For instance, one may produce bonded fin heat sink assemblies in which each fin in the assembly is individually bonded into a heat sink base. A major shortcoming of such heat sinks is their high cost. This cost is related directly to the labor required to individually arrange each fin on some sort of support or substrate (a base or core) and high production cycle time. Further, bonding between a fin and a base is not always reliable and the long-term reliability of flexible graphite-based finned heat sinks is highly questionable. Flexible graphite based heat sinks (essentially all of them having resin impregnation or resin coating) are disclosed in the following patents: J. Norley, et al., "Graphite-based heat sinks," U.S. Pat. No. 6,503,626 (Jan. 7, 2003); M. D. Smalc, et al., "Radial finned heat sink," U.S. Pat. No. 6,538,892 (Mar. 25, 2003); G. Getz, et al., "Heat sinks made from longer and shorter graphite sheets," U.S. Pat. No. 6,771,502 (Aug. 3, 2004).

Similarly, solid NGPs (including discrete sheets/platelets of pristine graphene, GO, and GRO), when packed into a film, membrane, or paper sheet (34 or 114) of non-woven aggregates, typically do not exhibit a high thermal conductivity unless these sheets/platelets are closely packed and the film/membrane/paper is ultra-thin (e.g. <1 μm, which is mechanically weak). This is reported in our earlier U.S. patent application Ser. No. 11/784,606 (Apr. 9, 2007). However, ultra-thin film or paper sheets (<10 μm) are difficult to produce in mass quantities, and difficult to handle when one tries to incorporate these thin films as a heat sink material. In general, a paper-like structure or mat made from platelets of graphene, GO, or RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 3(*b*)), leading to relatively poor thermal conductivity, low electric conductivity, and low structural strength. These papers or aggregates of discrete NGP, GO or RGO platelets alone (without a resin binder) also have a tendency to get flaky, emitting conductive particles into air.

Our earlier application (U.S. application Ser. No. 11/784, 606) also disclosed a mat, film, or paper of NGPs infiltrated with a metal, glass, ceramic, resin, and CVD carbon matrix material (graphene sheets/platelets being the filler or reinforcement phase, not the matrix phase in this earlier application). Haddon, et al. (US Pub. No. 2010/0140792, Jun. 10, 2010) also reported NGP thin film (mat/paper of discrete graphene platelets) and NGP-reinforced polymer matrix composites for thermal management applications. The processes used by Haddon et al to produce NGPs are identical to those disclosed much earlier by us (Jang, et al. U.S. patent application Ser. No. 10/858,814 (Jun. 3, 2004)). The NGP-reinforced polymer matrix composites, as an intended thermal interface material, have very low thermal conductivity, typically <<2 W/mK. The NGP films of Haddon, et al are essentially non-woven aggregates of discrete graphene platelets, identical to those of our earlier invention (U.S. application Ser. No. 11/784,606). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, the metal matrix is too heavy and the resulting metal matrix composite does not exhibit a high thermal conductivity. More significantly, all these prior art materials and related processes are not amenable to mass production of finned heat sinks cost-effectively. In fact, there has been no known report on using these materials for firmed heat sink applications.

Another prior art material for thermal management application is the pyrolitic graphite film. The lower portion of FIG. 1(*c*) illustrates a typical process for producing prior art pyrolitic graphitic films from a polymer. The process begins with carbonizing a polymer film 46 at a carbonization temperature of 400-1,000° C. under a typical pressure of 10-15 Kg/cm$^2$ for 2-10 hours to obtain a carbonized material 48, which is followed by a graphitization treatment at 2,500-3,200° C. under an ultrahigh pressure of 100-300 Kg/cm$^2$ for 1-24 hours to form a graphitic film 50. It is technically utmost challenging to maintain such an ultrahigh pressure at such an ultrahigh temperature. This is a difficult, slow, tedious, energy-intensive, and very expensive process. Furthermore, carbonization of certain polymers (e.g. polyacrylonitrile) involves the emission of toxic species.

A second type of pyrolytic graphite is produced by high temperature decomposition of hydrocarbon gases in vacuum followed by deposition of the carbon atoms to a substrate surface. This vapor phase condensation of cracked hydrocarbons is essentially a chemical vapor deposition (CVD) process. In particular, highly oriented pyrolitic graphite (HOPG) is the material produced by the application of uniaxial pressure on deposited pyrocarbon or pyrolytic graphite at very high temperatures (typically 3,000-3,300° C.). This entails a thermo-mechanical treatment of combined mechanical compression and ultra-high temperature for an extended period of time in a protective atmosphere; a very expensive, energy-intensive, and technically challenging process. The process requires ultra-high temperature equipment (with high vacuum, high pressure, or high compression provision) that is not only very expensive to make but also very expensive and difficult to maintain. Even with such extreme processing conditions, the resulting PG (including HOPG) still possesses many defects, grain boundaries, and mis-orientations (neighboring graphene planes not parallel to each other), resulting in less-than-satisfactory in-plane properties. Typically, the best prepared HOPG sheet or block remains far from being a graphite single crystal; instead, it typically still contains many grains or crystals and a vast amount of grain boundaries and defects. All PG film production processes do not allow for impregnation of a resin matrix. PG or HOPG films, being weak, non-rigid, and not easily processable suffer from the same shortcomings as flexible graphite intended for use to construct finned heat sinks.

Similarly, the most recently reported graphene thin film (<2 nm) prepared by catalytic CVD of hydrocarbon gas (e.g. $C_2H_4$) on Ni or Cu surface is not a single-grain crystal, but a poly-crystalline structure with many grain boundaries and defects. With Ni or Cu being the catalyst, carbon atoms obtained via decomposition of hydrocarbon gas molecules at 800-1,000° C. are deposited onto Ni or Cu foil surface to form a sheet of single-layer or few-layer graphene that is poly-crystalline. The grains are typically much smaller than 100 μm in size and, more typically, smaller than 10 μm in size. These graphene thin films, being optically transparent and electrically conducting, are intended for applications such as the touch screen (to replace indium-tin oxide or ITO glass) or semiconductor (to replace silicon, Si). However, these ultra-thin polycrystalline graphene films are not sufficiently thermally conducting (too many grains or too much grain boundaries, and all grains being oriented in different directions) and not sufficiently thick for use as a heat sink material. Furthermore, the Ni- or Cu-catalyzed CVD process does not lend itself to the fabrication of a heat sink that is typically complex in shape.

Thus, it is an object of the present invention to provide a heat dissipation member formed of graphene oxide (GO) gel-derived unitary graphene material (monolithic graphene entity) or its composite version (containing, for instance, a carbon/graphite filler phase dispersed in or bonded by a unitary graphene matrix material derived from a GO gel), which exhibits a thermal conductivity comparable to or greater than the thermal conductivities of the PG (including HOPG), CVD graphene film, and/or flexible graphite (including resin-impregnated FG). This member has at least one surface deposited with or connected to a layer of electrically non-conducting inorganic material (e.g., ceramic, such as silicon nitride, or semiconductor, such as silicon), which preferably has a good thermal conductivity (preferably >30 W/mK and more preferably >50 W/mK). This inorganic material electrically isolates the CPV cell(s) from the unitary graphene member.

This thermally and electrically conductive graphene monolith or graphene matrix composite can be used to produce a heat dissipation member (such as a finned heat sink or a heat transfer plate) cost effectively in large quantities, using commonly used, less complex, and easier-to-control processes with readily available, inexpensive equipment.

It is another object of the present invention to provide a heat dissipation member formed of GO-derived unitary graphene or graphene matrix composite that exhibits a combination of exceptional thermal conductivity, electrical conductivity, mechanical strength, surface hardness, and scratch resistance unmatched by any material. This member preferably has at least one surface deposited with or connected to a layer of electrically non-conducting inorganic material. This member can include a heat sink, wherein the fins and the base (or core) portion of the heat sink are preferably formed into an integral body that does not involve attaching or bonding individual fin components to the base, or stacking and assembling individual fin sheets together (as would be required in assembling flexible graphite-based fumed heat sinks).

It is a specific object of the present invention to provide a highly conductive unitary graphene material or graphene matrix composite that meets the following technical requirements (a) a thermal conductivity greater than 600 W/mK (preferably greater than 1,000 W/mK, and further preferably greater than 1,700 W/mK); (b) an electrical conductivity greater than 2,000 S/cm (preferably >3,000 S/cm, more preferably >5,000 S/cm, even more desirably >10,000 S/cm, and most preferably >15,000 S/cm); (c) Rockwell surface hardness value >60 (preferably >80); and/or (d) a tensile or flexural strength greater than 80 MPa (preferably >100 MPa, more preferably >150 MPa, and most preferably >200 MPa). No prior art material meets this set of technical requirements.

This new class of heat transfer materials (i.e., a GO gel-derived unitary graphene monolithic and the unitary graphene matrix composite) has the following characteristics (separately or in combination) that distinguish themselves from PG, HOPG, CVD graphene film, flexible graphite sheets, flexible graphite composite, paper/film/membrane of discrete graphene/GO/RGO sheets/platelets, and conventional graphene/GO/RGO platelet-reinforced resin matrix composite, metal matrix composite, and carbon matrix composites:

(1) This unitary graphene material is an integrated graphene entity that is either a graphene single crystal (single grain only) or a poly-crystal (multiple grains but typically having incomplete grain boundaries or having exceptionally large grains). Typically and preferably, with some compression or shearing stresses exerted on the GO during shaping and subsequent heat treating, the unitary graphene material has all the graphene planes in all the grains being essentially oriented parallel to one another (i.e., the crystallographic c-axis of all grains pointing in an identical direction).

(2) The unitary graphene matrix is an integrated graphene entity that is not an aggregate or stack of multiple discrete graphite flakes or discrete platelets of graphene/GO/RGO, and does not contain any discernible or discrete flake/platelet derived from the original GO gel.

(3) This integrated graphene matrix is not made by bonding discrete flakes/platelets together with a binder or adhesive. Instead, GO molecules in the GO gel are chemically active and live species capable of chemically merging with one another mainly in an edge-to-edge manner (forming 2-D giant graphene molecules), but possibly also with adjacent GO molecules below or above (forming 3-D network of graphene chains). Through joining or forming of covalent bonds with one another, the GO molecules are adhered into an integrated graphene entity (the unitary graphene material), without using any externally added linker or binder molecules or polymers. In the presence of discrete carbon/graphite/graphene filler particles (e.g. carbon black particles, CNTs, and NGPs), the GO molecules are also capable of acting as a binder or adhesive that chemically bonds these carbon/graphite filler particles together to form a strong composite.

(4) This unitary or monolithic graphene matrix (a single crystal or poly-crystal with essentially all graphene planes having an identical crystallographic c-axis) is derived from a GO gel, which is in turn obtained from heavy oxidation of natural graphite or artificial graphite particles originally having multiple graphite crystallites. Prior to being chemically oxidized to become GO gel, these starting or original graphite crystallites have an initial length ($L_a$ in the crystallographic a-axis direction), initial width ($L_b$ in the b-axis direction), and thickness ($L_c$ in the c-axis direction). The resulting unitary graphene entity typically has a length or width significantly greater than the $L_a$ and $L_b$ of the original graphite crystallites.

(5) It may be noted that there has been numerous reports on "graphene composites." However, these "graphene composites" make use of discrete pristine graphene sheets, graphene oxide platelets, or reduced graphene oxide platelets as the reinforcement phase, which is dispersed in a matrix material selected from a resin (to form a resin matrix composite), a metal (metal matrix composite), a carbon (carbon matrix composite), a glass (glass matrix composite), or a ceramic (ceramic matrix composite). In these prior art "graphene composites," graphene sheets/platelets are the discrete and dispersed phase, not the matrix phase (i.e., not the continuous phase that bonds and protects the dispersed phase). These discrete graphene sheets/platelets are the dispersed phase bonded and protected by a matrix material, such as a resin, metal, carbon (CVD carbon, amorphous carbon, or polymeric carbon), glass, or ceramic. In stark contrast or completely oppositely, in the presently invented unitary graphene matrix composite, graphene is the matrix material that serves to bond, adhere, and protect the dispersed filler phase, such as CNT and carbon black (CB) particles. CNT or CB particles are dispersed in and protected by the unitary graphene matrix. The graphene matrix is a continuous, unified, or integrated material phase.

The present invention also provides a method or process for producing heat sinks and/or heat transfer plates from such a GO gel-derived unitary graphene entity and the graphene matrix composite.

Another object of the present invention is to provide a cost-effective process for producing heat sinks or heat transfer plates from a GO-derived graphene monolith and a graphene matrix composite that exhibits a combination of exceptional thermal conductivity, electrical conductivity, mechanical strength, surface hardness, and scratch resistance.

In particular, the present invention provides a fast, scalable process capable of mass-producing unitary or monolithic graphene or graphene matrix composite-based heat sinks from a GO gel. Advantageously and surprisingly, conventional mass production techniques, such as die casting, injection molding, compression molding, resin-transfer molding, and extrusion, can be adapted for cost-effectively producing these heat sinks.

This process involves significantly lower heat treatment temperatures as compared with the processes for producing pyrolytic graphite (including HOPG) from either carbonized polymers (e.g. polyimide) or the CVD graphite. The presently invented process is simpler (hence, more reliable), less energy-intensive, and highly scalable.

SUMMARY OF THE INVENTION

A preferred embodiment of the present invention is an inorganic coating-protected unitary graphene material article for concentrated photovoltaic cell heat dissipation application. This article may be in a form of a heat-transfer plate or a heat sink. The article comprises at least a layer of unitary graphene material having two primary surfaces and an electrically non-conducting layer of inorganic coating deposited on at least one of the primary surfaces, wherein the unitary graphene material is obtained from heat-treating a graphene oxide gel at a heat treatment temperature higher than 100° C. and contains chemically bonded graphene molecules or chemically merged graphene planes having an inter-graphene spacing no greater than 0.40 nm (preferably less than 0.337 nm, and more preferably 0.3354 nm.

The unitary graphene material may be added with a discrete filler or reinforcement phase dispersed in the unitary graphene material to form a unitary graphene matrix composite structure (not a graphene sheet/platelet-reinforced polymer matrix composite). The filler or reinforcement phase may preferably contain a particle, filament, nano-tube, nano-wire, or nano-rod of a metal, ceramic, glass, polymer, carbon, graphite, or a combination thereof.

The reinforcement phase may be advantageously selected from a discrete solid carbon, graphite, or graphene platelet-based filler phase that is dispersed in the unitary graphene material to form a unitary graphene matrix composite structure. Particularly useful filler phase is a carbon or graphite fiber, carbon or graphite nano-fiber, carbon nano-tube, carbon nano-rod, meso-phase carbon particle, meso-carbon micro-bead, expanded graphite flake with a thickness greater than 100 nm, single-layer graphene sheet, multi-layer graphene platelet with a thickness less than 100 nm, exfoliated graphite or graphite worm, coke particle, needle coke, carbon black or acetylene black particle, activated carbon particle, or a combination thereof. The carbon, graphite, or graphene filler phase occupies a weight fraction of 0.01% to 99% based on the total composite structure weight. It is particularly unique to have a graphene/graphene composite containing graphene sheets or platelets as a reinforcement and a unitary graphene material as the matrix material for the composite.

The inorganic coating is herein implemented to electrically isolate a solar cell unit from the underlying unitary graphene layer that is thermally conductive and electrically conductive as well. This inorganic coating may selected from (a) a ceramic material; (b) diamond (artificial diamond, in particular); (c) a semiconductor element or compound such as Si, Ge, Ga, gallium nitride, gallium phosphide, gallium arsenide, aluminum nitride, aluminum phosphide, aluminum arsenide, boron nitride, boron phosphide, boron arsenide; or a combination thereof. This inorganic material desirably has a relatively high thermal conductivity (e.g. higher than 30 W/mK, preferably higher than 80 W/mK) despite having a low electrical conductivity. Higher thermal conductivity ceramic material may be selected from a metal nitride, metal phosphide, metal arsenide, metal antimonite, metal oxide, metal sulfide, metal selenide, metal telluride, metal halogenide, or a combination thereof.

In a concentrated photovoltaic system of the present invention, the inorganic coating is in thermal contact with a photovoltaic cell and receives heat therefrom. The present invention also provides a concentrated photovoltaic cell comprising a solar collecting and concentrating assembly, a photovoltaic cell that receives solar energy from the solar collecting and concentrating assembly and generates electricity and heat, and a heat-dissipating system of the present invention that receives heat from the photovoltaic cell.

A specific embodiment of the present invention is a coated heat sink comprising a unitary graphene material article that is shaped in such a manner that the article comprises a heat collection member (corresponding to a core or base member of a fumed heat sink) and at least one heat dissipation member (e.g. a fin or multiple fins) integral to the heat collection member (base). The heat collection member is deposited with an electrically non-conducting coating layer that is configured to be in thermal contact with a solar cell (e.g. a CPV cell), collects heat from this solar cell, and dissipates heat through the at least one heat dissipation member (e.g., dissipates the heat through the fins into the air). The unitary graphene material is obtained from heat-treating a graphene oxide gel at a temperature higher than 100° C. and contains chemically bonded graphene molecules.

The graphene oxide gel is obtained by immersing powders or filaments of a graphitic material in an oxidizing liquid medium (e.g. a mixture of sulfuric acid, nitric acid, and potassium permanganate) in a reaction vessel. The graphitic material may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. When the graphite powders or filaments are mixed in the oxidizing liquid medium, the resulting slurry initially appears completely dark and opaque. When the oxidation of graphite proceeds at a reaction temperature for a sufficient length of time under a controlled pH condition, the reacting mass can eventually turn optically translucent or transparent, which also looks and behaves like a gel. This heavy oxidation-induced graphene oxide gel is composed of graphene oxide molecules dispersed in the liquid medium. The graphene oxide molecules, prior to any subsequent heat treatment, have an oxygen content no less than 20% by weight (typically from 40-50% by weight) and their molecular weights are typically less than 43,000 g/mole (often less than 4,000 g/mole, but typically greater than 200 g/mole) while in a gel state. The graphene oxide gel is composed of graphene oxide molecules dispersed in an acidic medium having a pH value of typically no higher than 5.

Subsequently, the GO gel is formed into a shape (e.g. cast film on a solid substrate or sheared/compressed mass in a mold cavity) with the liquid component in the GO gel being partially or completely removed to obtain at least partially dried GO mass containing well-packed and well-aligned live GO molecules. This dried GO mass is then subjected to a properly programmed heat treatment that can be divided into four distinct temperature regimes. The presently invented unitary graphene material can be obtained by heat-treating the dried GO mass with a temperature program that covers at least the first regime, more commonly covers the first two regimes, still more commonly the first three regimes, and most commonly all the 4 regimes (the latter being implemented to achieve the highest conductivity):

Regime 1: 100° C.-500° C. (the thermal reduction regime); Oxygen content reduced from typically 30-50% to 5-6%, resulting in a reduction of inter-graphene spacing from approximately 0.6-1.0 nm to approximately 0.4 nm and an increase in in-plane thermal conductivity of a consolidated thin film from approximately 100 to 450 W/mK.

Regime 2: 500° C.-1,250° C. (the chemical linking regime); Oxygen content reduced to typically 0.7% (<<1%), resulting in a reduction of inter-graphene spacing to approximately 0.345 nm, an increase in in-plane thermal conductivity of a unitary graphene thin film to 1,400-1,500 W/mK, and/or in-plane electrical conductivity to 3,000-4,000 S/cm.

Regime 3: 1,250° C.-2,000° C. (the ordering and re-graphitization regime); Oxygen content reduced to typically 0.01%, resulting in a reduction of inter-graphene spacing to approximately 0.337 nm (degree of graphitization from 1% to approximately 80%) and improved degree of ordering, an increase in in-plane thermal conductivity of a unitary graphene thin film to >1,680 W/mK, and/or in-plane electrical conductivity to 5,000-7,000 S/cm.

Regime 4: 2,000° C.-3,000° C. (the re-crystallization and perfection regime); Oxygen content reduced to typically 0%-0.001%, resulting in a reduction of inter-graphene spacing to approximately 0.3354 nm (degree of graphitization from 80% to nearly 100%) and perfection of crystal structure and orientation, an increase in in-plane thermal conductivity of a unitary graphene thin film to >1,800 W/mK, and in-plane electrical conductivity to 15,000-25,000 S/cm.

The degree of graphitization, g, was calculated from the X-ray diffraction pattern using Mering's Eq, $d_{002} = 0.3354 g + 0.344 (1-g)$, where $d_{002}$ is the interlayer spacing of graphite or graphene crystal in nm. This equation is valid only when $d_{002}$ is no greater than 0.3440 nm. The unitary graphene material having a $d_{002}$ higher than 0.3440 nm reflects the presence of oxygen-containing functional groups (such as —OH, >O, and —COOH on graphene molecular plane surfaces) that act as a spacer to increase the inter-graphene spacing.

Another structural index that can be used to characterize the degree of ordering of the presently invented unitary graphene material or related graphite crystals is the "mosaic spread" value, which is expressed by the full width at half maximum of the (002) or (004) reflection in a X-ray diffraction intensity curve. This degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our unitary graphene materials have a mosaic spread value in this range of 0.2-0.4 (with a heat treatment temperature no less than 2,000° C.). However, some values are in the range of 0.4-0.7 if the highest heat treatment temperature (TTT) is between 1,250 and 2,000° C., and in the range of 0.7-1.0 if the TTT is between 500 and 1,250° C.

A preferred embodiment of the present invention is an inorganic material-coated heat sink or coated heat transfer plate formed of a unitary graphene material or a unitary graphene material reinforced with a filler or reinforcement phase, wherein the unitary graphene material exhibits a mosaic spread value less than 1.0. Preferably, the unitary graphene material exhibits a degree of graphitization no less than 40% and/or a mosaic spread value less than 0.7. Further preferably, the unitary graphene material exhibits a degree of graphitization no less than 80% and/or a mosaic spread value no greater than 0.4. Most preferably, the degree of graphitization is at least 99% and/or the mosaic spread value is from 0.2 to 0.4, representing a near perfect graphene single crystal having all graphene planes essentially perfectly parallel to one another.

In the presently invented heat transfer member, the unitary graphene material can further contain a discrete filler or reinforcement phase dispersed in the unitary graphene material to form a unitary graphene matrix composite structure. The filler or reinforcement phase may contain a particle, filament, nano-tube, nano-wire, or nano-rod of a metal, ceramic, glass, polymer, carbon, graphite, or a combination thereof. Particularly desired filler or reinforcement phase is selected from a carbon or graphite fiber, carbon or graphite nano-fiber, carbon nano-tube, carbon nano-rod, meso-phase carbon particle, meso-carbon micro-bead, expanded graphite flake with a thickness greater than 100 nm, single-layer graphene sheet, multi-layer graphene platelet with a thickness less than 100 nm, exfoliated graphite or graphite worm, coke particle, needle coke, carbon black or acetylene black particle, activated carbon particle, or a combination thereof. The carbon, graphite, or graphene filler phase occupies a weight fraction of 0.01% to 99% (preferably from 10% to 70%) based on the total composite structure weight.

The unitary graphene matrix or the graphene matrix composite preferably has a physical density of at least 1.7 g/cm$^3$ or a porosity level lower than 10%, and more preferably has a physical density of at least 1.8 g/cm$^3$ or a porosity level lower than 5%. Preferably and typically, the carbon or graphite filler is chemically bonded by the unitary graphene matrix. It is most surprising that this unitary graphene matrix, prepared through the route of a GO gel, is capable of chemically bonding to a filler phase and that the constituent GO molecules in a GO gel mass are capable of chemically bonding and merging with one another to form an integrated 2-D or 3-D network of aromatic chains or giant graphene molecules of essentially infinite molecular weight, much like a 3-D network of cross-linked polymer chains. Chemical analyses, including various spectroscopy studies, have demonstrated that these chemically bonded graphene molecules contain a combination of sp$^2$ and sp$^3$ electronic configurations.

It may be noted that the unitary graphene matrix material, when prepared alone without the presence of the carbon or graphite filler phase, can be made into a unitary graphene layer or graphene single crystal. This unitary graphene layer or graphene single crystal would contain closely packed and bonded parallel graphene planes having an inter-graphene plane spacing of 0.3354 to 0.40 nm (mostly between 0.3354 and 0.337 nm) and an oxygen content up to 10% by weight (mostly <<1%). This unitary graphene layer or graphene single crystal can be obtained from heat-treating a graphene oxide gel at a temperature higher than 100° C. (up to 500, 1,250, 2,000, or 3,000° C., depending upon the desired properties), wherein an average mis-orientation angle between two graphene planes is less than 10 degrees, preferably and typically less than 5 degrees. The graphene single crystal, prepared alone without the presence of a filler, refers to the single-grain or single-domain graphene or poly-crystalline structure (but having incomplete grain boundaries) in which most of the graphene planes in all grain(s) are essentially parallel to one another. This unitary graphene or graphene monolith contains therein no discrete graphite flake or graphene platelet derived from the graphene oxide gel. All graphene oxide molecules have been chemically merged, linked, and integrated into one single integral unit, hence the name "unitary graphene" entity.

In the unitary graphene matrix composite prepared in the presence of a filler phase, the chemically bonded graphene planes also can be parallel to one another (e.g. along a fiber axis direction). In the unitary graphene matrix composite, the unitary graphene matrix typically contains no complete grain boundary therein and contains no discrete or discernible graphene platelet derived from the original graphene oxide gel. Preferably and typically, the carbon or graphite filler is chemically bonded by the unitary matrix material in the composite (e.g. via covalent bonds).

The production of the graphene matrix composite typically begins with preparation of a mass of GO gel, which is then mixed with particles of the carbon/graphite filler phase to form a slurry mass. The slurry is formed into a desired shape (a finned heat sink or a component) supported by a die casting tool or mold cavity, preferably with a shear stress to facilitate orientation or alignment of aromatic GO molecules. Alternatively, the carbon/graphite filler phase is first formed into a porous preform (e.g. mat, paper, or fabric) of a desired heat sink shape, which is then impregnated with the GO gel. In either route, the liquid component of this GO gel is then partially or totally removed and, concurrently or sequentially, this GO material is subjected to a heat treatment. This heat treatment, also herein referred to as a chemical linking and re-graphitization treatment, thermally converts the GO molecules to an integrated graphene entity by chemically merging individual graphene oxide molecules primarily sideway in an edge-to-edge manner to form significantly larger graphene planes, but sometimes also chemically linking with the GO molecules below or above this graphene plane to form a 3-D molecular network. This 3-D molecular network can be broken and re-organized if the final heat treatment occurs at a sufficiently high temperature for an extended length of time.

Further alternatively, the carbon or graphite filler may be made into a form of fiber yarns or fiber bundles impregnated with the graphene oxide gel and the composite is made by forming the fiber yarns or bundles into a desired shape prior to heat treating. The desired shape can mean part of or an entire heat sink structure. It is highly surprising for us to observe that graphene oxide gel has an outstanding adhesive power that can bond the filler phase (e.g. carbon fibers or nano-tubes) together to form a composite of exceptional structural integrity.

The graphene oxide gel-derived unitary or monolithic graphene entity or the corresponding graphene matrix composite has a unique combination of outstanding thermal conductivity, electrical conductivity, mechanical strength, scratch resistance, and elimination of the possibility of having surface graphite flakes or particles to "flake off" (actually, there is no discrete flake/platelet to be peeled therefrom).

Further, the graphene oxide (GO) gel-derived unitary graphene matrix material or graphene matrix composite has the following novel, unique, and unprecedented characteristics (separately or in combination):

(1) The unitary graphene matrix material itself is an integrated graphene object that is either a graphene single crystal or a poly-crystal having multiple grains (but with incomplete or poorly delineated grain boundaries, or huge grain sizes). When made into a thin-film form (e.g. <200 μm thick) or formed under the influence of a shear stress or compression stress (during drying and/or heat treating), the unitary graphene matrix is composed of multiple graphene planes most of which are essentially oriented parallel to one another.

(2) In contrast to the paper-like sheets of expanded graphite flakes or graphene platelets (e.g. those prepared by a paper-making process), this integrated graphene entity (the unitary graphene matrix material) is not an aggregate or stack of multiple discrete graphite flakes or discrete platelets of graphene, GO, or RGO. This is a single graphene entity or monolith, not a simple aggregate of multiple graphite flakes (such as in FG foil) or graphene sheets/platelets (such as prior art graphene paper/membrane/film). This unitary graphene entity does not contain discrete graphite flakes or discrete graphene platelets dispersed therein that are derived from the GO gel. The GO molecules do not revert back to individual or discrete graphene platelets or graphite flakes. Through chemical inter-linking of GO molecules, re-graphitization, and re-crystallization, the GO molecules and the original graphene planes of hexagonal carbon atoms (constituting original graphite particles) have completely lost their original individual identity and have been united into one single entity (unitary body or monolith).

(3) The integrated graphene entity is not made by gluing or bonding discrete flakes/platelets together with a binder, linker, or adhesive. Instead, GO molecules in the GO gel are merged, mainly edge-to-edge through joining or forming of covalent bonds with one another, into an integrated graphene entity, without using any externally added linker or binder molecules or polymers.

(4) This unitary or monolithic graphene entity is derived from a GO gel, which is in turn obtained from natural graphite or artificial graphite particles originally having multiple graphite crystallites. Prior to being chemically oxidized, these starting graphite crystallites have an initial length ($L_a$ in the crystallographic a-axis direction), initial width ($L_b$ in the b-axis direction), and thickness ($L_c$ in the c-axis direction). The resulting unitary graphene entity typically has a length or width significantly greater than the $L_a$ and $L_b$ of the original crystallites. Even the individual grains in a poly-crystalline unitary graphene entity have a length or width significantly greater than the $L_a$ and $L_b$ of the original crystallites. They can be as large as the length or width of the unitary graphene entity itself, not just 2 or 3 times higher than the initial $L_a$ and $L_b$ of the original crystallites. The unitary graphene layer or graphene single crystal typically has a length or width no less than 10 µm, more typically no less than 100 µm, and even more typically no less than 1 cm. They often are extended to cover the entire width of the original GO gel layer deposited on a substrate surface, which can be >100 cm as desired.

The unitary graphene matrix material can have a thickness as low as 10 nm and can be as low as 2 nm, but the ultra-thin film thinner than 2 nm has the tendency to get fragmented when heated to a high temperature. The unitary graphene material preferably has a thickness >100 nm, more preferably >1 µm, even more preferably >10 µm. The unitary graphene matrix material alone or graphene matrix composite preferably has a thickness less than 200 µm for a heat spreader application, but it can be much thicker. The thickness range of 20-100 µm is particularly useful for mobile device thermal management applications.

The flexible graphite sheet or foil prepared by re-compressing (e.g. roll-pressing) exfoliated graphite worms or flakes has a great tendency to flake off, emitting graphite flakes into air and eventually relocating to a dangerous spot (e.g. where the presence of graphite flakes could cause internal short-circuiting). Further, flexible graphite sheets or foils are relatively brittle and weak, and hence are difficult to handle in an actual microelectronic device manufacturing environment. They also do not possess high thermal conductivity (most typically <300 W/mK). These and other major issues associated with the use of flexible graphite sheets in a microelectronic device for a thermal management purpose have been effectively overcome surprisingly by the presently invented unitary graphene body.

The unitary graphene matrix composite shows a surprisingly high Rockwell hardness value, typically greater than 80 and often greater than 100. This is unprecedented since prior art flexible graphite foil, pyrolytic graphite, or bulk graphite does not show such a high hardness.

The unitary graphene matrix composite of the present invention can exhibit an electrical conductivity greater than 1,500 S/cm, a thermal conductivity greater than 600 W/mK, a physical density greater than 1.8 g/cm3, and/or a tensile strength greater than 80 MPa. With a higher re-graphitization temperature, the graphene monolithic can have an electrical conductivity greater than 3,000 S/cm, a thermal conductivity greater than 1,000 W/mK, a physical density greater than 1.9 g/cm3, and/or a tensile strength greater than 100 MPa. It can even exhibit an electrical conductivity greater than 5,000 S/cm, a thermal conductivity greater than 1,500 W/mK, a physical density greater than 2.0 g/cm$^3$, and/or a tensile strength greater than 150 MPa.

According to one aspect of the present invention, the heat transfer member is a heat sink containing a base (having a heat collecting surface) and at least one heat dissipation member (fin), preferably multiple fins that are formed at the heat collection surface. The fins and the base preferably constitute an integrated structure, but can be assembled from perhaps 2-4 sub-assemblies (but not involving assembling individual fins to the base). One surface of the heat sink base is covered with a layer of inorganic coating that is chemically bonded or physically connected to the base.

The heat sink can be a radial finned heat sink assembly that comprises: (a) a base comprising one heat collection surface (a surface of a base member); and (b) a plurality of spaced parallel planar fin members supported by or integral with the base, wherein the planar fin members comprise the at least one heat dissipation member. The multiple parallel planar fin members preferably are equally spaced.

Preferably, each fin comprises a surface coated with a high-emissivity material having an emissivity greater than an emissivity of the unitary graphene material itself. The high-emissivity material may be selected from aluminum oxide, zinc oxide, aluminum nitride, titanium oxide, boron nitride, silicon carbide, silicon nitride, gallium nitride, or a combination thereof. The high-emissivity material may be in the form of metal or ceramic nano particles.

DESCRIPTION OF THE PREFERRED EMBODIMENTS

Two examples are herein presented to illustrate some preferred embodiments of the present invention, which include heat transfer members for photovoltaic cells, particularly concentrated photovoltaic (CPV) cells. The heat transfer member can be in the form of a heat transfer/dissipating plate or a heat sink formed of a unitary graphene material or unitary graphene matrix composite with one surface deposited with or bonded to an inorganic coating. The inorganic coating is electrically non-conducting, but the unitary graphene material or graphene matrix composite is highly conducting both thermally and electrically.

Figure 1A:
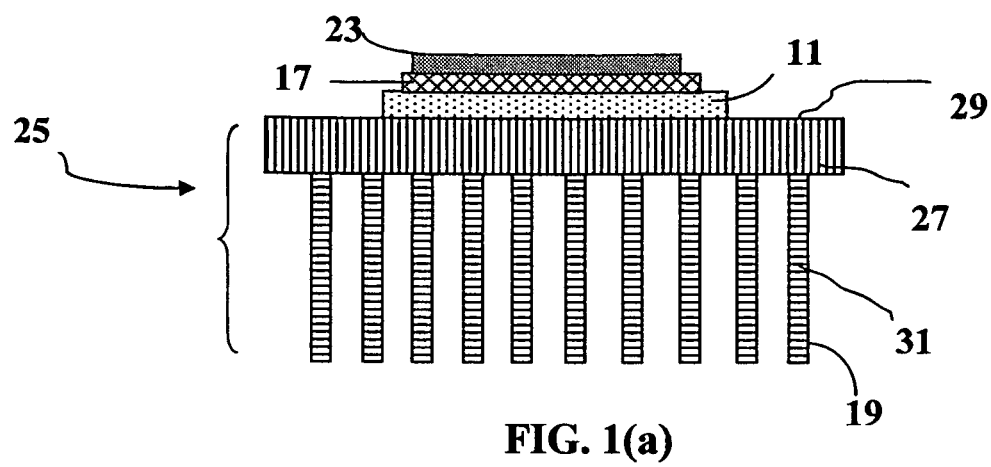
FIG. 1 (a) Example of a solar cell heat-dissipating system; (b) Example of a coated heat transfer member supporting multiple CPV cells; (c) A flow chart illustrating various prior art processes of producing exfoliated graphite products (flexible graphite foils and flexible graphite composites) and pyrolytic graphite (bottom portion), along with processes for producing graphene oxide gel and GO gel-coated laminates; (d) Schematic drawing illustrating the processes for producing paper, mat, film, and membrane of simply aggregated graphite or NGP flakes/platelets. All processes begin with intercalation and/or oxidation treatment of graphitic materials (e.g. natural graphite particles).

FIG. 1(a) shows a cross section view of a solar cell device structure, which includes an electrically non-conducting substrate 11 (e.g. ceramic), a circuit layout layer 17 disposed on the ceramic substrate 11, and a layer of solar cell 23 formed on the circuit layout layer 17. Alternatively, the solar cell and the circuit portion may be laid out side by side on the substrate. The ceramic substrate is utilized as a carrier substrate for the solar cell. When in operation, the ceramic substrate may also function as a heat transfer member that helps to transport the heat generated. Thus, upon exposure to solar radiation, the solar cell (e.g. a CPV cell) absorbs and converts portion of the solar spectrum into electrical energy, which is transferred by the circuit layout layer 17 into an energy storage unit (e.g. a battery, not shown here). Since a significant amount of heat is generated by the solar cell and the circuit layout layer, the ceramic substrate must have a high thermal conductivity in order to effectively and efficiently transfer the heat to a heat sink, which rapidly dissipates heat to the ambient air.

In a conventional approach, referring to FIG. 1(a) again, a metal-based heat sink 25 (e.g. containing heat dissipation fins 31 and a heat dissipation base plate 27) is placed below the ceramic substrate 11 to enhance its heat dissipation efficiency. The base has at least one primary surface (e.g. 29) to collect heat. Each fin has one or multiple heat-dissipating surfaces (e.g. 19). With a relatively low thermal conductivity (using Al or carbon fiber-reinforced epoxy composite as the heat sink material), a heat sink must have a large number of thin fins to have sufficient amounts of heat-dissipating surfaces. However, such a design increases the complexity of manufacturing processes and the production cost. Further, most metals have corrosion issues in an outdoor environment and carbon fiber reinforced polymer matrix composites typically have a thermal conductivity lower than 10 W/mK.

According to one embodiment of the present invention, a unitary graphene material or unitary graphene matrix composite is used to make the desired heat sink, such as the one designated as 25 in FIG. 1(a). Preferably, both heat dissipation fins 31 and the heat dissipation base plate 27 are made from the unitary graphene matrix or graphene matrix composite. Further preferably, the dissipation base plate is deposited with a ceramic substrate 11 that electrically isolates the CPV cell from the heat transfer plate. Preferably, this electrically non-conducting substrate 11 has a thickness lower than 10 μm, further preferably thinner than 1 μm.

Figure 1B:
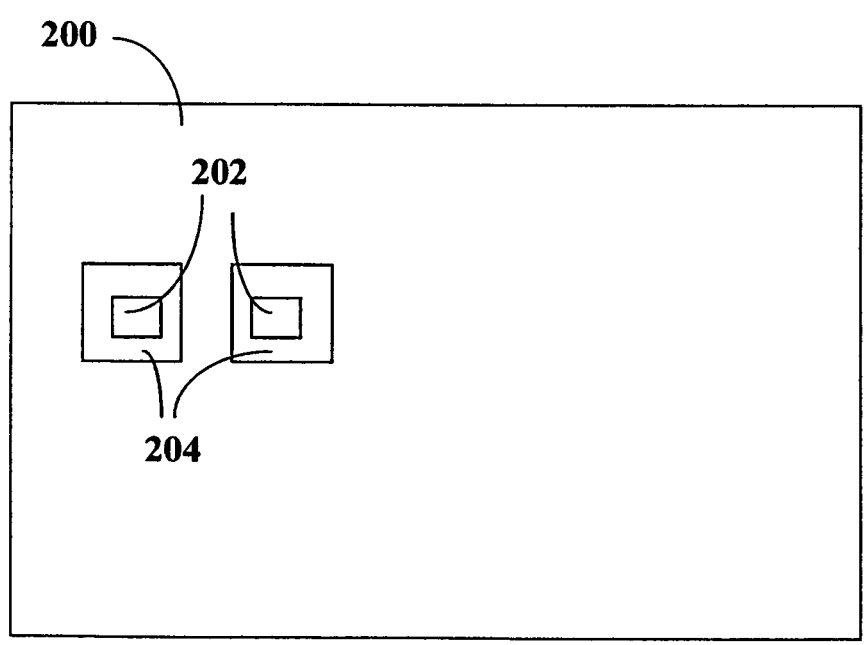

In a practical configuration of a thermally managed CPV module (FIG. 1(b)), one has a unitary material-based heat dissipating plate 200, which also serves as a structural support for multiple sub-mounts (electrically non-conducting substrate 204). Individual CPV cells or chips 202 are implemented on the surface of the sub-mounts 204, which are preferably chemically bonded to the underlying unitary graphene material support 200.

The solar cell is preferably made of group III-IV semiconductor materials, namely, the single crystal or poly-crystal material of group IIIA and VA elements or Si element in a Mendeleev periodic table, wherein, Gallium Arsenide (GaAs), Gallium Aluminum Arsenide (GaAlAs), or Indium Phosphide (InP) is particularly preferred.

It is of significance to point out that the III-IV type CPV cell cannot function properly when the cell experiences a temperature higher than 110° C. The CPV industry demands that the CPV cell operates in the temperature range of 60-90° C. Unfortunately, working with a focusing lens sub-assembly to concentrate solar energy to small spots, the CPV cell can be heated rapidly to reach 400° C. if there is no heat sink implemented thereto. Experimentally, we have observed that different heat sink materials used in the CPV module of FIG. 1(b) lead to very different CPV temperatures:

- Aluminum: 150° C. (reaching 200-300° C. if not aligned properly);
- Copper: 90-150° C. (reaching 150-200° C. if not aligned properly; having serious corrosion issues);
- Flexible graphite sheet: 120-150° C.;
- Resin-impregnated flexible graphite: 150-200° C.;
- Graphite fiber reinforced epoxy composites: 200-300° C.;
- Unitary graphene single crystal: 60-75° C.;
- Carbon nanofiber-reinforced unitary graphene matrix composite: 70-85° C.

These observations have clearly demonstrated the superiority of using unitary graphene materials (unitary graphene alone or unitary graphene matrix composites) as a heat transfer member in a CPV cell system. In fact, these unitary graphene materials appear to be the only group of material ideally suitable for the CPV thermal management application.

The unitary graphene material is obtained from heat-treating a graphene oxide gel at a temperature higher than 100° C. (preferably higher than 500° C., more preferably higher than 1,250° C., further preferably higher than 2,000° C., and advantageously higher than 2,500° C. if a perfect or nearly perfect graphene single crystal is desired) and contains chemically bonded graphene molecules. These planar aromatic molecules or graphene planes (hexagonal structured carbon atoms) are parallel to one another.

The graphene oxide gel is a very unique and novel class of material that surprisingly has great cohesion power (self-bonding, self-polymerizing, and cross-linking capability) and adhesive power (capable of chemically bonding to a wide variety of solid surfaces). These characteristics have not been taught or hinted in the prior art. The GO gel is obtained by immersing powders or filaments of a starting graphitic material in an oxidizing liquid medium (e.g. a mixture of sulfuric acid, nitric acid, and potassium permanganate) in a reaction vessel. The starting graphitic material may be selected from natural graphite, artificial graphite, meso-phase carbon, meso-phase pitch, meso-carbon microbead, soft carbon, hard carbon, coke, carbon fiber, carbon nano-fiber, carbon nano-tube, or a combination thereof.

When the starting graphite powders or filaments are mixed in the oxidizing liquid medium, the resulting slurry initially appears completely dark and opaque. When the oxidation of graphite proceeds at a reaction temperature for a sufficient length of time under a controlled pH condition, the reacting mass can eventually turn optically translucent or transparent, which also looks and behaves like a gel. This heavy oxidation-induced graphene oxide gel is composed of graphene oxide molecules dispersed in the liquid medium. The graphene oxide molecules, prior to any subsequent heat treatment, have an oxygen content no less than 20% by weight (typically from 40-50% by weight) and their molecular weights are typically less than 43,000 g/mole (often less than 4,000 g/mole, but typically greater than 200 g/mole) while in a gel state. The graphene oxide gel is composed of graphene oxide molecules dispersed in an acidic medium having a pH value of typically no higher than 5.

Subsequently, the GO gel is formed into a shape preferably under the influence of a shear or compressive stress. One example of such a procedure is casting or coating a thin film of GO gel (gel-like fluid like a varnish, paint, coating, or ink) onto a solid substrate using a coating machine. The roller, "doctor's blade", or wiper creates a shear/compressive stress when the film is shaped. Quite unexpectedly and significantly, such a shearing/compressive action enables the plane-like graphene oxide (GO) molecules to align well along, for instance, a shearing direction. Further surprisingly, such a molecular alignment state is not disrupted when the liquid components in the GO gel are subsequently removed to form a well-packed GO mass that is at least partially dried. The dried GO mass has a high birefringence coefficient between an in-plane direction and the normal-to-plane direction. Another example of such a procedure is injecting or die-casting a GO mass into a mold cavity or shaping die/tooling under the influence of a shearing and/or compressive stress. The liquid component of the sheared/compressed GO mass in a mold cavity is then partially or completely removed to obtain a partially or totally dried GO mass containing well-packed and well-aligned live GO molecules.

This dried GO mass is then subjected to a properly programmed heat treatment that can be divided into four distinct heat treatment temperature (HTT) regimes:

Regime 1 (100° C.-500° C.): In this temperature range (the thermal reduction regime), the GO mass primarily undergoes thermally-induced reduction reactions, leading to a reduction of oxygen content from typically 30-50% (as dried) to 5-6%. This treatment results in a reduction of inter-graphene spacing from approximately 0.6-1.0 nm (as dried) to approximately 0.4 nm and an increase in in-plane thermal conductivity from approximately 100 W/mK to 450 W/mK. Even with such a low temperature range, some chemical linking occurs. The GO molecules remain well-aligned, but the inter-GO spacing remains relative large (0.4 nm or larger). Many O-containing functional groups survive.

Regime 2 (500° C.-1,250° C.): In this chemical linking regime, extensive chemical combination, polymerization, and cross-linking between adjacent GO molecules occur. The oxygen content is reduced to typically 0.7% (<<1%), resulting in a reduction of inter-graphene spacing to approximately 0.345 nm. This implies that some initial graphitization has already begun at such a low temperature, in stark contrast to conventional graphitizable materials (such as carbonized polyimide film) that typically require a temperature as high as 2,500° C. to initiate graphitization. This is another distinct feature of the presently invented unitary graphene material and its production processes. These chemical linking reactions result in an increase in in-plane thermal conductivity of a unitary graphene thin film to 1,400-1,500 W/mK, and/or in-plane electrical conductivity to 3,000-4,000 S/cm.

Regime 3 (1,250° C.-2,000° C.): In this ordering and re-graphitization regime, extensive graphitization or graphene plane merging occurs, leading to significantly improved degree of structural ordering. As a result, the oxygen content is reduced to typically 0.01% and the inter-graphene spacing to approximately 0.337 nm (achieving degree of graphitization from 1% to approximately 80%, depending upon the actual HTT and length of time). The improved degree of ordering is also reflected by an increase in in-plane thermal conductivity to >1,680 W/mK, and/or in-plane electrical conductivity to 5,000-7,000 S/cm.

Regime 4 (2,000° C.-3,000° C. or higher): In this recrystallization and perfection regime, extensive movement and elimination of grain boundaries and other defects occur, resulting in the formation of perfect or nearly perfect single crystals, or poly-crystalline graphene crystals with incomplete grain boundaries or huge grains (these grains can be orders of magnitude larger than the original grain sizes of the starting graphite particles for GO gel production. The oxygen content is essentially eliminated, typically 0%-0.001%. The inter-graphene spacing is reduced to down to approximately 0.3354 nm (degree of graphitization from 80% to nearly 100%), corresponding to that of a perfect graphite single crystal. Quite interestingly, the graphene single crystal or poly-crystal has all the graphene planes being closely packed and bonded and all aligned along one direction, a perfect orientation. Such a perfectly oriented structure has not been produced even with the HOPG being subjected concurrently to an ultra-high temperature (3,400° C.) under an ultra-high pressure (300 Kg/cm$^2$). The unitary graphene entity car achieve such a highest degree of perfection with a significantly lower temperature and an ambient (or slightly higher compression) pressure. The unitary graphene material thus obtained exhibits an in-plane thermal conductivity up to slightly >1,800 W/mK, and in-plane electrical conductivity to 15,000-25,000 S/cm.

The presently invented unitary graphene material can be obtained by heat-treating the dried GO mass with a temperature program that covers at least the first regime (typically requiring 1-4 hours in this temperature range if the temperature never exceeds 500° C.), more commonly covers the first two regimes (1-2 hours preferred), still more commonly the first three regimes (preferably 0.5-2.0 hours in Regime 3), and most commonly all the 4 regimes (Regime 4, for 0.2 to 1 hour, may be implemented to achieve the highest conductivity).

X-ray diffraction patterns were obtained with an X-ray diffractometer by the use of CuKcv radiation. The peak shift and broadening due to the diffractometer were calibrated using a silicon powder standard. The degree of graphitization, g, was calculated from the X-ray pattern using Mering's Eq, $d_{002}=0.3354 g+0.344 (1-g)$, where $d_{002}$ is the interlayer spacing of graphite or graphene crystal in nm. This equation is valid only when $d_{002}$ is equal or less than approximately 0.3440 nm. The unitary graphene material or lightly oxidized graphite crystalline material having a $d_{002}$ higher than 0.3440 nm reflects the presence of oxygen-containing functional groups (such as —OH, >O, and —COOH on graphene molecular plane surfaces) that act as a spacer to increase the inter-graphene spacing.

Another structural index that can be used to characterize the degree of ordering of the presently invented unitary graphene material or related graphite crystals is the "mosaic spread," which is expressed by the full width at half maximum of a rocking curve (X-ray diffraction intensity) of the (002) or (004) reflection. This degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our unitary graphene materials have a mosaic spread value in this range of 0.2-0.4 (with a heat treatment temperature no less than 2,000° C.). However, some values are in the range of 0.4-0.7 if the highest heat treatment temperature (TTT) is between 1,250 and 2,000° C., and in the range of 0.7-1.0 if the TTT is between 500 and 1,250° C.

The present invention provides a heat transfer member, such as a finned heat sink, formed of a unitary graphene matrix composite. The finned heat sink has a base and a plurality of fins integral to the base. In one preferred embodiment, the unitary graphene matrix composite is composed of: (a) a unitary graphene matrix containing closely packed and chemically bonded graphene planes (preferably having an inter-graphene plane spacing of 0.3354 to 0.40 nm and, optionally, an oxygen content of 0.001% to 10% by weight), which unitary graphene matrix is obtained from heat-treating a graphene oxide gel at a temperature higher than 100° C.; and (b) A filler or reinforcement phase (e.g. particles or filaments of carbon, graphite, metal, glass, ceramic, and/or polymer).

Preferably, the reinforcement phase contains a carbon or graphite filler phase selected from a carbon or graphite fiber, carbon or graphite nano-fiber, carbon nano-tube, carbon nano-rod, meso-phase carbon particle, meso-carbon micro-bead, exfoliated graphite flake with a thickness greater than 100 nm, exfoliated graphite or graphite worm, coke particle, needle coke, carbon black or acetylene black particle, activated carbon particle, or a combination thereof. The reinforcement phase occupies a weight fraction of 0.01% to 99% (preferably 10% to 70%) based on the total composite weight. The carbon or graphite filler phase is preferably in a particulate, filamentary, or rod-like form dispersed in the unitary graphene matrix. These discrete particles, filaments, and cylindrical shape fillers are the dispersed phase (reinforcement or filler phase) and the GO-derived unitary graphene material is the continuous phase (matrix). Preferably and typically, most of the chemically bonded graphene planes in the unitary graphene matrix are parallel to one another. Typically, the carbon or graphite filler is chemically bonded by the unitary graphene matrix material. This chemical bonding is more pronounced if the carbon/graphite filler is chemically treated (e.g. using a mixture of sulfuric acid and nitric acid) prior to being mixed with the GO gel.

The heat treatment temperature conditions for GO are such that the unitary graphene matrix composite is relatively pore-free having a physical density of at least 1.5 g/cm$^3$ or a porosity level lower than 20%. Under more typical processing conditions, the unitary graphene matrix composite has a physical density of at least 1.7 g/cm$^3$ or a porosity level lower than 10%. In most cases, the unitary graphene matrix composite has a physical density greater than 1.8 g/cm$^3$ or a porosity level less than 5%. The chemically bonded graphene planes in the unitary graphene composite typically contain a combination of sp$^2$ and sp$^3$ electronic configurations (particularly for those unitary graphene materials prepared with the highest treatment temperature lower than 2,000° C.

In a preferred embodiment of the present invention, the process for producing the unitary graphene matrix composite comprises: (a) preparing a graphene oxide gel having graphene oxide molecules dispersed in a fluid medium, wherein the graphene oxide gel is optically transparent or translucent; (b) mixing the carbon or graphite filler phase in the graphene oxide gel to form a slurry; (c) dispensing the slurry into a cavity of a molding tool; (d) partially or completely removing the fluid medium from the slurry to form a composite precursor; and (e) heat-treating the composite precursor to form the unitary graphene composite at a temperature higher than 100° C. (preferably >500° C., more preferably >1,250° C., or even >2,000° C.). Although not required, higher temperatures may be used if so desired.

In this process, steps (c) and (d) preferably include feeding a sheet of a solid substrate material from a roller to a deposition zone, dispensing the slurry or suspension onto a surface of the sheet of solid substrate material to form a slurry layer thereon, shearing/compressing and drying the slurry or suspension to form a dried composite precursor layer deposited on the substrate surface, and collecting composite precursor-deposited substrate sheet on a collector roller. The process may further comprise a step of further compressing the composite precursor prior to being collected on the collector roller. This makes a roll-to-roll process amenable to mass production of graphene matrix composites.

Alternatively, the process may comprise: (a) preparing a graphene oxide gel having graphene oxide molecules dispersed in a fluid medium, wherein the graphene oxide gel is optically transparent or translucent; (b) forming the carbon or graphite filler phase into a desired porous shape (e.g. finned heat sink-like shape) having pores therein, and impregnating the graphene oxide gel into these pores of the desired porous shape to form an impregnated shape; (c) partially or completely removing the fluid medium from the impregnated shape to form a composite precursor; and (d) heat-treating the composite precursor to form the unitary graphene composite at a temperature higher than 100° C. Again, the re-graphitization temperature is preferably >500° C. and more preferably >1,250° C. Although not required, higher heat treatment temperatures may be used if so desired. The desired porous shape may be a porous woven fabric, porous non-woven fabric, porous mat, or porous paper.

In yet another preferred embodiment, the process for producing the unitary graphene matrix composite comprises: (a) preparing a graphene oxide gel having graphene oxide molecules dispersed in a fluid medium, wherein the graphene oxide gel is optically transparent or translucent; (b) combining the carbon or graphite filler phase and the graphene oxide gel to form a graphene oxide gel-impregnated shape of fiber yarns or bundles (e.g. in a finned heat sink shape); (c) partially or completely removing the fluid medium from graphene oxide gel-impregnated shape to form a composite precursor; and (d) heat-treating the composite precursor to form the unitary graphene composite at a temperature higher than 100° C. The graphene oxide gel-impregnated shape may be selected from a unidirectional, bi-directional, multi-directional, angle-plied, woven, or filament-wound shape. In other words, the processes for producing conventional resin matrix composites, such as filament winding, pultrusion, yarn weaving, and pre-impregnating, may be adapted to fabricate the graphene matrix composite.

This is quite surprising for several reasons: (1) The GO gel and conventional polymer melts or polymer-solvent solutions appear to exhibit very different and distinct rheological behaviors; (2) It is well-known in the field of polymer science that highly aromatic chains are typically not soluble, melt-able, or flowable to enable solution or melt processing and GO molecules are highly aromatic; (3) Much to the surprise of polymer scientists, heavy oxidation can chemically convert discrete solid graphite flakes to soluble GO molecules that are highly active and these aromatic molecules can be chemically linked together to form huge 2D giant molecules or 3D network of "cross-linked" graphene chains that provide cohesiveness and adhesiveness required of a resin matrix composite having a good resin-filler interfacial bonding.

The graphene oxide gel may be prepared by immersing a graphitic material in a powder or fibrous form in an oxidizing liquid to form an initially optically opaque suspension in a reaction vessel at a reaction temperature for a length of time sufficient to obtain a graphene oxide gel that is optically transparent or translucent. The graphene oxide gel is composed of graphene oxide molecules dispersed in an acidic medium having a typical pH value of no higher than 5 and the graphene oxide molecules have an oxygen content typically no less than 20% by weight when the system is in a gel state.

Specifically, a graphitic material may be immersed in an oxidizing agent to form an optically opaque suspension. It is initially opaque because the starting graphitic material is in a carbon or graphite particulate form having a particle size or chemical nature that scatters visible wavelength or absorbs light. Useful starting materials include natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. As the oxidizing reaction proceeds to a critical extent, an optically transparent or translucent solution is formed.

All the aforementioned processes may further comprise a step of compressing the composite precursor prior to or during heat treating. Preferably, the processing conditions involve a shear stress field that promotes alignment and/or packing of GO molecules.

The graphene oxide (GO) gel-derived unitary graphene material and the unitary graphene matrix composite have the following characteristics (separately or in combination):

(1) The unitary graphene matrix material, alone or with a filler phase, is an integrated graphene phase that is either a graphene single crystal or a poly-crystal having multiple grains with incomplete grain boundaries. When made into a thin film (e.g. <200 μm) or formed under a desired shearing stress field condition, both the unitary graphene matrix alone or the corresponding graphene matrix composite have wide/long chemically bonded graphene planes that are essentially oriented parallel to one another. In other words, the crystallographic c-axis directions of all grains and all their constituent graphene planes are essentially pointing in the same direction. It may be noted that the grains in a graphene poly-crystal have very poorly delineated or incomplete grain boundaries. These grains are essentially a single grain with some residual demarcation lines (e.g., FIG. 3(f)). Such type of graphene poly-crystal is best described as a graphene single crystal with some aligned but sporadic defects. These defects can be eliminated to form a practically perfect single crystal if the unitary graphene structure is allowed to undergo re-crystallization at a temperature higher than approximately 2,500° C. for a sufficient length of time. This conclusion was drawn after an extensive investigation using a combination of SEM, TEM, selected area diffraction (with a TEM), X-ray diffraction, atomic force microscopy (AFM), Raman spectroscopy, and FTIR.

(2) The paper-like sheets of exfoliated graphite worms (i.e., flexible graphite foils), mats of expanded graphite flakes (100 nm in thickness), and paper or membrane of graphene or GO platelets are a simple, un-bonded aggregate/stack of multiple discrete graphite flakes or discrete platelets of graphene, GO, or RGO. In contrast, the unitary graphene matrix of the present invention is a fully integrated, single graphene entity or monolith containing no discrete flakes or platelets derived from the GO gel.

(3) In prior art processes, discrete graphene sheets (<<100 nm) or expanded graphite flakes (>100 nm) that constitute the original structure of graphite particles could be obtained via expanding, exfoliating, and separating treatments. By simply mixing and re-compressing these discrete sheets/flakes into a thin film, one could attempt to orient these sheets/flakes hopefully along one direction. However, with these conventional processes, the constituent flakes or sheets of the resulting film (aggregate, paper, membrane, or mat) would remain as discrete flakes/sheets/platelets that can be easily discerned or clearly observed even with an un-assisted eye or under a low-magnification optical microscope ($\times 100$-$\times 1000$).

In contrast, the preparation of the presently invented unitary graphene structure involves heavily oxidizing the original graphite particles, to the extent that practically every one of the original graphene planes has been oxidized and isolated from one another to become individual molecules that possess highly reactive functional groups (e.g. —OH, >O, and —COOH) at the edge and, mostly, on graphene planes as well. These individual hydrocarbon molecules (containing elements such as O and H, in addition to carbon atoms) are dissolved in the reaction medium (e.g. mixture of water and acids) to form a gel-like mass, herein referred to as the GO gel. This gel is then cast onto a smooth substrate surface or injected into a mold cavity, typically under shear stress field conditions, and the liquid components are then removed to form a dried GO layer. When heated, these highly reactive molecules react and chemically join with one another mostly in lateral directions along graphene planes (in an edge-to-edge manner) and, in some cases, between graphene planes as well.

Illustrated in FIG. 3($g$) is a plausible chemical linking mechanism where only 2 aligned GO molecules are shown as an example, although a large number of GO molecules can be chemically linked together to form a unitary graphene layer. Further, chemical linking could also occur face-to-face, not just edge-to-edge. These linking and merging reactions proceed in such a manner that the molecules are chemically merged, linked, and integrated into one single entity or monolith. The molecules completely lose their own original identity and they no longer are discrete sheets/platelets/flakes. There is only one single layer-like structure (unitary graphene entity) that is one huge molecule or just a network of interconnected giant molecules with an essentially infinite molecular weight. This may also be described as a graphene single crystal (with only one grain in the entire structure or entity, or a poly-crystal (with several grains, but typically no discernible, well-defined grain boundaries). All the constituent graphene planes are very large in lateral dimensions (length and width) and, if produced under shear stress conditions (particularly into thin films, <200 μm in thickness) and heat-treated at a higher temperature (e.g. >1,250° C. or much higher), these graphene planes are essentially parallel to one another.

In-depth studies using a combination of SEM, TEM, selected area diffraction, X-ray diffraction, AFM, Raman spectroscopy, and FTIR indicate that the graphene monolith is composed of several huge graphene planes (with length/width typically >>100 μm, more typically >>1 mm, and most typically >>1 cm). These giant graphene planes are stacked and bonded along the thickness direction (crystallographic c-axis direction) often through not just the van der Waals forces (as in conventional graphite crystallites), but also covalent bonds, Not to be limited by theory, but Raman and FTIR spectroscopy studies appear to indicate the co-existence of $sp^2$ (dominating) and $sp^3$ (weak but existing) electronic configurations, not just the conventional $sp^2$ in graphite.

(4) This integrated graphene entity is not made by gluing or bonding discrete flakes/platelets together with a resin binder, linker, or adhesive. Instead, GO molecules in the GO gel are merged through joining or forming of covalent bonds with one another, into an integrated graphene entity, without using any externally added linker or binder molecules or polymers.

(5) This unitary or monolithic graphene entity is a single crystal (e.g. FIG. 3($e$)) or poly-crystal (having incomplete grain boundaries, FIG. 3($f$)), typically with the crystallographic c-axis in all grains being essentially parallel to each other. This entity is derived from a GO gel, which is in turn obtained from natural graphite or artificial graphite particles originally having multiple graphite crystallites. Prior to being chemically oxidized, these starting graphite crystallites have an initial length ($L_a$ in the crystallographic a-axis direction), initial width ($L_b$ in the b-axis direction), and thickness ($L_c$ in the c-axis direction). Upon heavy oxidation, these initially discrete graphite particles are chemically transformed into highly aromatic graphene oxide molecules having a significant concentration of edge- or surface-borne functional groups (e.g. —OH, —COOH, etc.). These aromatic GO molecules in the GO gel have lost their original identity of being part of a graphite particle or flake. Upon removal of the liquid component from the GO gel, the resulting GO molecules form an essentially amorphous structure. Upon heat treatment (re-graphitization treatment), these GO molecules are chemically merged and linked into a unitary or monolithic graphene entity that is highly ordered (essentially a single crystal when the temperature is sufficiently high).

The resulting unitary graphene entity typically has a length or width significantly greater than the $L_a$ and $L_b$ of the original crystallites. The length/width of this unitary graphene entity or that of a graphene single crystal is typically greater than the $L_a$ and $L_b$ of the original crystallites. Even the individual grains in a poly-crystalline unitary graphene entity have a length or width significantly greater than the $L_a$ and $L_b$ of the original crystallites. They can be as large as the length or width of the unitary graphene entity itself, not just 2 or 3 times higher than the initial $L_a$ and $L_b$ of the original crystallites.

(6) Due to these unique chemical composition (including oxygen content), morphology, crystal structure (including inter-graphene spacing), and structural features (e.g. defects, incomplete or lack of grain boundaries, chemical bonding and no gap between graphene sheets, and no interruptions in graphene planes), the graphene oxide gel-derived unitary or monolithic graphene layer has a unique combination of outstanding thermal conductivity, electrical conductivity, mechanical strength, and scratch resistance (including elimination of the tendency for surface graphite flakes or particles to "flake off" since there is essentially no GO gel-derived discrete flake or platelet in this graphene monolith structure). Even in a unitary graphene matrix composite containing expanded graphite flakes, these flakes are essentially embraced and bonded with an integrated graphene film, allowing no exposed flakes.

(7) Due to the high temperature stability of the unitary graphene material, the surface of such a material can be readily deposited with a layer of the desired inorganic material that is electrically non-conducting. One can use practically any conventional ceramic or glass-making process to deposit this layer of inorganic material. Examples of suitable processes are physical vapor deposition, chemical vapor deposition (CVD), plasma-enhanced CVD, casting followed by heat treating, or simply attaching a piece of ceramic film onto the unitary graphene material layer (e.g. using a high temperature adhesive). The protective inorganic coating may be selected from a ceramic material; diamond; a semiconductor element or compound selected from Si, Ge, Ga, gallium nitride, gallium phosphide, gallium arsenide, aluminum nitride, aluminum phosphide, aluminum arsenide, boron nitride, boron phosphide, boron arsenide; or a combination thereof.

Figure 1C:
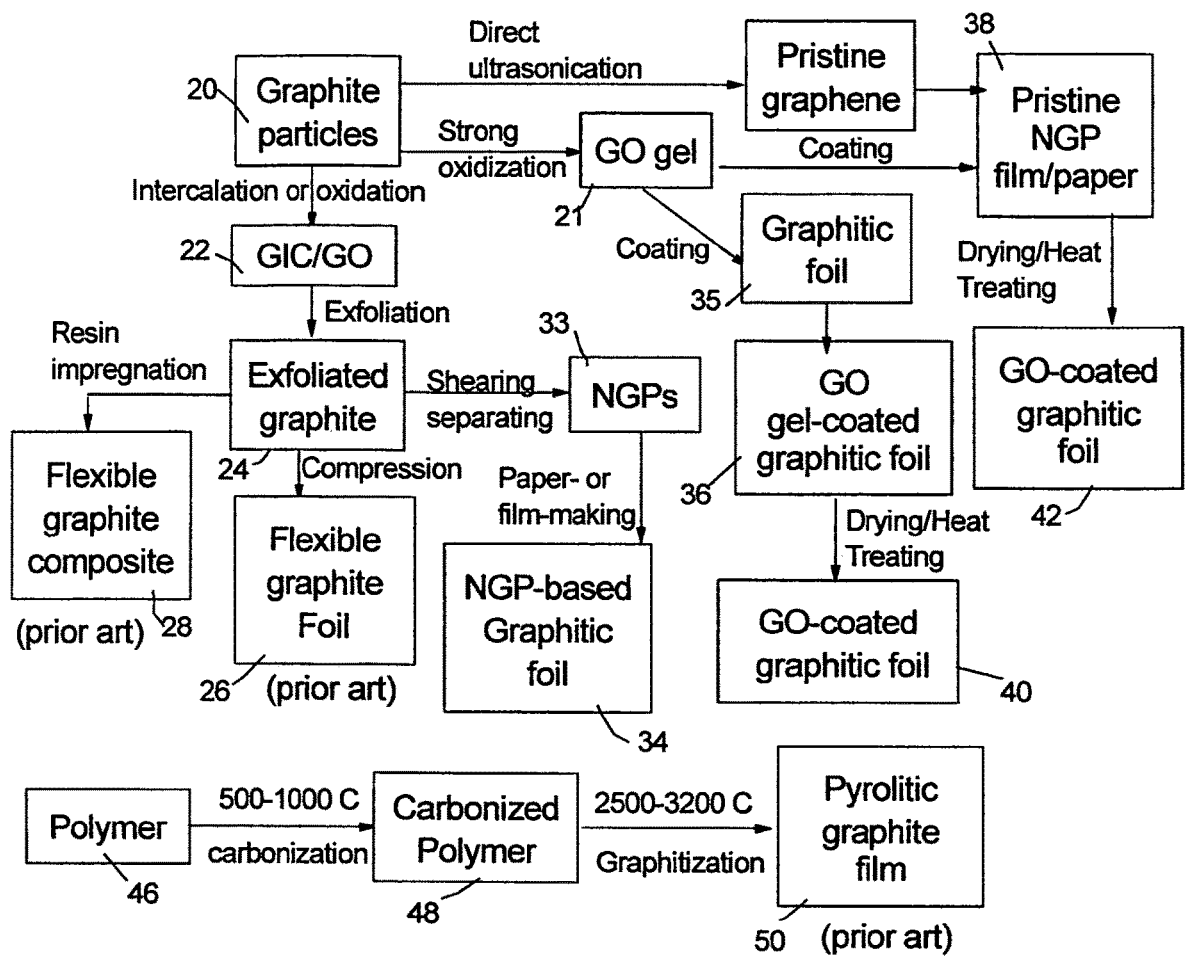
Figure 1D:
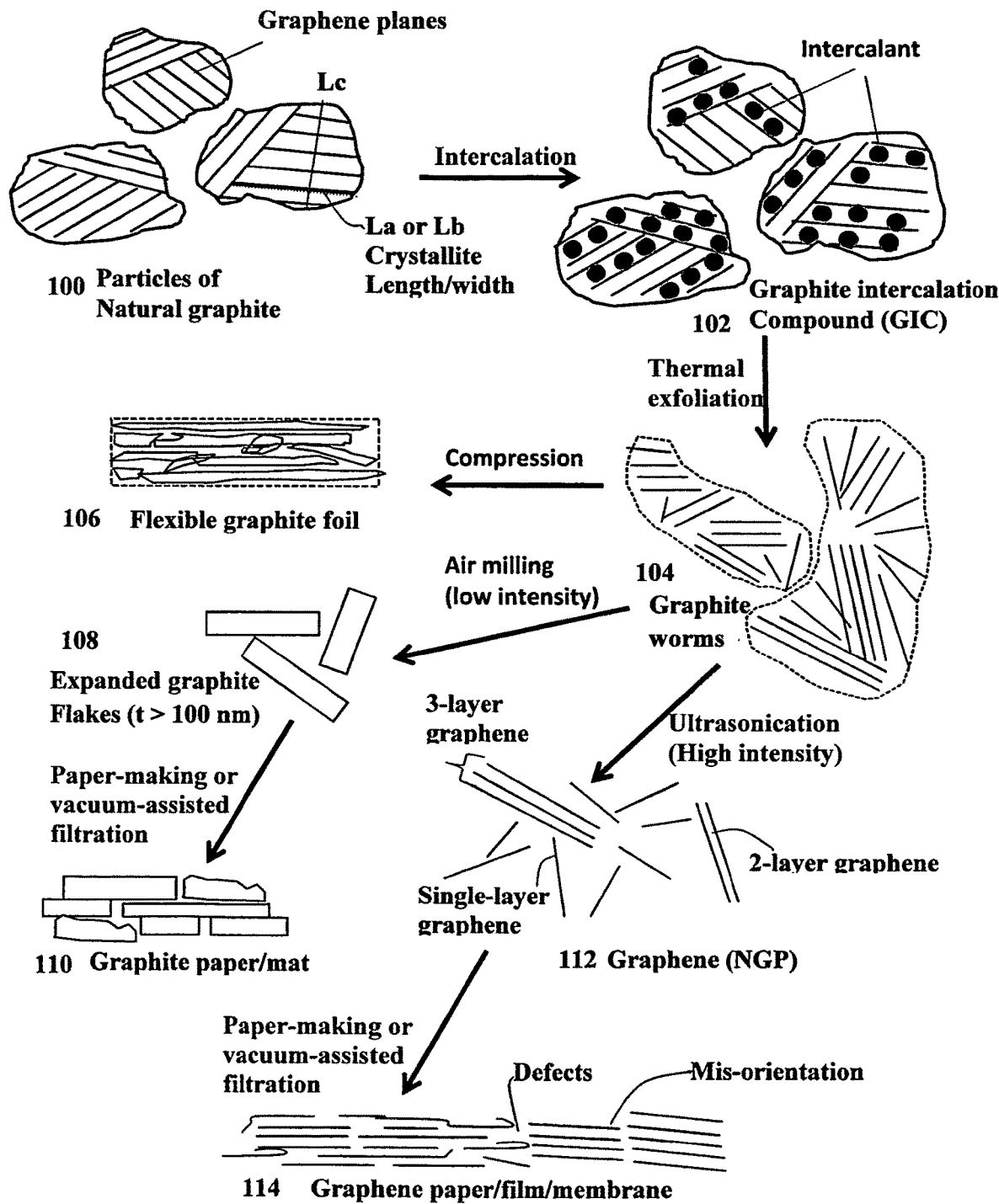

The aforementioned features are further described and explained in detail as follows:

As illustrated in FIG. 1(d), a graphite particle (e.g. 100) is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of hexagonal-structured carbon atoms, commonly referred to as graphene layers or basal planes, are weakly bonded together in their thickness direction (crystallographic c-axis direction) by weak van der Waals forces and groups of these graphene layers are arranged in crystallites. The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness $L_c$ along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 1(d), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known and the typical practice is described in U.S. Pat. No. 3,404,061 to Shane et al., the disclosure of which is incorporated herein by reference. In general, flakes of natural graphite (e.g. 100 in FIG. 1(d)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-2.0 g/cm$^3$ for most applications.

The upper left portion of FIG. 1(c) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but unseparated graphite flakes with large pores interposed between these interconnected flakes. An example of graphite worms is presented in FIG. 2(a).

In one prior art process, the exfoliated graphite (or mass of graphite worms) is re-compressed by using a calendering or roll-pressing technique to obtain flexible graphite foils (26 in FIG. 1(c) or 106 in FIG. 1(d)), which are typically much thicker than 100 μm. An SEM image of a cross-section of a flexible graphite foil is presented in FIG. 2(b), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude.

Alternatively, the exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene (also illustrated as 112 in FIG. 1(*d*). An NGP is composed of a graphene sheet or a plurality of graphene sheets with each sheet being a two-dimensional, hexagonal structure of carbon atoms.

Further alternatively, with a low-intensity shearing, graphite worms tend to be separated into the so-called expanded graphite flakes (108 in FIG. 1(*d*) having a thickness >100 nm. These flakes can be formed into graphite paper or mat 110 using a paper- or mat-making process. This expanded graphite paper or mat 110 is just a simple aggregate or stack of discrete flakes having defects, interruptions, and mis-orientations between these discrete flakes.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 μm, but can be larger than 200 μm.

A mass of multiple NGPs (including discrete sheets/platelets of single-layer and/or few-layer graphene, 33 in FIG. 1(*c*)) may be made into a graphene film/paper (34 in FIG. 1(*c*) or 114 in FIG. 1(*d*)) using a film- or paper-making process. FIG. 3(*b*) shows a SEM image of a cross-section of a graphene paper/film prepared from discrete graphene sheets using a paper-making process. The image shows the presence of many discrete graphene sheets being folded or interrupted (not integrated), most of platelet orientations being not parallel to the film/paper surface, the existence of many defects or imperfections. NGP aggregates, even when being closely packed, exhibit a thermal conductivity higher than 1,000 W/mK only when the film or paper is cast and strongly pressed into a sheet having a thickness lower than 10 μm. A heat spreader in many electronic devices or a fin member in a heat sink is normally required to be thicker than 25 μm and, more desirably, thicker than 50 μm based mainly on handling ease and structural integrity considerations (but no greater than 200 μm due to device volume constraint).

The precursor to the unitary graphene layer is graphene oxide gel. This GO gel is obtained by immersing a graphitic material 20 in a powder or fibrous form in a strong oxidizing liquid in a reaction vessel to form a suspension or slurry, which initially is optically opaque. This optical opacity reflects the fact that, at the outset of the oxidizing reaction, the discrete graphite flakes and, at a later stage, the discrete graphene oxide flakes scatter and/or absorb visible wavelengths, resulting in an opaque and generally dark fluid mass. If the reaction between graphite powder and the oxidizing agent is allowed to proceed at a sufficiently high reaction temperature for a sufficient length of time, this opaque suspension is transformed into a translucent or transparent solution, which is now a homogeneous fluid called "graphene oxide gel" (21 in FIG. 1(*c*)) that contains no discernible discrete graphite flakes or graphite oxide platelets.

Again, this graphene oxide gel is optically transparent or translucent and visually homogeneous with no discernible discrete flakes/platelets of graphite, graphene, or graphene oxide dispersed therein. In contrast, conventional suspension of discrete graphene sheets, graphene oxide sheets, and expanded graphite flakes in a fluid (e.g. water, organic acid or solvent) look dark, black or heavy brown in color with individual graphene or graphene oxide sheets or expanded graphite flakes discernible or recognizable even with naked eyes or a low-magnification light microscope (100×-1,000×).

The graphene oxide molecules dissolved in the liquid medium of a graphene oxide gel are aromatic chains that have an average number of benzene rings in the chain typically less than 1,000, more typically less than 500, and many less than 100. Most of the molecules have more than 5 or 6 benzene rings (mostly >10 benzene rings) from combined atomic force microscopy, high-resolution TEM, and molecular weight measurements. Based on our elemental analysis, these benzene-ring type of aromatic molecules are heavily oxidized, containing a high concentration of functional groups, such as —COOH and —OH and, therefore, are "soluble" (not just dispersible) in polar solvents, such as water. The estimated molecular weight of these graphene oxide polymers in the gel state is typically between 200 g/mole and 43,000 g/mole, more typically between 400 g/mole and 21,500 g/mole, and most typically between 400 g/mole and 4,000 g/mole.

These soluble molecules behave like polymers and are surprisingly capable of reacting and getting chemically connected with one another (during the subsequent heat treatment or re-graphitization treatment) to form a unitary graphene layer of good structural integrity and high thermal conductivity. Conventional discrete graphene sheets, graphene oxide sheets, or graphite flakes do not have any self-reacting or cohesive bonding capability. Also very surprisingly, during the subsequent heat treatment or re-graphitization treatment, these soluble molecules in the GO gel are capable of chemically bonding a carbon or graphite filler phase (e.g. carbon fibers, expanded graphite flakes, CNTs, carbon black particles, etc.) dispersed in the GO gel.

Again, specifically and most significantly, these graphene oxide molecules present in a GO gel state are capable of chemically merging with one another and getting integrated into extremely long and wide graphene layers (e.g. FIG. 3(*a*)) when the gel is dried and heat-treated at a sufficiently high temperature for a sufficiently long period of time. These graphene layers can run as wide as the specimen width itself (up to hundreds of centimeters) that are parallel to one another. No individual graphene platelets or sheets are discernible; they have been chemically converted to chemically active or live GO molecules that are fully linked and integrated chemically with one another to form a layer-like unitary body in the graphene plane direction and these unitary bodies appear to be chemically bonded with one another along the thickness-direction (or Z-direction). X-ray diffraction studies have confirmed that the d-spacing (inter-graphene plane distance) has been recovered back to approximately 0.3354 nm (with 0%-0.001% by weight of oxygen) to 0.40 nm (with approximately 5.0-10% oxygen). There does not appear to be any gap between these graphene layers and, hence, these layers have been essentially merged into one big unitary body, which is a graphene single crystal. FIG. 3(*a*) depicts an example of such a huge unitary body. Although there appears to be some demarcations between unitary layers, these perceived demarcations are due to slightly different widths between layers. Each layer is composed of one of multiple graphene planes parallel to one another. These seemingly individual unitary layers actually have formed into a single integrated entity or a graphene single crystal. The formation process for such a graphene single crystal is further illustrated in FIG. 3(c).

Figure 3A:
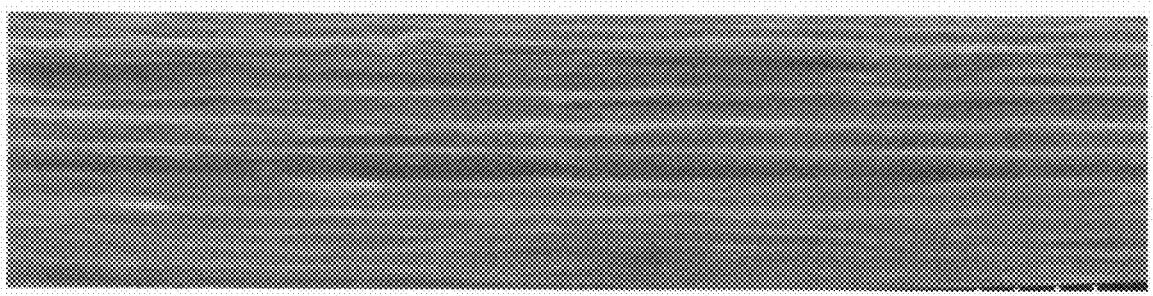
FIG. 3 (a) A SEM image of a GO-derived graphene monolithic wherein multiple graphene sheets, originally 30 nm-2 µm in lateral dimension, have been oxidized, exfoliated, re-oriented, and seamlessly merged into continuous-length graphene sheets or layers that can run for hundreds of centimeters wide or long (only a 120 µm or 0.12 mm width of a 25-cm wide unitary graphene layer being shown in this SEM image); (b) A SEM image of a cross-section of a graphene paper/film prepared from discrete graphene sheets/platelets using a paper-making process (e.g. vacuum-assisted filtration). The image shows many discrete graphene sheets being folded or interrupted (not integrated), with orientations not parallel to the film/paper surface and having many defects or imperfections; (c) Schematic drawing and an attendant SEM image to illustrate the formation process of a unitary graphene entity or graphene single crystal that is composed of multiple graphene planes that are parallel to one another and are chemically bonded in the thickness-direction or crystallographic c-axis direction; (d) Schematic of the prior art graphene poly-crystal obtained by CVD of hydrocarbon on a catalytic surface (e.g. Cu or Ni); (e) Schematic of a graphene single crystal of the present invention; (f) Schematic of another graphene single crystal of the present invention (a "poly-crystal" with incomplete grain boundaries); (g) One plausible chemical linking mechanism (only 2 GO molecules are shown as an example; a large number of GO molecules can be chemically linked together to form a unitary graphene layer).
Figure 3B:
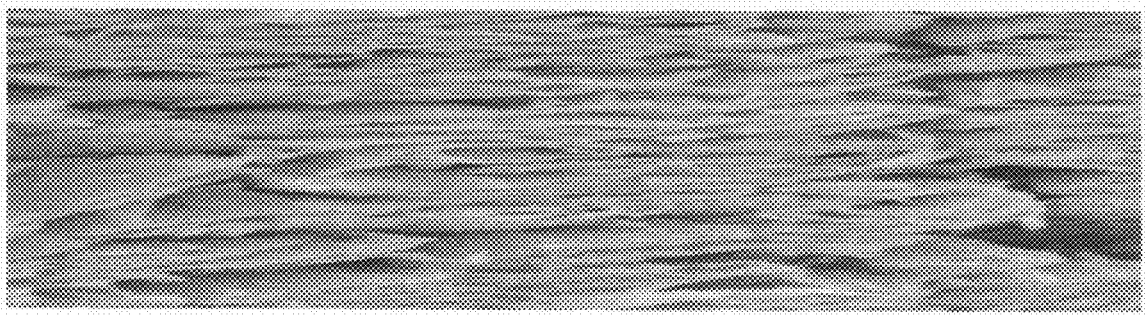
Figure 3C:
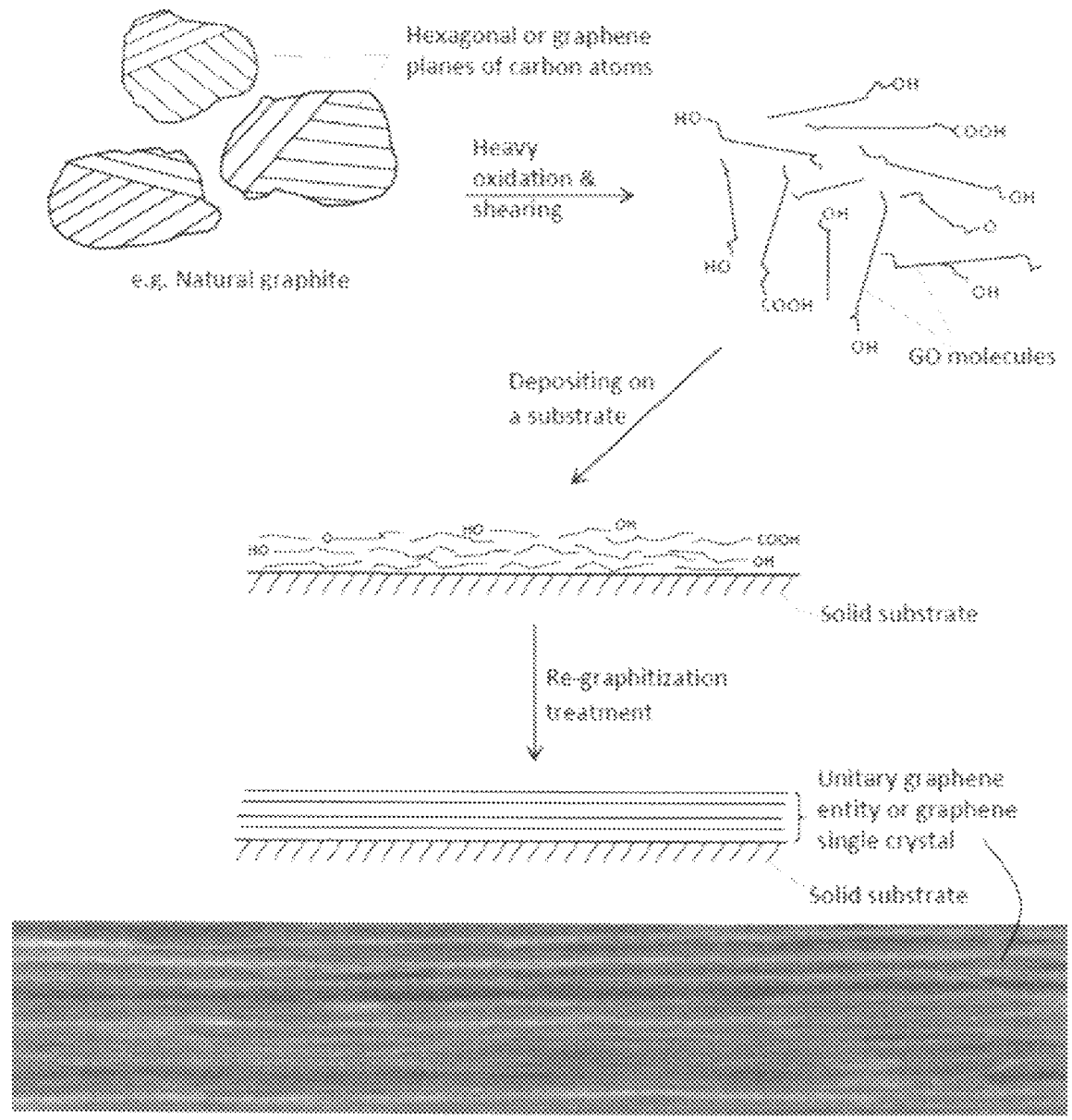
Figure 3D:
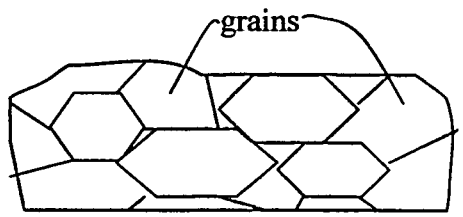

It may be noted that the presently invented graphene single crystal is fundamentally different and patently distinct from the catalytic CVD graphene thin film in terms of chemical composition, micro-structure, morphology, process of production, all chemical and physical properties, and intended applications. This is explained as follows:

(a) As schematically shown in FIG. 3(d), the prior art graphene poly-crystal obtained by CVD of hydrocarbon on a catalytic surface (e.g. Cu or Ni) is typically composed of many grains with grain size typically smaller than 10 μm (most often <5 μm). These grains also have different orientations with respect to one another.

Figure 3E:
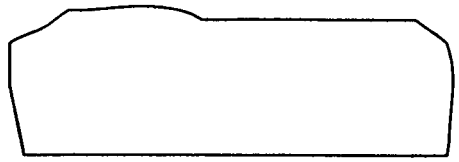

(b) In contrast, FIG. 3(e) shows a schematic of a graphene single crystal of the present invention having just one single grain or domain. There are no grain boundaries that can impede the movement of electrons or phonons and, hence, this single-grain single crystal has an exceptionally high electrical conductivity and thermal conductivity.

Figure 3F:
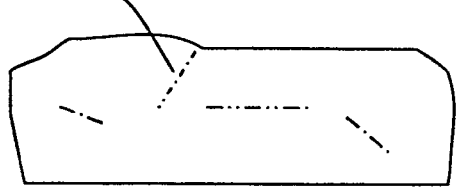
Figure 3G:
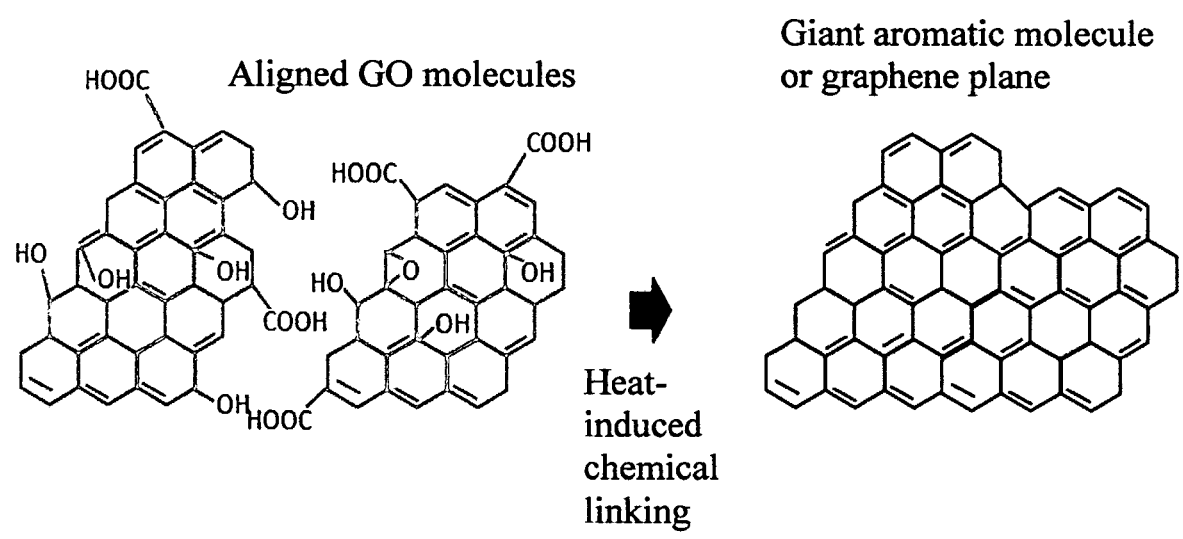

(c) FIG. 3(f) shows a schematic of another unitary graphene material of the present invention, which is a "poly-crystal" with incomplete grain boundaries. The graphene planes in all the grains are oriented parallel to one another.

(d) The presently invented graphene single crystal from GO gel can have some oxygen content, but no hydrogen (H). In contrast, the catalytic CVD graphene film has some hydrogen content, but no oxygen.

(e) Typically, the CVD graphene film grown on Cu or Ni surface is single layer or inhomogeneous few-layer graphene with a thickness less than 2 nm or 5 layers (the underlying Cu or Ni foil is not capable of providing catalytic effect when the deposited carbon layer exceeds 2 nm). These ultra-thin layers are thus optically transparent and are intended for touch panel screen applications to replace the ITO glass. In contrast, our graphene monolith is typically thicker than 10 nm (more typically thicker than 1 μm, and most typically thicker than 10 μm) and, hence, typically is optically opaque. The graphene monolith of the present invention has a significantly higher thermal conductivity and can be more easily handled when being implemented into an electronic device (e.g. a mobile phone) as a heat spreader, or made into a finned heat sink for a CPV module.

It may be noted that the group of few-layer graphene (1-10 graphene planes) and thicker graphene (>10 layers or 3.4 nm) are known in the scientific community to be distinct classes of materials. This is not just a matter of varying the material thickness to achieve the optimized properties. They are fundamentally different materials.

Experimentally, we have observed that heat treatments of the CVD graphene films (under identical heat treatment conditions as those for the GO gel) simply led to the formation of multiple small graphite particles as opposed to one single material entity of the presently invented unitary graphene material.

(f) The electrical conductivity (<1,000 S/cm) and thermal conductivity (<500 W/mK) of the CVD graphene films are typically significantly lower than those of the presently invented graphene single crystals.

The starting graphitic material to be heavily oxidized for the purpose of forming graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The graphitic material is preferably in a powder or short filament form having a dimension lower than 20 μm, more preferably lower than 10 μm, further preferably smaller than 5 μm, and most preferably smaller than 1 μm.

Using artificial graphite with an average particle size of 9.7 μm as an example, a typical procedure involves dispersing graphite particles in an oxidizer mixture of sulfuric acid, nitric acid, and potassium permanganate (at a weight ratio of 3:1:0.05) at a temperature of typically 0-60° C. for typically at least 3 days, preferably 5 days, and more preferably 7 days or longer. The average molecular weight of the resulting graphene oxide molecules in a gel is approximately 20,000-40,000 g/mole if the treatment time is 3 days, <10,000 g/mole if 5 days, and <4,000 g/mole if longer than 7 days. The required gel formation time is dependent upon the particle size of the original graphitic material, a smaller size requiring a shorter time. It is of fundamental significance to note that if the critical gel formation time is not reached, the suspension of graphite powder and oxidizer (graphite particles dispersed in the oxidizer liquid) appears completely opaque, meaning that discrete graphite particles or flakes remain suspended (but not dissolved) in the liquid medium. As soon as this critical time is exceeded, the whole suspension becomes optically translucent or transparent, meaning that the heavily oxidized graphite completely loses its original graphite identity and the resulting graphene oxide molecules are completely dissolved in the oxidizer liquid, forming a homogeneous solution (no longer just a suspension or slurry).

It must be further noted that if the suspension or slurry, with a treatment time being shorter than the required gel formation time, is rinsed and dried, we would simply recover a graphite oxide powder or graphite intercalation compound (GIC) powder, which can be exfoliated and separated to produce discrete nano graphene platelets (NGPs). Without an adequate amount of a strong oxidizing agent and an adequate duration of oxidation time, the graphite or graphite oxide particles would not be converted into the GO gel state.

The graphene oxide-derived unitary graphene matrix composite containing a carbon or graphite filler phase of the present invention typically has a thermal conductivity greater than 800 W/mK, more typically greater than 1,000 W/mK (even when the film thickness is greater than 10 μm) and often greater than 1,700 W/mK. This latter valve is typically obtained when the carbon/graphite filler is exfoliated graphite flakes (>100 nm, but preferably <500 nm) or pristine graphene platelets (<100 nm, preferably <10 nm) and when the final heat treatment temperature is higher than 2,500° C. The graphene matrix composite typically has an electrical conductivity greater than 3,000 S/cm (even >10,000 S/cm). This high electrical conductivity (greater than 3000 S/cm and up to 15,000 S/cm) can be achieved concurrently with a thermal conductivity greater than 1,000 W/mK (up to 1,800 W/mK). Quite often, the unitary graphene matrix composite can exhibit a combination of a high electrical conductivity (greater than 1,500 S/cm, more often >3,000 S/cm), a high thermal conductivity (greater than 600 W/mK, more often greater than 800 W/mK), a relatively high physical density (greater than 1.8 g/cm$^3$), and a relatively high tensile strength (greater than 40 MPa, often >80 MPa, and can be >120 MPa). Unidirectional carbon fiber reinforced graphene matrix composites can exhibit a tensile strength significantly higher than 200 MPa. The unitary graphene matrix composite also exhibits an exceptional surface hardness and scratch resistance, eliminating the tendency to flake off (to emit free carbon or graphite particles into air) which has been a serious problem associated with the flexible graphite foil and the recompressed graphene platelet foil.

If he graphene oxide gel is obtained from a graphitic material having an original graphite grain size (e.g. an average grain size, $D_g$), the resulting unitary graphene material is a single crystal or a poly-crystal graphene structure having a grain size significantly larger than this original grain size. The unitary graphene material does not have any grain that can be associated with any particular particle of the starting graphitic material. Original particles have already completely lost their identity when they are converted into graphite oxide molecules that are chemically linked up and merged or integrated into a network of graphene chains essentially infinite in molecular weight.

Further, even if graphene oxide gel is obtained from a graphitic material having multiple graphite crystallites exhibiting no preferred crystalline orientation (e.g. powder of natural graphite) as determined by an X-ray diffraction or electron diffraction method, the resulting unitary graphene material (a single crystal or a poly-crystal graphene structure) typically exhibits a very high degree of preferred crystalline orientation as determined by the same X-ray diffraction or electron diffraction method. This is yet another piece of evidence to indicate that the constituent graphene planes of hexagonal carbon atoms that constitute the particles of the original or starting graphitic material have been chemically modified, converted, re-arranged, re-oriented, linked or cross-linked, merged and integrated, re-graphitized, and even re-crystallized.

Example 1

Preparation of Discrete Nano Graphene Platelets (NGPs) and Expanded Graphite Flakes Chopped graphite fibers with an average diameter of 12 μm and natural graphite particles were separately used as a starting material, which was immersed in a mixture of concentrated sulfuric acid, nitric acid, and potassium permanganate (as the chemical intercalate and oxidizer) to prepare graphite intercalation compounds (GICs). The starting material was first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers or natural graphite particles were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (or graphite worms).

Five grams of the resulting exfoliated graphite (graphite worms) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various times. After two hours of sonication, EG particles were effectively fragmented into thin NGPs. The suspension was then filtered and dried at 80° C. to remove residue solvents. The as-prepared NGPs have an average thickness of approximately 9.7 nm.

Another five grams of the resulting exfoliated graphite (EG) were subjected to low-intensity air jet milling to break up graphite worms, forming expanded graphite flakes (having an average thickness of 139 nm).

Example 2

Preparation of Single-Layer Graphene Sheets from Meso-Carbon Micro-Beads (MCMBs)

Meso-carbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

Example 3

Preparation of Pristine Graphene Sheets/Platelets

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson 5450 Ultrasonicator) was used for exfoliation, separation, and size reduction of graphene sheets for a period of 15 minutes to 2 hours.

Example 4

Preparation of Graphene Oxide (GO) Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. After 96 hours, the suspension suddenly becomes an optically transparent solution with light brown color. The solution appears very uniform in color and transparency, indicating the absence of any dispersed discrete objects. The whole solution behaves like a gel, very similar to a typical polymer gel.

Surprisingly, by casting this gel on a glass surface and removing the liquid medium from the cast film we obtain a thin film of graphene oxide that is optically transparent. This thin film looks like, feels like, and behaves like a regular polymer film. However, upon re-graphitization at a temperature (typically >100° C., more typically >500° C., further typically >1,250° C., and can be >2,500° C.) for typically 1-3 hours, this GO film is transformed into a unitary graphene entity comprising or being a large-size graphene single crystal. This is a free-standing unitary graphene layer, which can be implemented directly as a heat spreader in an electronic device or used as a matrix material in a graphene matrix composite containing a carbon/graphite filler phase.

Figure 5A:
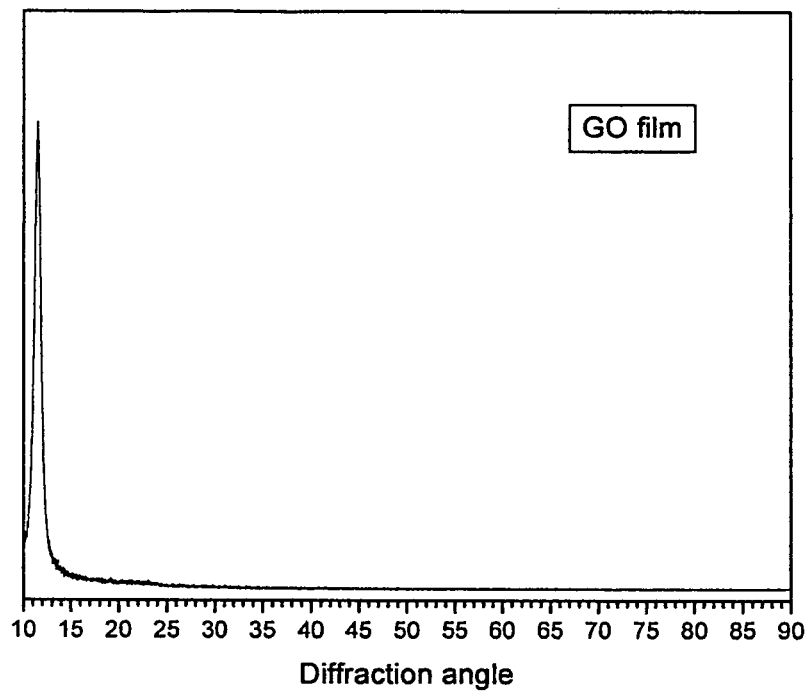
FIG. 5 X-ray diffraction curves of (a) a GO film (dried GO gel), (b) GO film thermally reduced at 150° C. (partially re-graphitized), (c) highly reduced and re-graphitized GO film (a unitary graphene layer), (d) highly re-graphitized and re-crystallized GO single crystal (a more advanced unitary graphene material) showing a high-intensity (004) peak, and (e) a polyimide-derived HOPG with a HTT as high as 3,000° C.
Figure 5B:
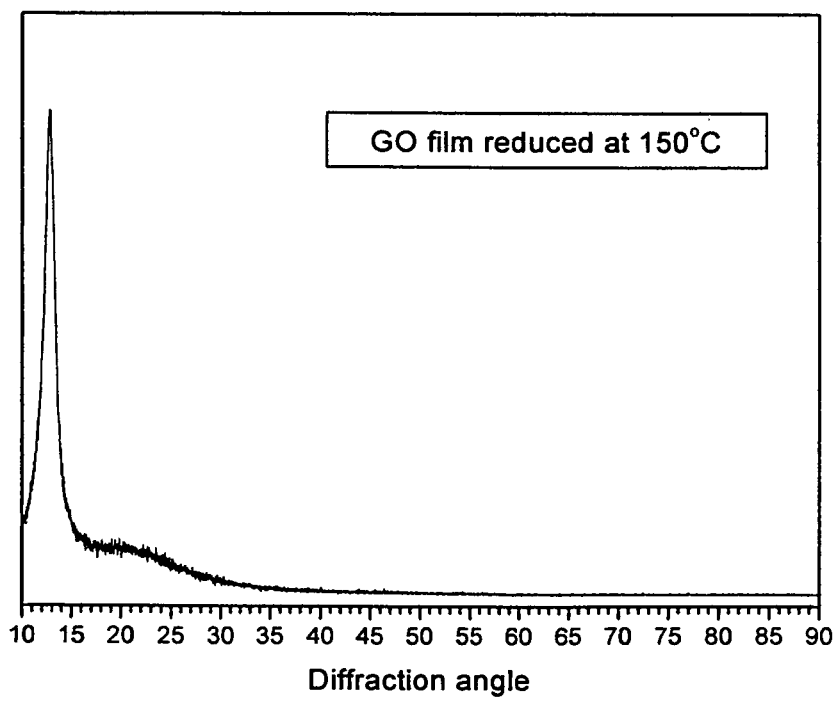
Figure 5C:
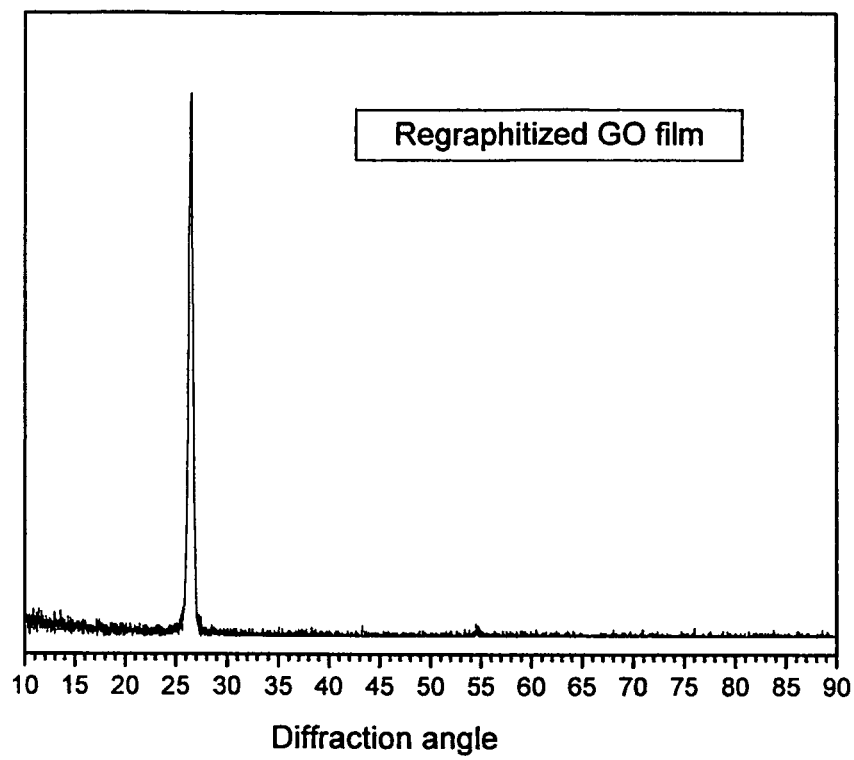

X-ray diffraction curves of a GO film (GO gel coated on a glass surface with liquid medium removed) prior to a heat treatment, a GO film thermally reduced at 150° C. for one hour, and a highly reduced and re-graphitized GO film (a unitary graphene layer) are shown in FIGS. 5(a), 5(b), and 5(c), respectively. The peak at approximately 2θ=12° of the dried GO film (FIG. 5(a)) corresponds to an inter-graphene spacing ($d_{002}$) of approximately 0.7 nm. With some heat treatment at 150° C., the GO film exhibits the formation of a hump centered at 22° (FIG. 5(b)), indicating that it has begun the process of decreasing the inter-graphene spacing, indicating the beginning of chemical linking and ordering processes. With a heat treatment temperature of 2,500° C. for one hour, the $d_{002}$ spacing has decreased to approximately 0.336, close to 0.3354 nm of a graphite single crystal.

Figure 5D:
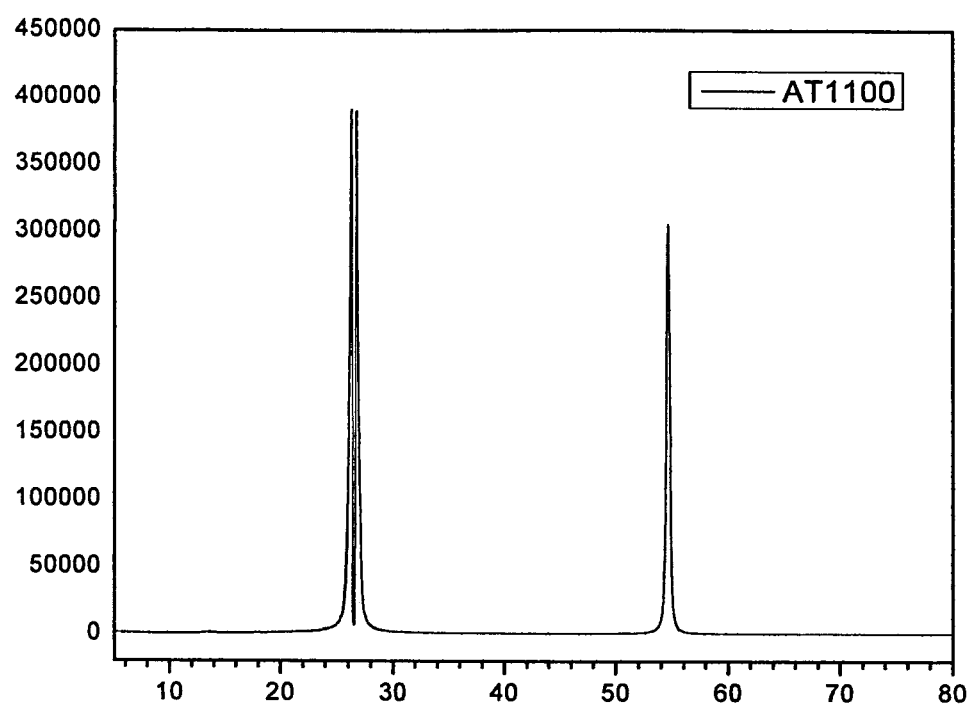
Figure 5E:
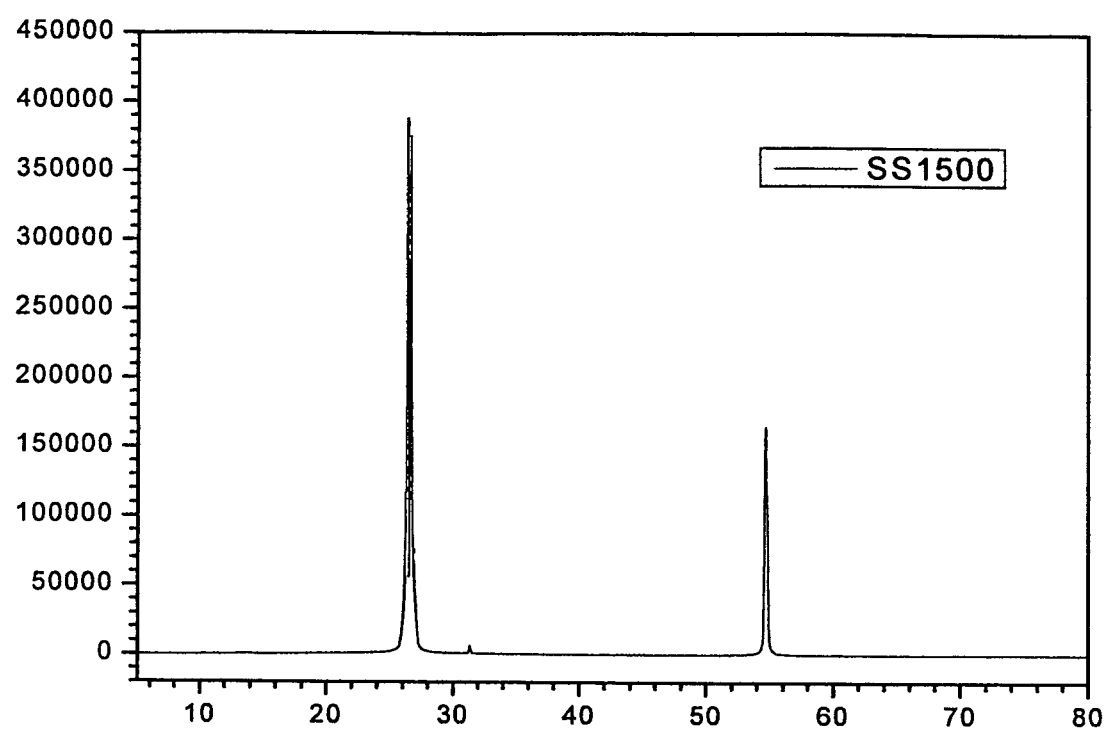

With a heat treatment temperature of 2,750° C. for one hour, the $d_{002}$ spacing is decreased to approximately to 0.3354 nm, identical to that of a graphite single crystal. In addition, a second diffraction peak with a high intensity appears at 2θ=55° corresponding to X-ray diffraction from (004) plane (FIG. 5(d)). The (004) peak intensity relative to the (002) intensity on the same diffraction curve, or the I(004)/I(002) ratio, is a good indication of the degree of crystal perfection and preferred orientation of graphene planes. The (004) peak is either non-existing or relatively weak, with the I(004)/I(002) ratio<0.1, for all graphitic materials heat treated at a temperature lower than 2,800° C. The I(004)/I(002) ratio for the graphitic materials heat treated at 3,000-3,250° C. (e,g, highly oriented pyrolytic graphite, HOPG) is in the range of 0.2-0.5. One example is presented in FIG. 5(e) for a polyimide-derived PG with a HTT of 3,000° C. for two hours, which exhibits a I(004)/I(002) ratio of about 0.41. In contrast, a unitary graphene single crystal prepared with a HTT of 2,750° C. for one hour exhibits a I(004)/I(002) ratio of 0.78 and a Mosaic spread value of 0.21, indicating a practically perfect graphene single crystal with an exceptional degree of preferred orientation.

The "mosaic spread" value obtained from the full width at half maximum of the (002) reflection in an X-ray diffraction intensity curve. This index for the degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our unitary graphene materials have a mosaic spread value in this range of 0.2-0.4 (with a heat treatment temperature no less than 2,000° C.).

It may be noted that the I(004)/I(002) ratio for all tens of flexible graphite samples investigated are all <<0.05, practically non-existing in most cases. The I(004)/I(002) ratio for all NGP paper/membrane samples is <0.1 even after a heat treatment at 3,000° C. for 2 hours. Attempts to graphitize the ultra-thin films (<2 nm in thickness) prepared by Cu-catalyzed CVD led to the breaking up of the film and the formation of graphite particles instead. These observations have further confirmed or affirmed the already established notion that the presently invented unitary graphene crystal is a new and distinct class of material that is fundamental different from any pyrolytic graphite (PG), flexible graphite (FG), and paper/film/membrane of conventional graphene/GO/RGO sheets/platelets (NGPs).

Figure 6A:
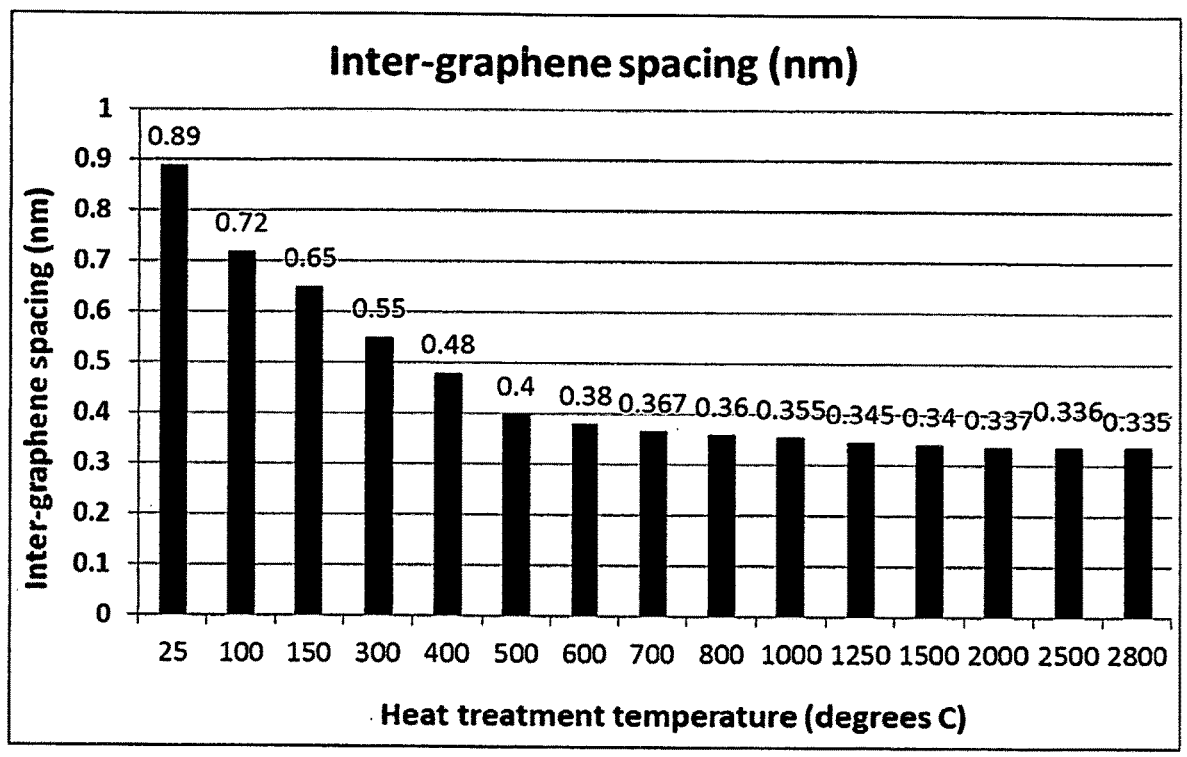
FIG. 6 (a) Inter-graphene plane spacing measured by X-ray diffraction; (b) the oxygen content in the GO-derived unitary graphene layer; (c) correlation between inter-graphene spacing and the oxygen content; and (d) thermal conductivity of GO-derived unitary graphene layer and flexible graphite (FG) foil, all plotted as a function of the final heat treatment temperature.
Figure 6B:
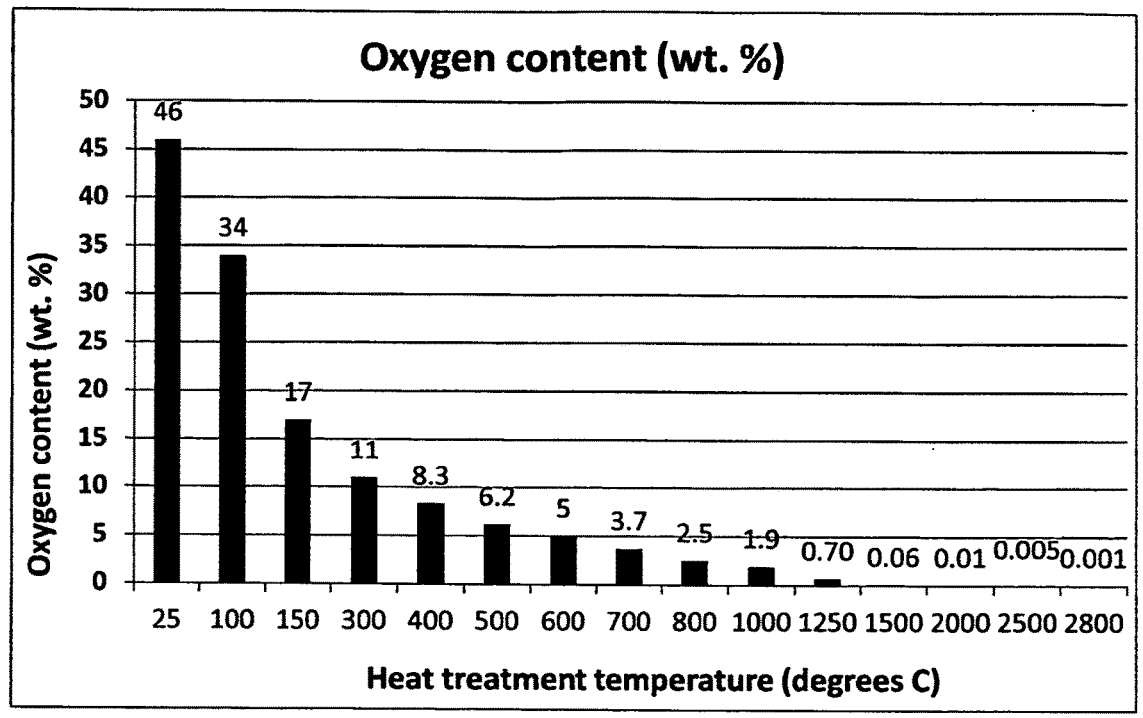
Figure 6C:
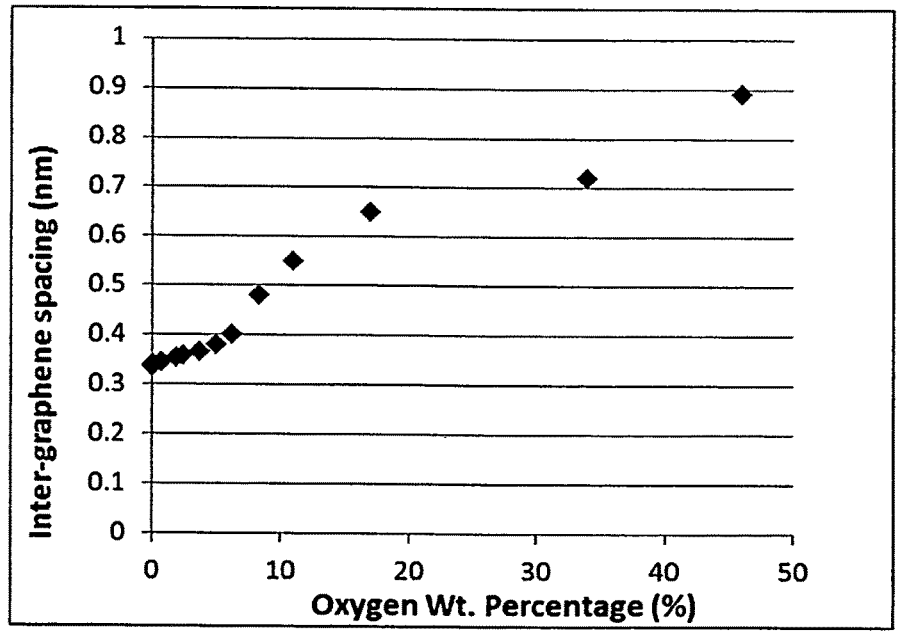
Figure 6D:
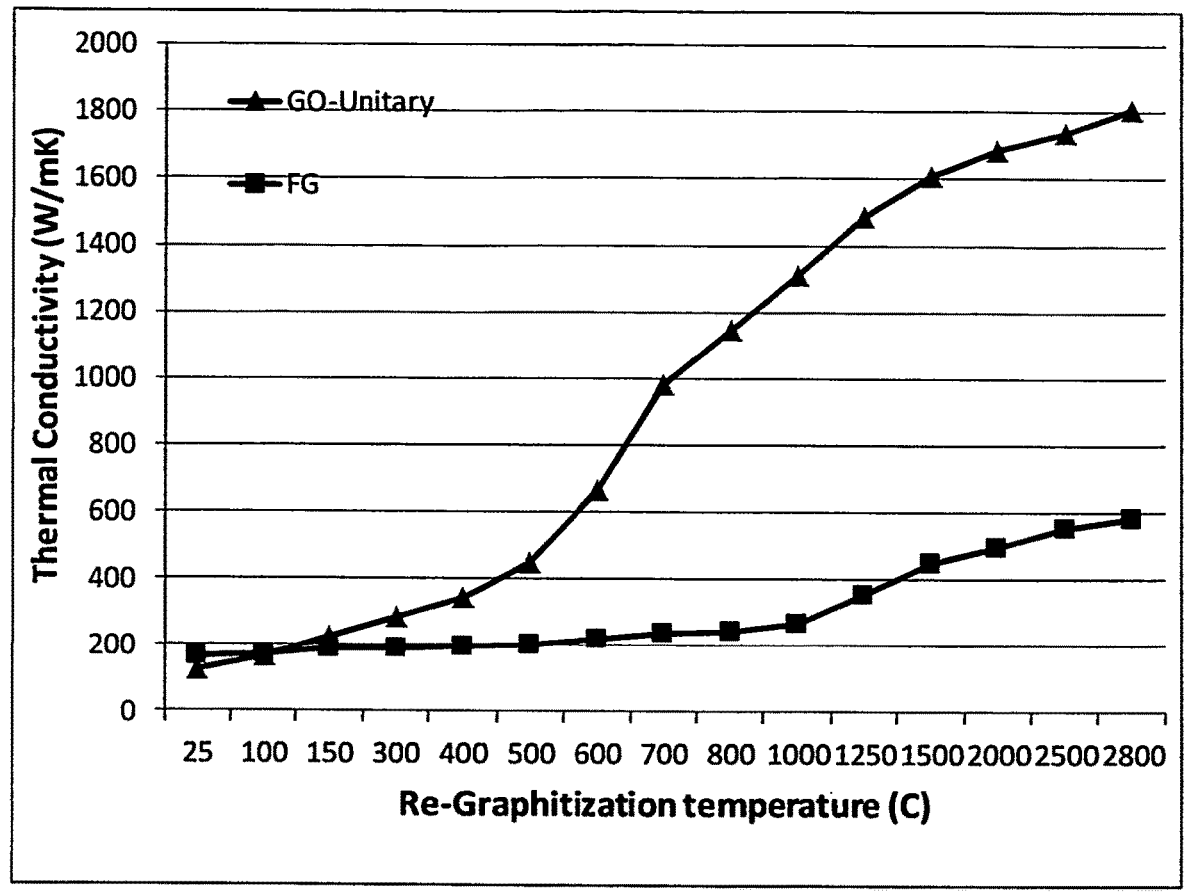

The inter-graphene spacing values of GO-derived unitary graphene films obtained by heat treating at various temperatures over a wide temperature range are summarized in FIG. 6(a). Corresponding oxygen content values in the GO-derived unitary graphene layer are shown in FIG. 6(b). In order to show the correlation between the inter-graphene spacing and the oxygen content, the data in FIGS. 6(a) and 6(b) are re-plotted in FIG. 6(c). A close scrutiny of FIG. 69(a)-(c) indicate that there are four HTT ranges (100-500° C.; 500-1,250° C.; 1,250-2,000° C., and >2,000° C.) that lead to four respective oxygen content ranges and inter-graphene spacing range. The thermal conductivity of GO-derived unitary graphene layer and corresponding flexible graphite (FG) foil, also plotted as a function of the same final heat treatment temperature range is summarized in FIG. 6(d).

It is of significance to point out that a heat treatment temperature as low as 500° C. is sufficient to bring the average inter-graphene spacing in GO to below 0.4 nm, getting closer and closer to that of natural graphite or that of a graphite single crystal. The beauty of this approach is the notion that this GO gel strategy has enabled us to re-organize, re-orient, and chemically merge the planar graphene oxide molecules from originally different graphite flakes or graphene sheets into a graphene monolith with all the graphene planes now being larger in lateral dimensions (significantly larger than the length and width of original graphene planes) and essentially parallel to one another. This has given rise to a thermal conductivity already >420 W/mK (with a HTT of 500° C.) and >950 W/mk with a HTT of 700° C.), which is more than 2- to 4-fold the value (200 W/mK) of the corresponding flexible graphite foil. These planar GO molecules are derived from the graphene planes that constitute the original natural graphite structure. The original natural graphite particles, when randomly packed into an aggregate or "graphite compact", have their constituent graphene planes randomly oriented, exhibiting relatively low thermal conductivity and having essentially zero strength (no structural integrity). In contrast, the strength of the unitary graphene layer (even without an added reinforcement) is typically already in the range of 40-140 MPa.

With a HTT as low as 800° C., the resulting unitary graphene layer exhibits a thermal conductivity of 1,148 W/mK, in contrast to the observed 244 W/mK of the flexible graphite foil with an identical heat treatment temperature. As a matter of fact, no matter how high the HTT is (e.g. even as high as 2,800° C.), the flexible graphite foil only shows a thermal conductivity lower than 600 W/mK. At a HTT of 2,800° C., the presently invented unitary graphene layer delivers a thermal conductivity of 1,807 W/mK (FIG. 4(a) and FIG. 6(d)).

Scanning electron microscopy (SEM), transmission electron microscopy (TEM) pictures of lattice imaging of the graphene layer, as well as selected-area electron diffraction (SAD), bright field (BF), and dark-field (DF) images were also conducted to characterize the structure of unitary graphene materials. For measurement of cross-sectional views of the film, the sample was buried in a polymer matrix, sliced using an ultra-microtome, and etched with Ar plasma.

Figure 2A:
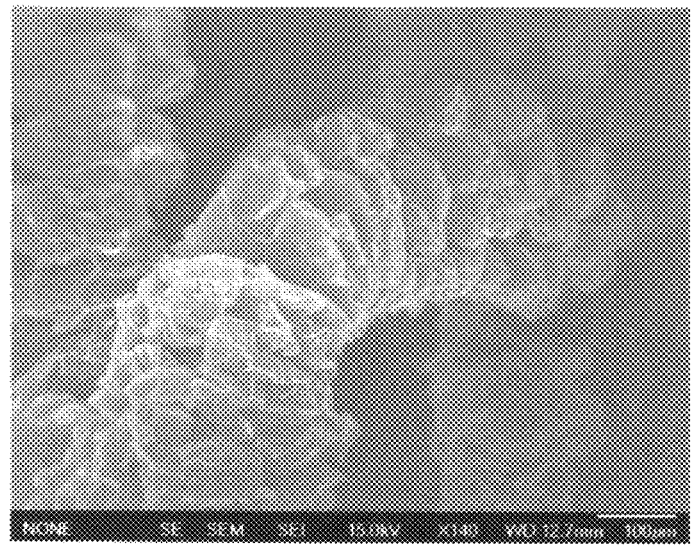
FIG. 2 (a) A SEM image of a graphite worm sample after thermal exfoliation of graphite intercalation compounds (GICs) or graphite oxide powders; (b) An SEM image of a cross-section of a flexible graphite foil, showing many graphite flakes with orientations not parallel to the flexible graphite foil surface and also showing many defects, kinked or folded flakes.
Figure 2B:
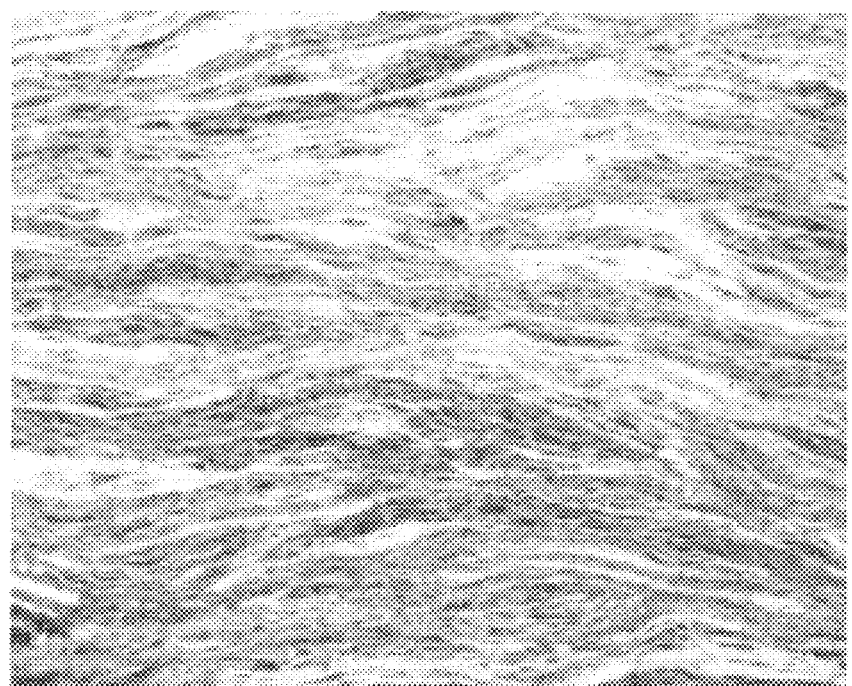

A close scrutiny and comparison of FIGS. 2(a), 3(a), and 3(b) indicates that the graphene layers in a graphene single crystal or graphene monolithic are substantially oriented parallel to one another; but this is not the case for flexible graphite foils and graphene oxide paper. The inclination angles between two identifiable layers in the unitary graphene entity are mostly less than 5 degrees. In contrast, there are so many folded graphite flakes, kinks, and mis-orientations in flexible graphite that many of the angles between two graphite flakes are greater than 10 degrees, some as high as 45 degrees (FIG. 2(b)). Although not nearly as bad, the mis-orientations between graphene platelets in NGP paper (FIG. 3(b)) are also high and there are many gaps between platelets. The unitary graphene entity is essentially gap-free.

FIG. 4 (a) shows the thermal conductivity values of the GO-derived unitary graphene matrix layer (▲), GO platelet paper (■) prepared by vacuum-assisted filtration of RGO, and FG foil (♦), respectively, all plotted as a function of the final HTT for graphitization or re-graphitization. These data have clearly demonstrated the superiority of the unitary graphene material or graphene single crystal in terms of the achievable thermal conductivity at a given heat treatment temperature. All the prior art work on the preparation of paper or membrane from pristine graphene or graphene oxide sheets/platelets follows distinctly different processing paths, leading to a simple aggregate or stack of discrete graphene/GO/RGO platelets. These simple aggregates or stacks exhibit many folded graphite flakes, kinks, gaps, and mis-orientations, resulting in poor thermal conductivity, low electrical conductivity, and weak mechanical strength. As shown in FIG. 4(a), even at a heat treatment temperature as high as 2,800° C., the GO platelet paper exhibits a thermal conductivity less than 1,000 W/mK, much lower than the >1,800 W/mK of the GO gel-derived unitary graphene entity.

For comparison, we have also carbonized polyimide films at 500° C. for 1 hour and at 1,000° C. for 3 hours in an inert atmosphere and then graphitized the films at a temperature in the range of 2,500-3,000° C. for 1 to 5 hours to form a conventional pyrolytic graphite (PG) film. FIG. 4(b) shows the thermal conductivity values of the GO-derived unitary graphene (■) and the polyimide-derived PG heat-treated for one hour (x) and for 3 hours (▲), all plotted as a function of the final graphitization or re-graphitization temperature. These data show that the conventional PG, produced by carbonizing polyimide (PI) and then graphitizing the carbonized PI, exhibits a consistently lower thermal conductivity as compared to the GO gel-derived unitary graphene alone (■), given the same HTT for the same length of heat treatment time. For instance, the PG from PI exhibits a thermal conductivity of 820 W/mK after a graphitization treatment at 2,000° C. for one hour and 1,242 W/mK at 2,000° C. for 3 hours. These observations have demonstrated a clear and significant advantage of using the GO gel approach to producing unitary graphene materials versus the conventional PG approach to producing oriented graphite crystals. As a matter of fact, no matter how long the graphitization time is for the PG, the thermal conductivity is always lower than that of a GO gel-derived unitary graphene. In other words, the unitary graphene material is fundamentally different and patently distinct from the flexible graphite (FG) foil, graphene/GO/RGO paper/membrane, and pyrolytic graphite (PG) in terms of chemical composition, crystal and defect structure, crystal orientation, morphology, process of production, and properties.

Figure 4A:
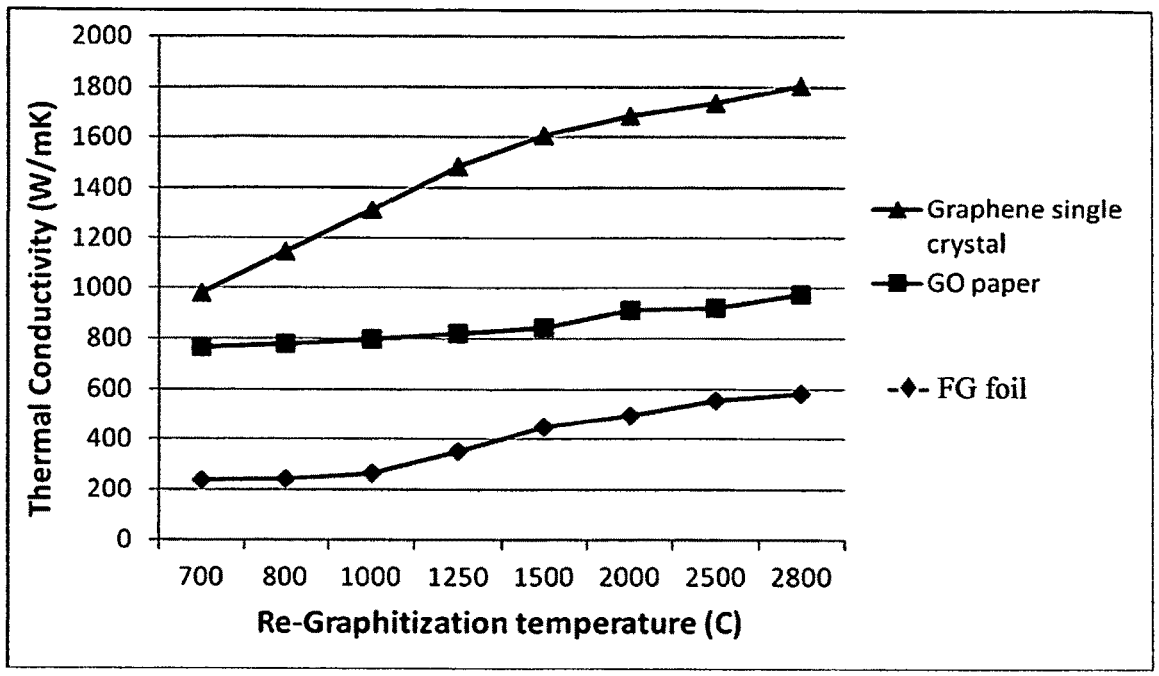
FIG. 4 (a) Thermal conductivity values of the GO-derived single unitary graphene layer (▲), GO paper (■), and FG foil (♦) plotted as a function of the final heat treatment temperature for graphitization or re-graphitization; (b) Thermal conductivity values of the GO-derived unitary graphene layer (■) and the polyimide-derived pyrolytic graphite (PG) heat-treated for one hour (x) and for 3 hours (▲), all plotted as a function of the final graphitization or re-graphitization temperature; (c) Electric conductivity values of the GO-derived unitary graphene layer (♦), GO paper (■), and FG foil (x) plotted as a function of the final graphitization or re-graphitization temperature; (d) thermal conductivity values of unitary graphene layer only, unitary graphene matrix/CNT composite, GO paper (prepared from GO platelets not reaching a GO gel state), and GO/CNT paper or membrane; and (e) Thermal conductivity values of unitary graphene matrix, GO paper, unitary graphene/carbon black composite, and mixture of RGO+CB. Note: symbol designations varied from (a) to (e).
Figure 4B:
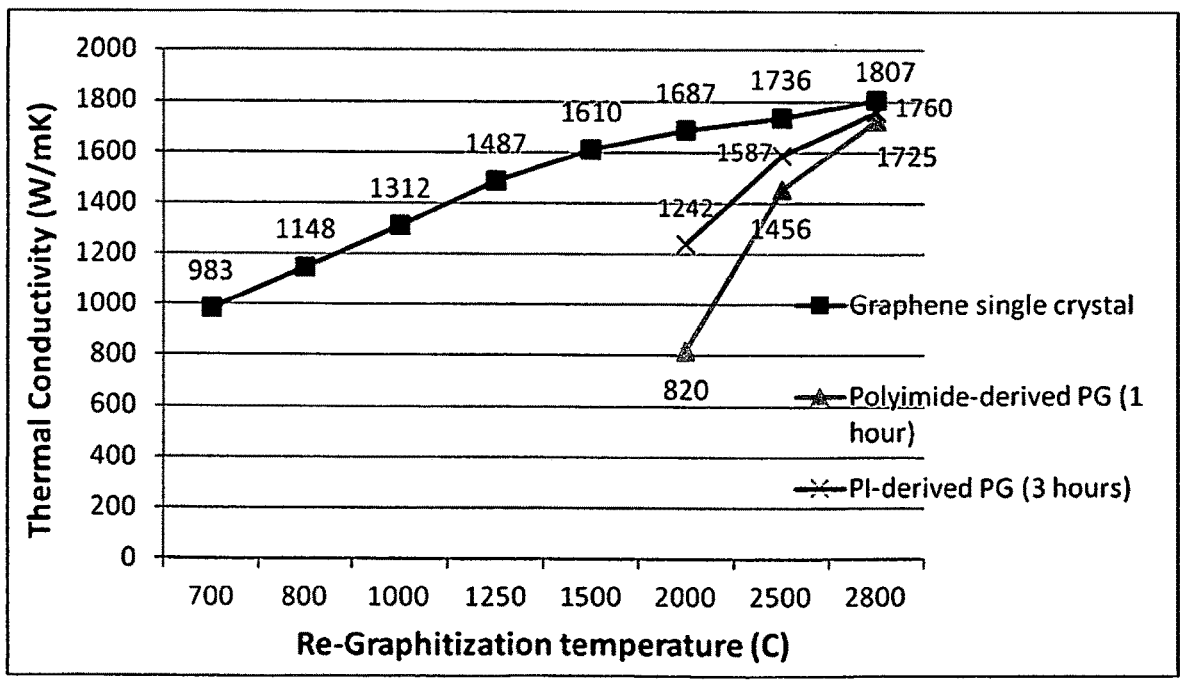
Figure 4C:
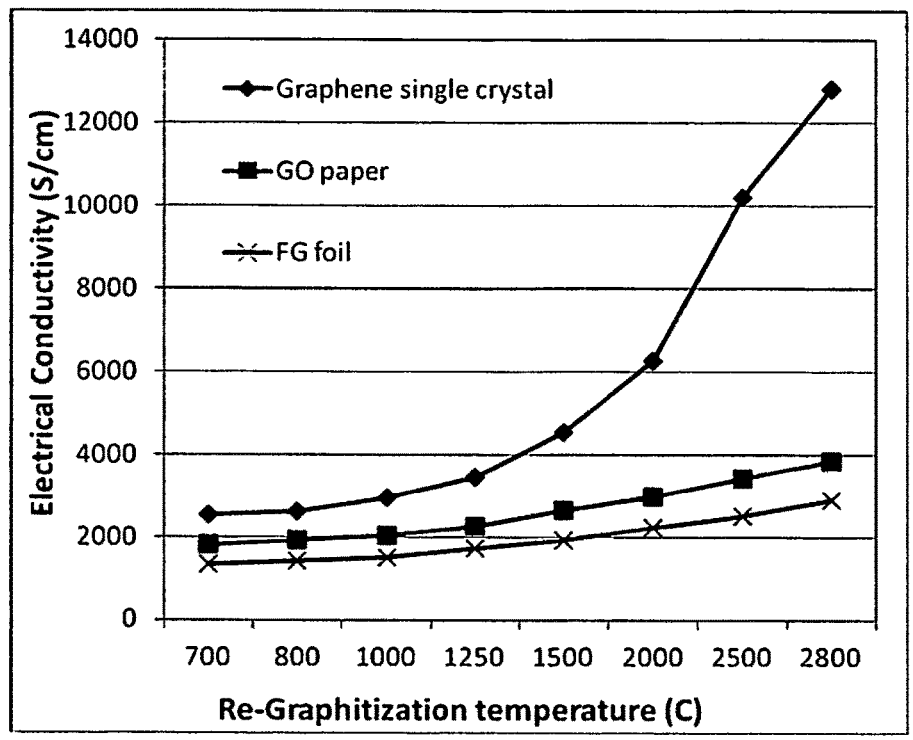

The above conclusion is further supported by the data in FIG. 4(c) showing the electric conductivity values of the GO-derived unitary graphene layer (♦) are far superior to those of the GO paper (■) from RGO platelets and FG foil (x) over the entire range of final HTTs investigated.

Examples 5

Preparation and Testing of Unitary Graphene Matrix Composites

GO gel can be combined with a carbon/graphite filler phase to form a graphene matrix composite. The graphene oxide gel prepared in Example 4 was used for the preparation of graphene matrix composite. The exfoliated graphite flakes prepared in Examples 1 were made into thin porous paper or film form (e.g., using a vacuum-assisted filtration technique) for use as a carbon/graphite filler. Other carbon or graphite fillers investigated include carbon nano-tubes and CNT paper (Bucky paper from Buckeye Composites, Inc., Dayton, Ohio), carbon nano-fibers and CNF mats (CNFs supplied from Applied Sciences, Inc., Cedarville, Ohio), flexible graphite foils of several different thicknesses (supplied from Graftech and Timcal Graphite), carbon fibers and carbon fiber mats, woven fabrics of graphite fibers, carbon paper (Toray), MCMB particles, carbon black (CB), acetylene black (AB), and needle coke.

As examples, two approaches were adapted to produce graphene matrix composites. In the first approach, the particles of the carbon/graphite filler phase were formed into porous pre-forms, such as porous paper, mat, and fabric (woven or non-woven). The porous pre-form was then impregnated with GO gel, which was followed by drying and heat treating.

In a second approach, discrete particles or fibers of the carbon/graphite filler phase were added into the GO gel to form a mixture gel or gel slurry. Pure GO gel or carbon/graphite filler-GO mixture gel or slurry was then cast onto a solid substrate surface using a coating machine equipped with drying and heating provisions. In some cases, the GO gel or filler-GO gel mixture was cast onto a substrate and regulated by a doctor's blade to form a uniform coating thereon. The liquid in the coating was further removed in a vacuum oven to form a solid GO coating. The resulting GO or GO-filler layers were then subjected to a heat treatment at a temperature of from 100° C. up to approximately 3,000° C. We have utilized several temperature regimes: 100° C.-500° C.; 500° C.-1,250° C.; 1,250° C.-2,000° C.; and 2,000° C.-3,000° C.

Examples 6

Electrical and Thermal Conductivity Measurements of Various Graphene Oxide-Derived Unitary Graphene and Graphene Matrix Composite Layers Four-point probe tests were conducted on unitary graphene matrix composites (e.g. containing CNT, expanded graphite flakes, carbon black, etc), the GO-derived unitary graphene layer alone (coated on a glass surface and then peeled off and heat treated), GO/RGO paper, and the FG foils alone to measure their in-plane electrical conductivity. Their in-plane thermal conductivity was measured using a laser flash method (Netzsch Thermal Diffusivity Device).

The in-plane thermal and electrical conductivities and tensile properties of various films or laminates were investigated. Several significant observations can be made from the testing results (e.g. as summarized in FIGS. 4(d), 4(e), 7(a), 7(b), 8(a), and 8(b)):

(1) With a thickness of approximately 75 μm, the thermal conductivity of the flexible graphite foil alone (FG, ▲ in FIG. 4(a)) is less than 237 W/mK if the FG foil is not heat-treated at or above 700° C. As the post-recompression heat treatment temperature increases from 700° C. to 2,800° C. (for one hour of graphitization treatment in each case), the thermal conductivity of the FG foil increases from 237 to 582 W/mK, indicating some but limited re-organization of the graphitic structure induced by the heat treatment. By contrast, the thermal conductivity of the GO gel-derived unitary graphene layer alone increases from 983 to 1,807 W/mK (■ in FIG. 7(a)). This unitary graphene matrix material is obtained by shearing and depositing a layer of GO gel on a glass surface, removing the liquid from the GO layer in vacuum for 1 hour, and peeling off the dried solid GO layer from the glass surface. This indicates a significant or dramatic re-organization of the graphitic structure induced by the heat treatment, with all GO molecules linked or merged edge-to-edge and face-to-face into a unitary graphene body of fully and orderly bonded graphene planes, a graphene single crystal.

Figure 7A:
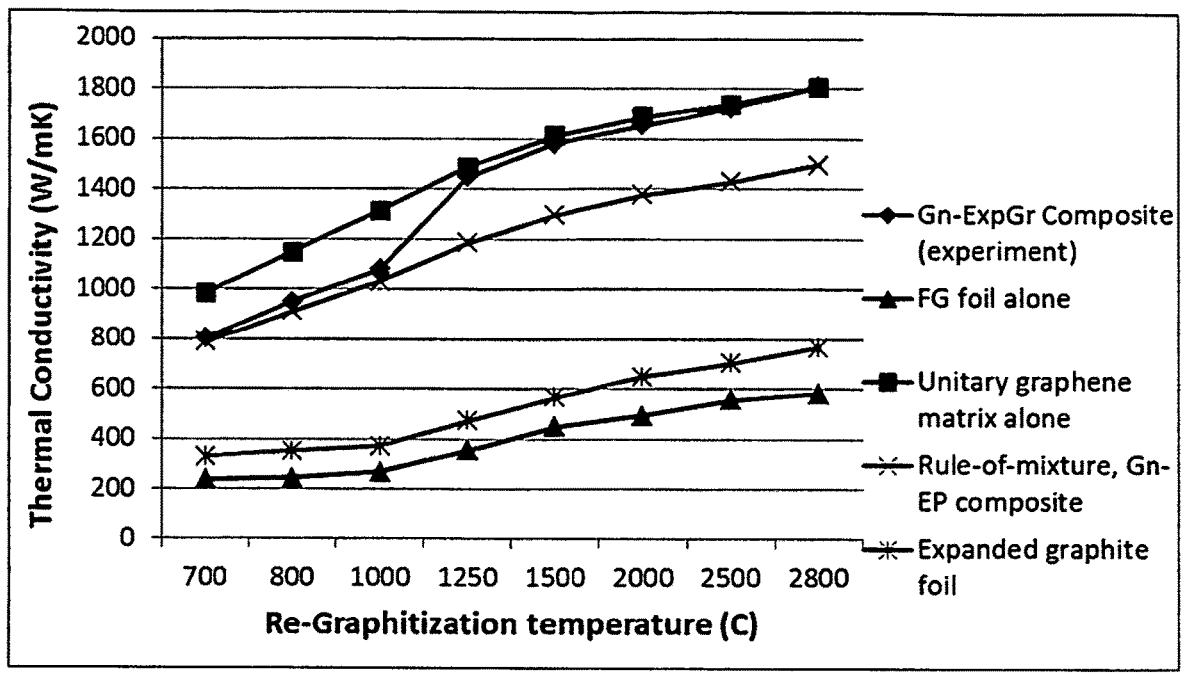
FIG. 7 (a) Thermal conductivity values of the GO-derived unitary graphene layer alone (■), unitary graphene matrix-expanded graphite reinforcement composite (♦, experimental values), expanded graphite mat alone (exfoliated graphite worms broken up into separated graphite flakes and clustered into a thin mat) and FG foil alone (▲, re-compressed worms without worm break-up and flake separation as a point of reference) plotted as a function of the final graphitization or re-graphitization temperature, along with theoretically predicted values (x, unitary graphene matrix-expanded graphite composite) based on a rule-of-mixture law (final graphitization time=1 hour for all specimens); (b) Thermal conductivity values of the GO-derived unitary gaphene layer alone (■), unitary graphene matrix-expanded graphite composite (♦), and polyimide-derived pyrolytic graphite (PG) plotted as a function of the final graphitization or re-graphitization temperature for one hour, along with those of PG graphitized for 3 hours.

(2) The experimentally measured thermal conductivity of a corresponding series of GO gel-derived unitary graphene matrix composite containing expanded graphite flakes as the filler phase (♦ in FIG. 7(a)) increases from approximately 800 to 1,800 W/mK. This is significantly higher than the thermal conductivity values of what would be theoretically predicted (x in FIG. 7a)) from a rule-of-mixture law, which is commonly used to predict composite properties from constituent properties. These data have clearly demonstrated an un-expected, synergistic effect between GO-derived unitary graphene matrix (derived from graphene oxide gel) and the dispersed expanded graphite flakes.

Also shown in FIG. 7(a) are the thermal conductivity data of corresponding flexible graphite foil (FG prepared by roll-pressing of exfoliated graphite worms) and foil or mat of expanded graphite flakes (prepared by breaking up graphite worms into graphite flakes as described in Example 1, which were then packed and roll-pressed into a thin foil/mat). The highest thermal conductivity value achievable with the expanded graphite foil is <800 W/mK and that with FG is <600 W/mK, both being dramatically lower than those of both the unitary graphene matrix and the graphene matrix composite.

Figure 7B:
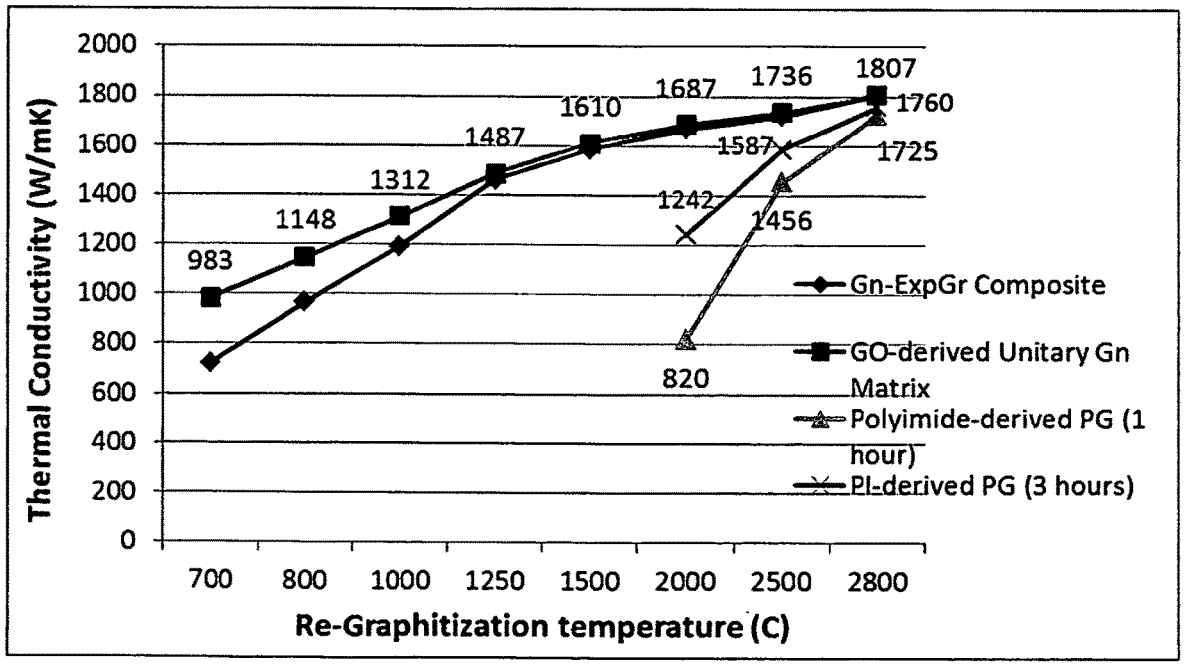

(3) FIG. 7(b) shows that the conventional PG, produced by carbonizing polyimide, roll-pressing, and then graphitizing the carbonized PI, exhibits a consistently lower thermal conductivity as compared to the GO gel-derived unitary graphene layer alone (■) or unitary graphene matrix composite (♦), given the same HTT for the same length of heat treatment time. For instance, the PG from PI exhibits a thermal conductivity of 820 W/mK after a graphitization treatment at 2,000° C. for one hour and 1,242 W/mK at 2,000° C. for 3 hours. These observations have demonstrated a clear and significant advantage of using the GO gel approach versus the conventional PG approach. As a matter of fact, no matter how long the graphitization time is for the PG, the thermal conductivity is always lower than that of a GO gel-derived unitary graphene or unitary graphene matrix composite. These observations have clearly further validate the notion that both the GO-derived unitary graphene layer and unitary graphene matrix composite are fundamentally different and patently distinct from the pyrolytic graphite in terms of chemical composition, structure, morphology, process of production, and properties.

Figure 4D:
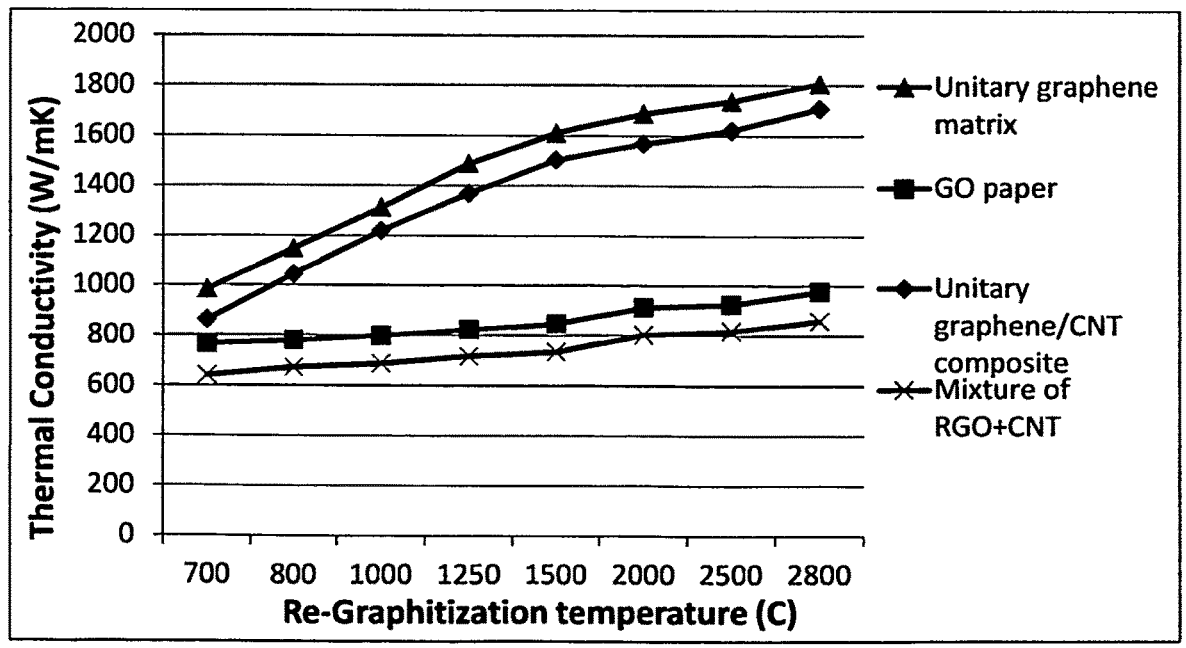
Figure 4E:
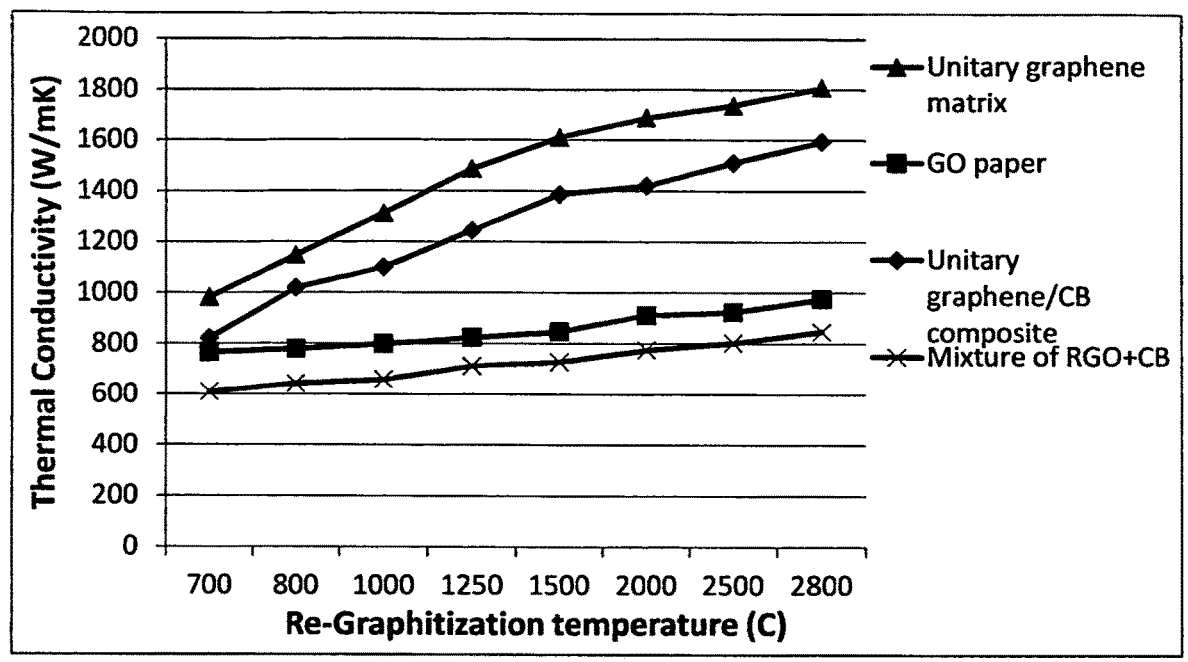

(4) FIG. 4(d) shows the thermal conductivity values of both unitary graphene matrix and graphene matrix-CNT composite are far superior to those of prior art GO paper containing discrete GO platelets and those of GO paper containing an equal proportion of the same CNTs (approximately 26% by weight). FIG. 4(e) demonstrates that unitary graphene matrix composite containing carbon black particles as the carbon/graphite filler phase are significantly higher than those of prior art GO paper and corresponding GO-CB paper.

Examples 7

Tensile Strength of Various Graphene Oxide-Derived Unitary Graphene Matrix Composites A series of GO gel-derived unitary graphene layers, graphene matrix composites, GO platelet paper, and FG foil were prepared. A universal testing machine was used to determine the tensile strength of these materials. The tensile strength values of the unitary graphene entity, GO platelet paper, and FG paper are plotted as a function of the re-graphitization temperature, FIG. 8(a). These data have demonstrated that the tensile strength of the flexible graphite foil remains relatively constant (all <20 MPa) and that of the GO paper increases slightly (from 22 to 43 MPa) when the heat treatment temperature increases from 700 to 2,800° C. In contrast, the tensile strength of the GO-derived unitary graphene layer increases dramatically from 32 to >100 MPa over the same range of heat treatment temperatures. This result is quite striking and further reflects the notion that the GO gel-derived GO layer contains highly live and active molecules during the heat treatment, while the graphene platelets in the GO paper and the graphite flakes in the FG foil are essentially dead molecules. The GO-derived unitary graphene entity or graphene single crystal is a class of material by itself.

The tensile strength values of three unitary graphene matrix composites with the final re-graphitization temperature of 1,500° C. are plotted as a function of the filler weight fraction for three carbon/graphite filler types: CNT, expanded graphite flakes, and carbon black particles (FIG. 8(b)). Although adding CNTs to the unitary graphene matrix decreases the thermal conductivity (FIG. 4(d)), the strength of the resulting composites increases monotonically with (actually proportional to) the CNT weight fraction, reaching a value of 200 MPa that is one order of magnitude higher than the typical strength of flexible graphite-type materials. This is completely unexpected.

This suggests that GO molecules have a strong adhering power capable of bonding to CNTs, creating a strong interfacial bond to assist in the load transfer and enabling CNTs to carry a significant proportion of the mechanical force imposed upon the composite. It may be noted that epoxy matrix composites containing multi-walled carbon nanotubes as the reinforcement phase have never exhibit a tensile strength higher than 80 MPa. This is partially due to the difficulty of dispersing CNTs in a polymer, to the extent that it has been extremely difficult to well-disperse more than 5% by weight of CNTs in epoxy. Beyond 5% by weight, CNTs could not be homogeneously dispersed in epoxy and the tensile strength actually begins to decrease with increasing CNT weight percentage. The observation that CNTs can be well dispersed in the graphene matrix up to 30% by weight is shocking, indicating outstanding chemical compatibility between GO molecules and discrete CNT filaments. Further shocking is the 200 MPa tensile strength exhibited by the graphene matrix-CNT composite, a value that no reinforced epoxy composite has been able to achieve unless the reinforcement phase (such as high-strength carbon fibers) is well aligned in the loading direction (e.g. in a unidirectional fiber composite).

Examples 8

The Surface Scratch Resistance (in Terms of Scratch Visibility and Scratch Depth), and Hardness of Various Unitary Graphene Matrix Composites The scratch test was conducted using the so-called Ford Lab Test Method (FLTM) BN108-13. This apparatus consists of a movable platform connected to five beams with 250 mm in length. A scratch pin is attached to one end of each beam. A highly polished hardened steel ball (1.0±0.1 mm diameter) is placed on the tip of each pin. Each pin is loaded with a weight that exerts a force of 7N, 6N, 3N, 2N, and 0.6N, respectively. Driven by compressed air, the beams draw the pins across the specimen surface and generate scratches. The scratch is made at a sliding velocity of approximately 100 mm/s. All tests were performed at room temperature. Although the test method requires that grained surfaces be evaluated, only the smooth surfaces of the specimens were tested in this study.

After the specimen plaques were scratched, they were evaluated with a reflected light polarizing microscope incorporating a Xenon light source. An image analyzer with Image Analysis Software was used to measure the "gray scale mass," which is the total gray scale value of the object. The camera objective lens is positioned at an angle of 90° from the scratch. The objective lens then registers a portion of the scratch about 1 mm long. The electron signal for each scratch line is then integrated and recorded. The optical mass of an object, M, is the sum of the gray level values, GL, of all pixels in the object. The individual gray level values are assigned by the image analysis program in unit steps in the range of 0-255, where 0=black and 255=white. The optical mass, M, can be computed from: $M=\Sigma GL_i$ (sum over i to n), where n is the number of pixels. The brightness of the object, B, is $B=M/A$, where A represents the area of the object. The percentage change in the brightness between the scratch and the background is the scratch visibility, $\Delta B$, given by $\Delta B=[(B_{scratch}-B_{background})/(B_{background})]\times 100\%$. The depth of the scratch was measured using an interferometer. The magnification was set at 5×. Depth measurements were made from the depth histogram of the scanned area. The scratches were also examined using a scanning electron microscope (SEM).

Indentation hardness tests were also performed on selected specimens. For the Rockwell Hardness test, the ASTM D 785 test procedure was followed. The indenter was a round steel ball with 12.5 mm in diameter (Rockwell R scale). The Rockwell hardness number is a measure of the non-recoverable indentation after a heavy load of 588N for a period of 15 s, and subsequently reduced to a minor load of 98N for another duration of 15 s. Normal hardness is then defined as the load divided by the projected area.

Figure 8A:
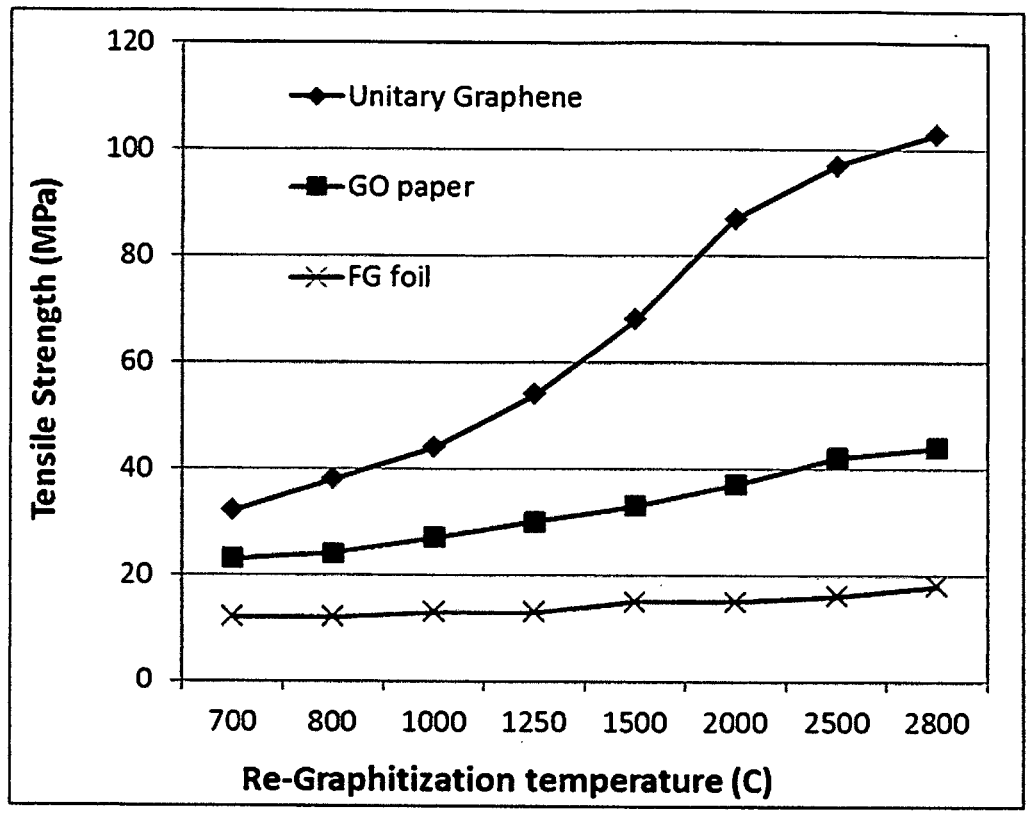
FIG. 8 (a) Tensile strength of unitary graphene matrix material from GO gel, paper of GO platelets (not from gel state), and flexible graphite foil over a range of heat treatment temperatures; (b) Tensile strength and (c) Rockwell hardness values of unitary graphene matrix/CNT reinforcement composites, unitary graphene matrix/expanded graphite reinforcement composites, and unitary graphene matrix/carbon black reinforcement composites plotted as a function of the filler weight percentage, and (d) Rockwell hardness of unitary graphene matrix material only and its CNT-reinforced version plotted as a function of the heat treatment temperature.
Figure 8B:
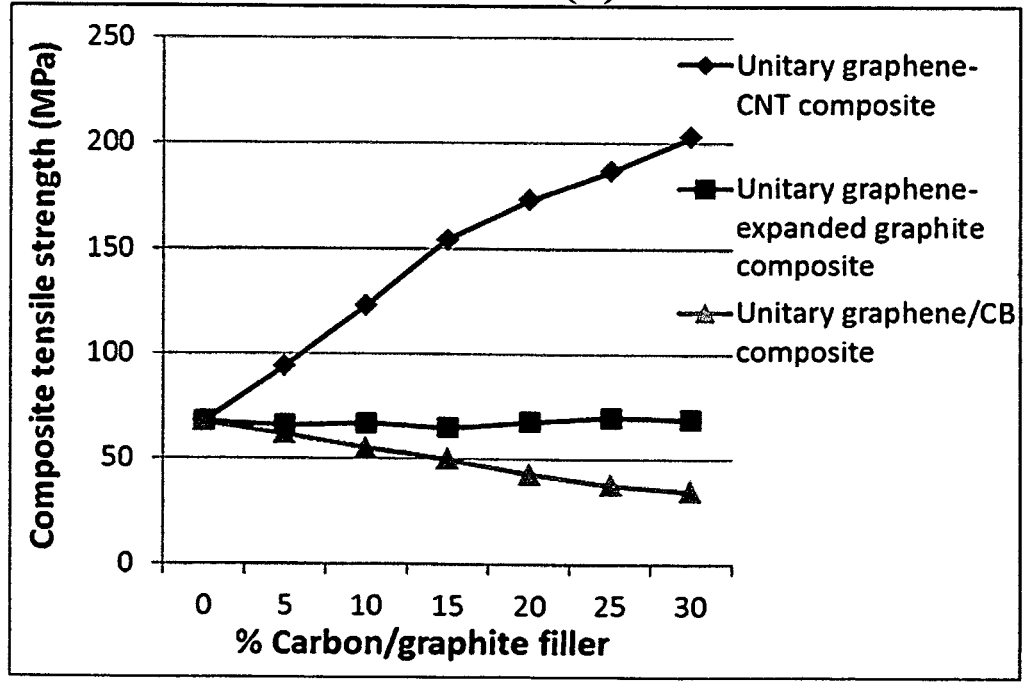
Figure 8C:
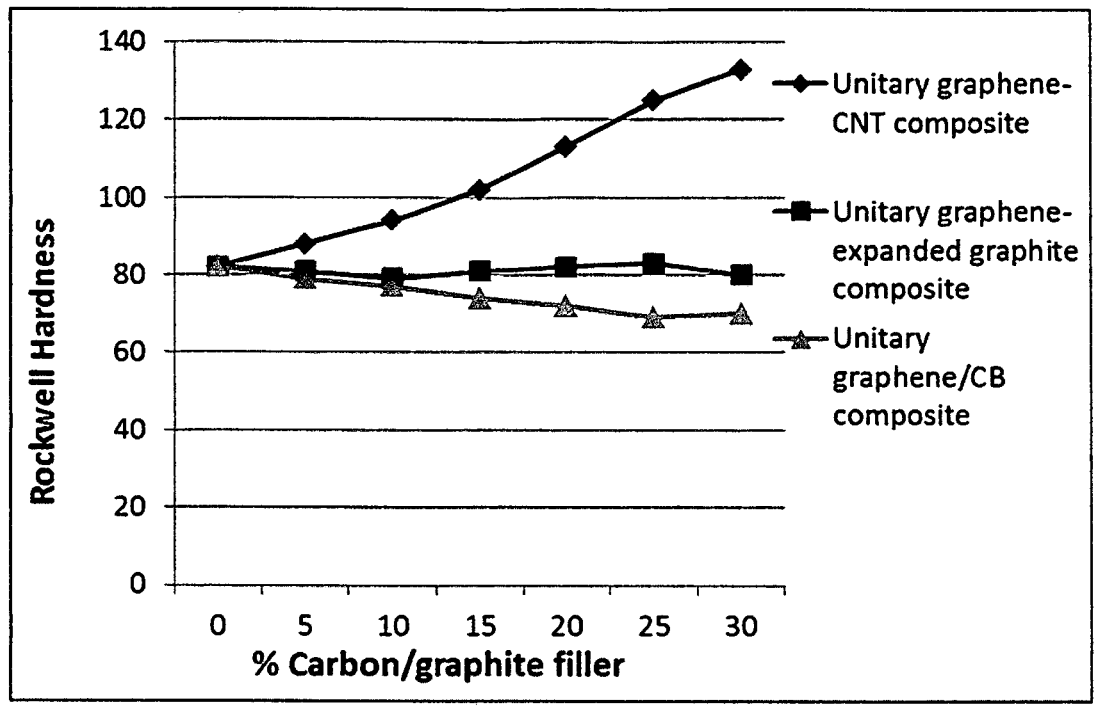
Figure 8D:
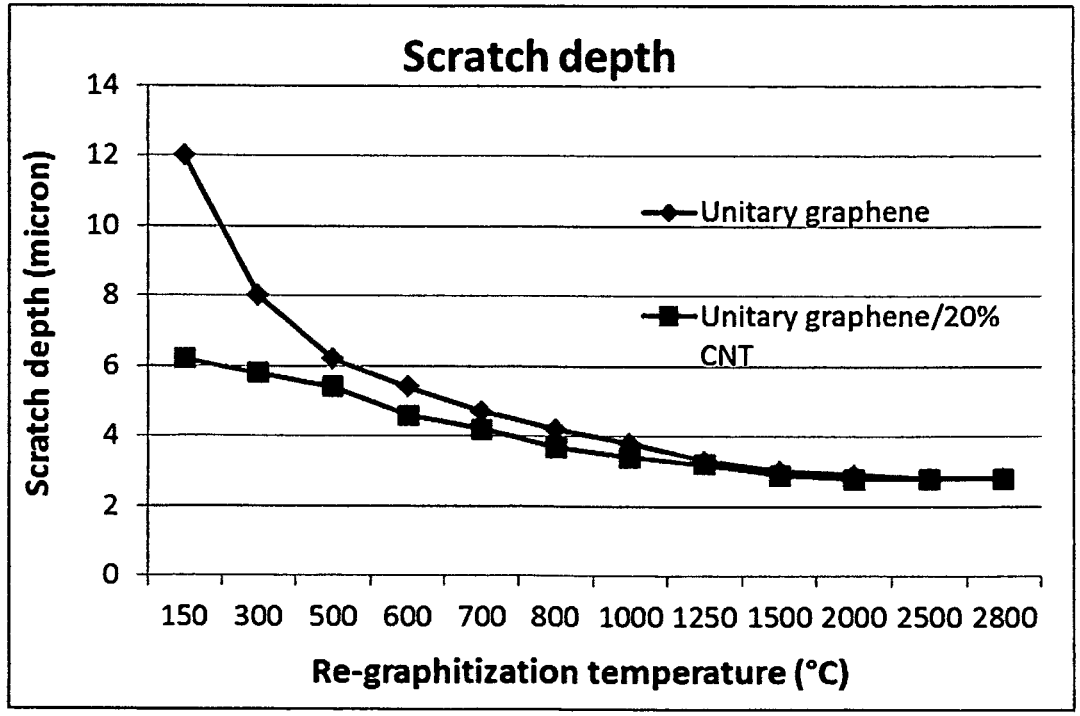

FIGS. 8(c) and 8(d) show the Rockwell hardness and scratch depth data, respectively, of several graphene matrix composites plotted as a function of the filler weight percentage (FIG. 8(c)) and re-graphitization temperature (FIG. 8(d)). The Rockwell hardness data in FIG. 8(c) are found to be well correlated with the tensile strength data of FIG. 8(b). Again, the presence of CNTs can significantly increase the hardness of the unitary graphene matrix. The scratch resistance of the unitary graphene matrix can also be significantly improved by adding some CNT (20% by weight as in FIG. 8(d)). This improvement is diminished as the final re-graphitization temperature exceeds 1,000 C wherein the unitary graphene matrix alone is already of high strength and hardness.

Examples 9

Thermal and Electrical Properties of Various Unitary Graphene Matrix Composites

The thermal and electric conductivities of unitary graphene matrix composites containing various carbon or graphite fillers in different forms are summarized in Table 1 below. Given the same final heat treatment temperature, all the graphene matrix composites exhibit better electric and thermal conductivities as compared to the baseline flexible graphite foil and GO paper.

TABLE 1

In-plane thermal and electric conductivities

| Sample No. | Re-graphitization temperature (° C.) | Filler type, form, and wt. % | Thermal conductivity (W/mK) | Electric conductivity (S/cm) |
| --- | --- | --- | --- | --- |
| 31-G | 1,500 | None | 1,610 | 4,200 |
| 31-G-AB | 1,500 | Acetylene black particles, dispersed, 35% | 946 | 3,550 |
| 31-G-MCMB | 1,500 | Particles, dispersed, 25% | 1,156 | 3,605 |
| 31-G-Coke | 1,500 | Needle coke, dispersed, 25% | 1,028 | 3,002 |
| 32-G | 2,500 | None | 1,736 | 10,300 |
| 32-G-CNF | 2,500 | CNF, mat, 10% | 1,550 | 9,213 |
| 32-G-CF-Uni | 2,500 | Continuous carbon fibers, unidirectional, 55% | 1,250 | 7,250 |
| 32-G-CF-W | 2,500 | Continuous carbon fibers, woven fabric, 54% | 1,143 | 6,037 |
| 32-G-CF-Ch | 2,500 | Chopped carbon fiber, mat, 45% | 1,057 | 5,454 |
| 32-G-AC | 2,500 | Activated carbon, dispersed, 15% | 1,611 | 9,763 |
| FG foil | 2,500 | — | 560 | 2,300 |
| GO paper | 2,500 | — | 920 | 3,500 |

As indicated in FIGS. 7(a) and 7(b), the presently invented unitary graphene matrix composites do not have to go through an ultra-high-temperature graphitization treatment to achieve a high thermal conductivity (e.g. K already=988 W/mK with T=800° C. and K=1,487 W/mK with T=1,250° C.). Graphitization of a carbonized resin (e.g. polyimide) or other carbon materials requires a temperature typically higher than 2,000° C., most typically higher than 2,500° C. The graphitization temperature is most typically in the range of 2,800-3,200° C. in order for carbonized materials or pyrolytic graphite to achieve a thermal conductivity of 1,600-1,700 W/mK. In contrast, the typical heat treatment temperature (re-graphitization treatment) of the presently invented GO-coated laminates is significantly lower than 2,500° C. and more typically lower than 1,500° (can be as lower than 500° C.).

For instance, polyimide (PI), if carbonized and graphitized for 5 hours (including 4 hours for carbonization at 1,000-1,500° C. and 1 hour for graphitization at 2,000° C.), exhibits a thermal conductivity of 820 W/mK. In contrast, we were able to reach a thermal conductivity of 988 W/mK with a heat treatment of graphene matrix composite at 800° C. for a total of two hours. This is very surprising and no one has ever thought that such a low graphitization temperature was possible. Further, a heat treatment of the GO gel-derived unitary graphene-matrix composite at the same 2,000° C. for 1 hour imparts a thermal conductivity of 1,680 W/mK (vs. 820 W/mK of the carbonized PI). Clearly, this is a dramatically faster, less energy-intensive, and more cost-effective process. The resulting products are also far superior to pyrolytic graphite. The unitary graphene matrix composites, the unitary graphene layer itself (from GO gel), and the pyrolytic graphite are three fundamentally different and patently distinct classes of materials in terms of chemical composition, morphology, structure, process of production, and various properties.

In conclusion, we have successfully developed an absolutely new, novel, unexpected, and patently distinct class of highly thermally conducting material: graphene oxide gel-derived unitary graphene and unitary graphene matrix composite. The chemical composition, structure (crystal perfection, grain size, defect population, etc), crystal orientation, morphology, process of production, and properties of this new class of materials are fundamentally different and patently distinct from flexible graphite foil, polymer-derived pyrolytic graphite, CVD-derived PG (including HOPG), and catalytic CVD graphene thin film. The thermal conductivity, electrical conductivity, scratch resistance, surface hardness, and tensile strength exhibited by the presently invented materials are much higher than what prior art flexible graphite sheets, paper of discrete graphene/GO/RGO platelets, or other graphitic films could possibly achieve. These GO-derived unitary graphene materials have the best combination of excellent electrical conductivity, thermal conductivity, mechanical strength, surface scratch resistance, hardness, and no tendency to flake off. This new class of material can be readily coated with a layer of electrically non-conducting but thermally conducting inorganic material as a protective insulation layer.

We claim:

1. An inorganic coating-protected unitary graphene material heat sink article for concentrated photovoltaic cell heat dissipation, said article comprising at least a layer of unitary graphene material having two primary surfaces and an electrically non-conducting layer of inorganic coating deposited on at least one of said primary surfaces, wherein said unitary graphene material contains chemical bonds between some adjacent graphene molecules, said unitary graphene material having an inter-graphene spacing no greater than 0.40 nm, wherein said layer of unitary graphene material is a single crystal or a poly-crystal graphene structure containing no complete grain boundary therein that has a thickness greater than 100 nm, a porosity level less than 10%, an electric conductivity greater than 1,500 S/cm, and a thermal conductivity greater than 600 W/mK and said unitary graphene material has a preferred crystalline orientation, wherein graphene planes in said layer of unitary graphene material are closely packed and parallel to one another having an average mis-orientation angle of less than 10, wherein said layer of unitary graphene material is not an aggregate of discrete graphene platelets, not a catalytic CVD graphene film, and not a graphite.

2. The article of claim 1, wherein the unitary graphene material further contains a discrete filler or reinforcement phase dispersed in said unitary graphene material to form a unitary graphene matrix composite structure and said filler or reinforcement phase contains a particle, filament, nano-tube, nano-wire, or nano-rod of a metal, ceramic, glass, polymer, carbon, graphite, or a combination thereof.

3. The article of claim 1, wherein the unitary graphene material further contains a discrete solid carbon, graphite, or graphene filler phase dispersed in said unitary graphene material to form a unitary graphene matrix composite structure and said filler phase is selected from a carbon or graphite fiber, carbon or graphite nano-fiber, carbon nano-tube, carbon nano-rod, meso-phase carbon particle, meso-carbon micro-bead, expanded graphite flake with a thickness greater than 100 nm, single-layer graphene sheet, multi-layer graphene platelet with a thickness less than 100 nm, exfoliated graphite or graphite worm, coke particle, needle coke, carbon black or acetylene black particle, activated carbon particle, or a combination thereof; wherein said carbon, graphite, or graphene filler phase occupies a weight fraction of 0.01% to 99% based on the total composite structure weight.

4. The article of claim 1, wherein said inorganic coating contains:
 (a) a ceramic material;
 (b) diamond;
 (c) a semiconductor element or compound selected from Si, Ge, Ga, gallium nitride, gallium phosphide, gallium arsenide, aluminum nitride, aluminum phosphide, aluminum arsenide, boron nitride, boron phosphide, boron arsenide;
 or a combination thereof.

5. The article of claim 4, wherein said ceramic material is selected from a metal nitride, metal phosphide, metal arsenide, metal antimonite, metal oxide, metal sulfide, metal selenide, metal telluride, metal halogenide, or a combination thereof.

6. The article of claim 1, wherein said inorganic coating layer has a thermal conductivity greater than 30 W/mK.

7. The article of claim 1, wherein said unitary graphene material has an oxygen content less than 5%, an inter-graphene spacing less than 0.4 nm, and/or a thermal conductivity of at least 100 W/mK.

8. The article of claim 1, wherein said unitary graphene material has an oxygen content less than 1%, an inter-graphene spacing less than 0.345 nm, a thermal conductivity of at least 1,300 W/mK, and/or an electrical conductivity no less than 3,000 S/cm.

9. The article of claim 1, wherein said unitary graphene material has an oxygen content less than 0.01%, an inter-graphene spacing less than 0.337 nm, a thermal conductivity of at least 1,500 W/mK, and/or an electrical conductivity no less than 5,000 S/cm.

10. The article of claim 1, wherein said unitary graphene material has an oxygen content less than 0.001%, an inter-graphene spacing less than 0.336 nm, a mosaic spread value no greater than 0.7, a thermal conductivity of at least 1,700 W/mK, and/or an electrical conductivity no less than 10,000 S/cm.

11. The article of claim 1, wherein said unitary graphene material has an inter-graphene spacing less than 0.336 nm, a mosaic spread value no greater than 0.4, a thermal conductivity greater than 1,700 W/mK, and/or an electrical conductivity greater than 10,000 S/cm.

12. The article of claim 1, wherein the unitary graphene material exhibits an inter-graphene spacing less than 0.337 nm and a mosaic spread value less than 1.0.

13. The article of claim 1, wherein the unitary graphene material exhibits a degree of graphitization no less than 40% and/or a mosaic spread value less than 0.7.

14. The article of claim 1, wherein the unitary graphene material exhibits a degree of graphitization no less than 80% and/or a mosaic spread value no greater than 0.4.

15. The article of claim 1, wherein said chemically bonded graphene molecules are parallel to one another.

16. The article of claim 3, wherein said carbon, graphite, or graphene filler phase contains chemical bonds between said filler and said unitary graphene matrix.

17. The article of claim 1, wherein the chemically bonded graphene molecules contain a combination of $sp^2$ and $sp^a$ electronic configurations.

18. The article of claim 1, wherein said unitary graphene matrix composite has a physical density of at least 1.8 g/cm$^3$ or a porosity level lower than 5%.

19. The article of claim 3, wherein said carbon, graphite, or graphene filler phase occupies a weight fraction from 0.1% to 70% based on the total composite structure weight and said unitary graphene material forms a continuous phase.

20. The article of claim 1, wherein said unitary graphene material has an electrical conductivity greater than 3,000 S/cm, a thermal conductivity greater than 600 W/mK, a physical density greater than 1.8 g/cm3, and/or a tensile strength greater than 40 MPa.

21. The article of claim 1, wherein said unitary graphene material has an electrical conductivity greater than 5,000 S/cm, a thermal conductivity greater than 1,000 W/mK, a physical density greater than 1.9 g/cm3, and/or a tensile strength greater than 60 MPa.

22. The article of claim 1, wherein said unitary graphene material has an electrical conductivity greater than 15,000 S/cm, a thermal conductivity greater than 1,500 W/mK, a physical density greater than 2.0 g/cm$^3$, and/or a tensile strength greater than 100 MPa.

23. The article of claim 1, wherein said inorganic coating is in thermal contact with a photovoltaic cell and receives heat therefrom.

24. A concentrated photovoltaic cell comprising a solar collecting and concentrating assembly, a photovoltaic cell that receives solar energy from said solar collecting and concentrating assembly and generates electricity and heat, and an article of claim 1 that receives heat from said photovoltaic cell.

25. The concentrated photovoltaic cell of claim 24, wherein said unitary graphene material comprises:
   (a) a unitary graphene matrix containing graphene planes having an inter-graphene plane spacing of 0.3354 to 0.3450 nm and an oxygen content less than 1% by weight;
   (b) a carbon or graphite filler phase selected from a carbon or graphite fiber, carbon or graphite nano-fiber, carbon nano-tube, carbon nano-rod, meso-phase carbon particle, meso-carbon micro-bead, exfoliated graphite flake with a thickness greater than 100 nm, exfoliated graphite or graphite worm, coke particle, needle coke, carbon black or acetylene black particle, activated carbon particle, a combination thereof, or a combination with a nano graphene platelet;
   wherein said carbon or graphite filler phase occupies a weight fraction from 1% to 90% based on the total composite weight and said carbon or graphite filler phase is in a particulate, filamentary, or rod-like form dispersed in said unitary graphene matrix which forms a continuous phase.

26. The concentrated photovoltaic cell of claim 24, wherein said heat treatment temperature is higher than 2,000° C. and the graphene planes have an inter-graphene plane spacing less than 0.337 nm.

* * * * *

UNITED STATES PATENT AND TRADEMARK OFFICE
CERTIFICATE OF CORRECTION

PATENT NO. : 10,566,482 B2
APPLICATION NO. : 13/815100
DATED : February 18, 2020
INVENTOR(S) : Aruna Zhamu et al.

It is certified that error appears in the above-identified patent and that said Letters Patent is hereby corrected as shown below:

In the Claims

Column 47, Line 17 should be corrected to read:
graphene molecules contain a combination of $sp^2$ and $sp^3$ Signed and Sealed this
Thirty-first Day of March, 2020

Andrei Iancu
*Director of the United States Patent and Trademark Office*